United States Patent
Kishino et al.

(10) Patent No.: US 10,998,880 B2
(45) Date of Patent: May 4, 2021

(54) ACOUSTIC WAVE ELEMENT AND COMMUNICATION APPARATUS

(71) Applicant: KYOCERA Corporation, Kyoto (JP)

(72) Inventors: Tetsuya Kishino, Nara (JP); Tsuyoshi Nakai, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 320 days.

(21) Appl. No.: 16/089,684

(22) PCT Filed: Mar. 29, 2017

(86) PCT No.: PCT/JP2017/013017
§ 371 (c)(1),
(2) Date: Sep. 28, 2018

(87) PCT Pub. No.: WO2017/170742
PCT Pub. Date: Oct. 5, 2017

(65) Prior Publication Data
US 2020/0287519 A1    Sep. 10, 2020

(30) Foreign Application Priority Data

Mar. 31, 2016  (JP) .............................. JP2016-070054
Jun. 22, 2016  (JP) ................................. 2016-123440

(51) Int. Cl.
*H03H 9/25*    (2006.01)
*H03H 9/00*    (2006.01)
(Continued)

(52) U.S. Cl.
CPC ............ *H03H 9/25* (2013.01); *H03H 9/0009* (2013.01); *H03H 9/0028* (2013.01);
(Continued)

(58) Field of Classification Search
CPC ...... H03H 9/25; H03H 9/0009; H03H 9/0028; H03H 9/02637; H03H 9/145; H03H 9/6483; H03H 9/725
See application file for complete search history.

(56) References Cited

U.S. PATENT DOCUMENTS

| | | |
|---|---|---|
| 4,321,567 A | 3/1982 | Sandy |
| 5,223,762 A | 6/1993 | Masaie et al. |

(Continued)

FOREIGN PATENT DOCUMENTS

| | | |
|---|---|---|
| EP | 2963819 A1 | 1/2016 |
| JP | H04-230108 A | 8/1992 |

(Continued)

*Primary Examiner* — Samuel S Outten
(74) *Attorney, Agent, or Firm* — Procopio Cory Hargreaves and Savitch LLP

(57) ABSTRACT

An acoustic wave element includes an IDT electrode includes pluralities of electrode fingers, and reflector electrodes on the two sides of the IDT electrode. The IDT electrode includes a major part and at least one end part which is located between the major part and one of the reflector electrodes and is arranged along a direction of propagation of an acoustic wave together with the major part. the at least one end part includes a pitch of the plurality of electrode fingers substantially the same as a pitch of the plurality of electrode fingers in the major part, is electrically connected in parallel with respect to the major part, and is divided into two or more sections which are electrically connected in series with each other.

12 Claims, 49 Drawing Sheets

(51) Int. Cl.
   *H03H 9/02*     (2006.01)
   *H03H 9/145*    (2006.01)
   *H03H 9/64*     (2006.01)
   *H03H 9/72*     (2006.01)
   *H04B 1/00*     (2006.01)

(52) U.S. Cl.
   CPC ........ *H03H 9/02637* (2013.01); *H03H 9/145* (2013.01); *H03H 9/6483* (2013.01); *H03H 9/725* (2013.01); *H04B 1/0057* (2013.01)

(56) References Cited

U.S. PATENT DOCUMENTS

| | | |
|---|---|---|
| 5,559,481 A | 9/1996 | Satoh et al. |
| 6,255,916 B1* | 7/2001 | Nakamura ............... H03H 9/25 310/313 D |
| 2003/0067370 A1 | 4/2003 | Solie |
| 2014/0159833 A1* | 6/2014 | Ikeuchi ................... H03H 9/64 333/195 |

FOREIGN PATENT DOCUMENTS

| | | |
|---|---|---|
| JP | H05-183380 A | 7/1993 |
| JP | 2000-349590 A | 12/2000 |
| JP | 2014-42330 A | 3/2014 |
| WO | 2014/133084 A1 | 9/2014 |

\* cited by examiner

ACOUSTIC WAVE ELEMENT AND COMMUNICATION APPARATUS

TECHNICAL FIELD

This disclosure relates to an acoustic wave element and a communication apparatus.

BACKGROUND ART

In recent years, use has been made of an acoustic wave element for a duplexer filtering signals transmitted/received through an antenna in a mobile terminal or another communication apparatus. An acoustic wave element is configured by a piezoelectric substrate and an IDT (InterDigital Transducer) electrode provided on a major surface of the piezoelectric substrate. The acoustic wave element utilizes a characteristic of being able to mutually convert an electrical signal and a surface acoustic wave (SAW) in the relationship between the IDT electrode and the piezoelectric substrate. Japanese Patent Publication No. 5-183380A discloses a filter configured by connecting a plurality of acoustic wave elements in a ladder configuration.

SUMMARY OF INVENTION

Technical Problem

In order to raise the performance of such a filter, an acoustic wave element with low loss has been demanded. Therefore, the present disclosure is made in consideration with such a circumstance and has as an object thereof to provide an acoustic wave element and a communication apparatus which suppress generation of loss and have high resonator performances.

Solution to Problem

An acoustic wave element according to one embodiment of the present disclosure is provided with an IDT electrode including pluralities of electrode fingers, and reflector electrodes on the two sides of the IDT electrode. The IDT electrode is provided with a major part and at least one end part. At least one end part is located between the major part and one of the reflector electrodes and is arranged along a direction of propagation of the acoustic wave together with the major part. Further, the at least one end part is substantially the same in the pitch of the plurality of electrode fingers with the major part. The at least one end part is electrically connected in parallel with respect to the major part. The at least one end part is divided into two or more areas which are electrically connected in series.

A communication apparatus according to an embodiment of the present disclosure is provided with an antenna, acoustic wave filter, and RF-IC. In the acoustic wave filter, the acoustic wave element described above is used. It is electrically connected to the antenna. The RF-IC is electrically connected to the acoustic wave filter.

Advantageous Effect of Invention

According to the acoustic wave element and communication apparatus of the present disclosure, it is possible to provide a resonator with low loss, so it is possible to improve the quality of communication.

DESCRIPTION OF EMBODIMENTS

Figure 1:
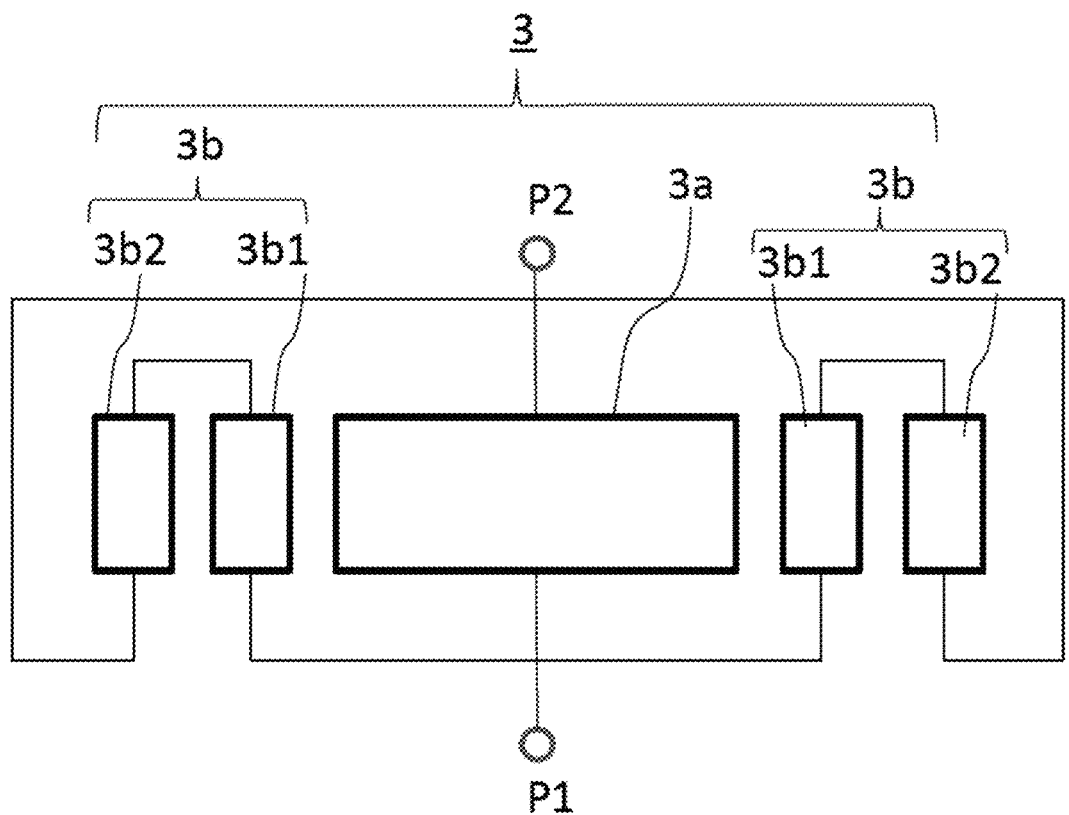
FIG. 1 A schematic view showing the configuration of an IDT electrode in an acoustic wave element 1.

Below, an acoustic wave element and a communication apparatus according to embodiments of the present disclosure will be explained with reference to the drawings. Note that, the drawings used in the following explanation are schematic ones. Dimensions, ratios, etc. in the drawings do not always coincide with the actual ones.

In the acoustic wave element, any direction may be defined as the "above" or "below". In the following explanation, however, for convenience, an orthogonal coordinate system xyz will be defined, and use will be made of the "upper surface", "lower surface", or other terms defining the positive side of the z-direction as "above".

<Acoustic Wave Element 1>

The configuration of an acoustic wave element 1 (SAW element 1) using a SAW will be explained as an example of an acoustic wave element according to an embodiment.

The SAW element 1 is provided with an IDT electrode 3 and reflector electrodes 4 which are provided on the two sides of the IDT electrode 3 along the direction of propagation of the SAW.

Here, the configuration of the IDT electrode 3 will be explained in detail by using FIG. 1. FIG. 1 is a schematic view showing an electrical connection state of the IDT electrode 3 in the SAW element 1. The illustration of the reflector electrodes 4 is omitted. Further, FIG. 1 is a schematic view showing the electrical connection state, but the direction of propagation of the SAW is shown as uniform in one direction. Specifically, this is the right/left direction on the paper surface. This is true also for FIG. 2, FIG. 3A, and FIG. 3B which will be explained later.

As shown in FIG. 1, the IDT electrode 3 is connected between two terminals (P1, P2) through which signals are input and output, and the IDT electrode 3 is divided into a major part 3a and end parts 3b along the direction of propagation of the SAW. Here, "division" is structurally carried out. That is, the electrode is divided spatially. Electrically, the divided sections may be connected to each other. Each end part 3b is provided between a reflector electrode 4 and the major part 3a. There may be at least one end part. In this example, however, there are two end parts 3b. These are provided on the two sides of the major part 3a. Further, the end parts 3b are electrically connected in parallel with respect to the major part 3a. Furthermore, the end parts 3b are obtained by dividing one IDT electrode 3, therefore its configuration for exciting the SAW is substantially the same as that of the major part 3a. Specifically, the repeated interval of arrangement (pitch) of the electrode fingers 32 which will be explained later are substantially the same between the major part 3a and the end parts 3b. Here, the term "substantially the same" means that the difference of the repeated interval of arrangement of the electrode fingers 32 is less than ±2%.

Each end part 3b is further divided into two or more sections. In this example, it is divided into a first part 3b1 and second part 3b2 along the direction of propagation of the SAW. The first part 3b1 is adjacent to the major part 3a, and the second part 3b2 is adjacent to the first part 3b1 from the major part 3a toward the reflector electrode 4. That is, the second part 3b2 is positioned between the first part 3b1 and the reflector electrode 4. Further, in terms of the circuit, in the end part 3b, the first part 3b1 and the second part 3b2 are connected in series in this order from the terminal P1 toward the terminal P2.

The first part 3b1 and the second part 3b2 may be formed by equally dividing the end part 3b or may formed divided in a different ratio. In the latter case, it may be divided so that the first part 3b1 becomes smaller than the second part 3b2. That is, the area of the divided sections may become larger as going from the major part 3a toward the reflector electrode 4 when viewed on a plane.

Such first parts 3b1 and second parts 3b2 are electrically connected in series. Further, in the major part 3a and end parts 3b (first part 3b1 and second part 3b2), the direction of propagation of the SAW is substantially parallel. Note that, in this example, in the major part 3a and end parts 3b (first part 3b1 and second part 3b2), the directions of propagation of the SAW become substantially the same. That is, they are arranged so that the centers of vibrations coincide among the major part 3a and the end parts 3b.

By forming such a configuration, the loss on a higher frequency side than the vicinity of the antiresonance frequency of the SAW element 1 can be reduced. Specifically, by making the vibration in the end parts 3b weaker, the acoustic wave can be concentrated at the vicinity of the center of the IDT electrode 3 (that is, the vicinity of the center of the major part 3a). Therefore, as a result, leakage of the acoustic wave to the direction of propagation of the acoustic wave can be suppressed. Further, the direction of division in the end parts 3b is along the direction of propagation, therefore the arrangement of the electrode fingers 32 in the end parts 3b does not interfere with the propagation of the SAW generated in the major part 3a, so loss can be suppressed more in the SAW element 1.

Here, the major part 3a is one for generating the SAW which is excited in the SAW element 1 and is the part having the largest area among the divided areas. A comparison of the concrete size with the end parts 3b will be explained later.

<SAW Element 1A>

Figure 2:
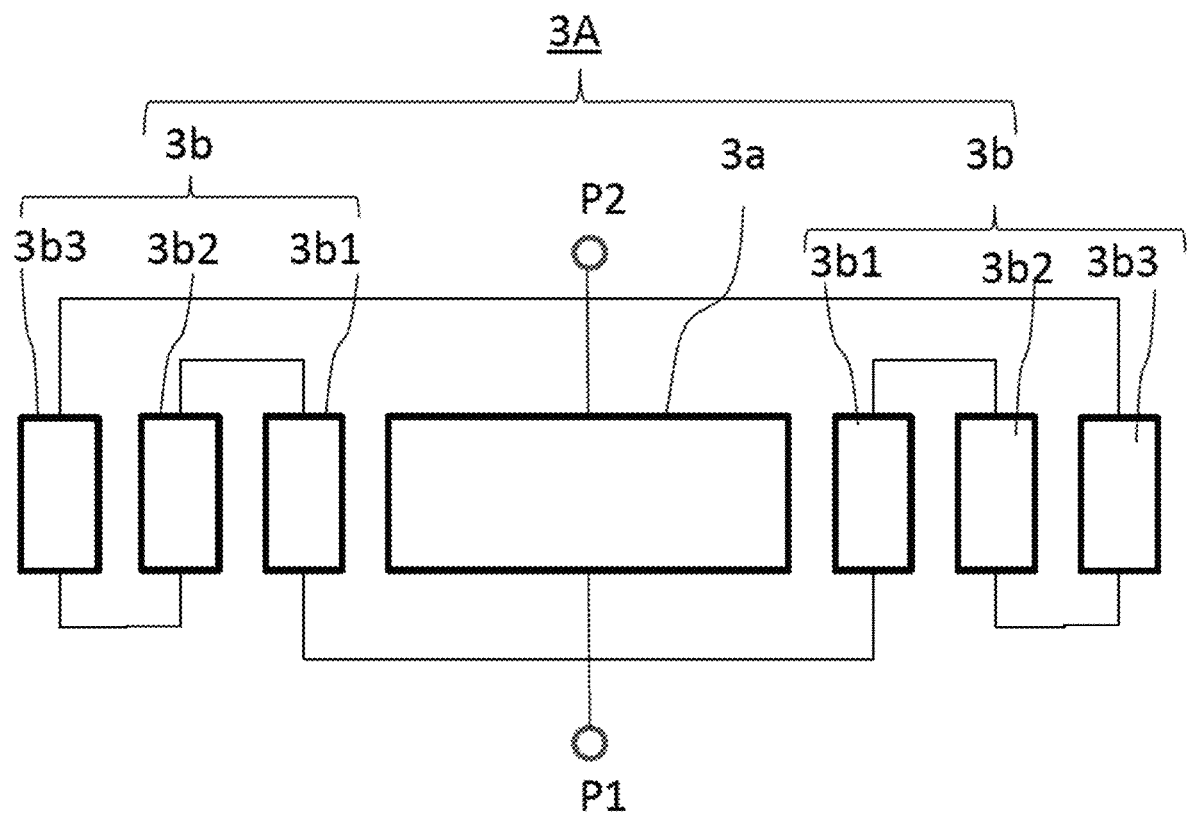
FIG. 2 A schematic view showing the configuration of an IDT electrode in a modification of the acoustic wave element shown in FIG. 1.

Next, a SAW element 1A of a modification of the SAW element 1 will be explained. The SAW element 1A differs from the SAW element 1 in the number of parts the end part 3b is divided into. Below, only the different point will be explained. FIG. 2 is a schematic view showing an electrical connection state of the IDT electrode 3A in the SAW element 1A.

As shown in FIG. 2, each end part 3b is electrically divided into three parts and therefore is provided, along the direction of propagation of the SAW, with a first part 3b1 adjacent to the major part 3a, a second part 3b2 positioned on an opposite side of the first part 3b1 from the major part 3a, and a third part 3b3 positioned between the second part 3b2 and the reflector electrode 4. The first part 3b1, the second part 3b2, and the third part 3b3 are electrically connected in series to each other.

<SAW Element 1B and SAW Element 1C>

Figure 3A:
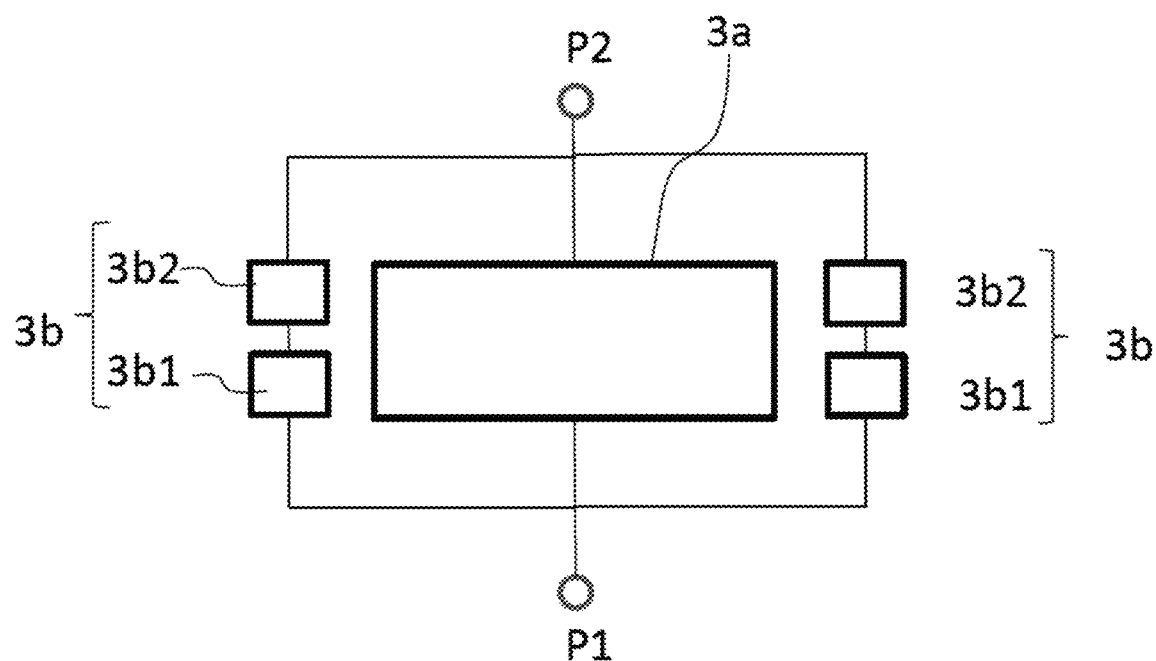
FIG. 3A A schematic view showing the configuration of an IDT electrode in a modification of the acoustic wave element shown in FIG. 1.
Figure 3B:
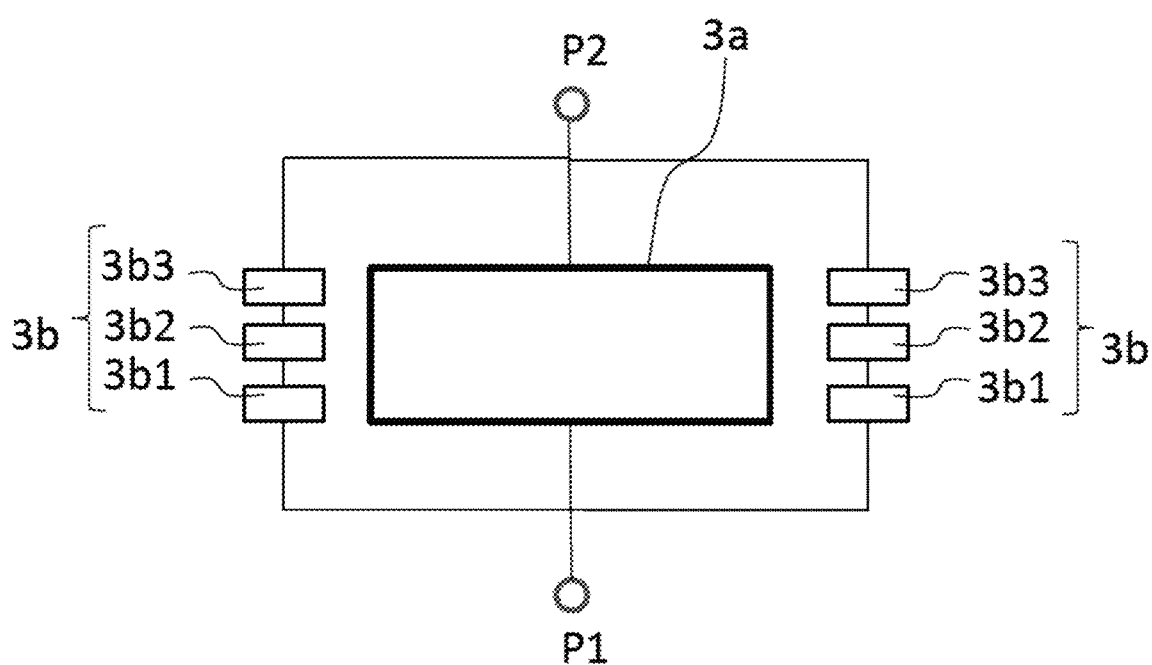
FIG. 3B A schematic view showing the configuration of an IDT electrode in a modification of the acoustic wave element shown in FIG. 1.

Next, SAW elements 1B and 1C of modifications of the SAW element 1 will be explained. The SAW elements 1B and 1C differ from the SAW element 1 in the direction of division of the end parts 3b. Below, only the different points will be explained. FIG. 3A is a schematic view showing the electrical connection state of the IDT electrode 3B in the SAW element 1B. FIG. 3B is a schematic view showing the electrical connection state of the IDT electrode 3C in the SAW element 1C.

As shown in FIG. 3A and FIG. 3B, in the SAW elements 1B and 1C, each end part 3b is divided in a direction different from the direction of propagation of the SAW. Specifically, it is divided into two parts (SAW element 1B) or divided into three parts (SAW element 1C) in the direction perpendicular to the direction of propagation of the SAW. In both, the divided sections are electrically connected in series to each other.

In each end part 3b, the first part 3b1 and the second part 3b2 (up to the third part 3b3 in the SAW element 1C) are connected in series from the terminal P1 toward the terminal P2. Further, the direction of propagation of the SAW in the major part 3a with respect to the first part 3b1 and second part 3b2 (also the third part 3b3 in the SAW element 1C) is substantially parallel. However, the centers of vibrations do not coincide.

In the case where such configurations are employed as well, in the SAW elements 1B and 1C, loss on a higher frequency side than the vicinity of the antiresonance frequency can be reduced. Further, in the SAW elements 1B and 1C, interconnection for connecting the end parts 3b in series from the terminal P1 toward the terminal P2 is easy, therefore the degree of freedom of layout in the SAW elements 1B and 1C is high, so reduction of size is possible.

Note that, in each of the SAW elements 1 and 1A to 1C explained above, end parts 3b were provided on the two sides of the major part 3a, but an end part 3b may be provided only on one side as well.

<Specific Configuration: SAW Element 1A>

Figure 4:
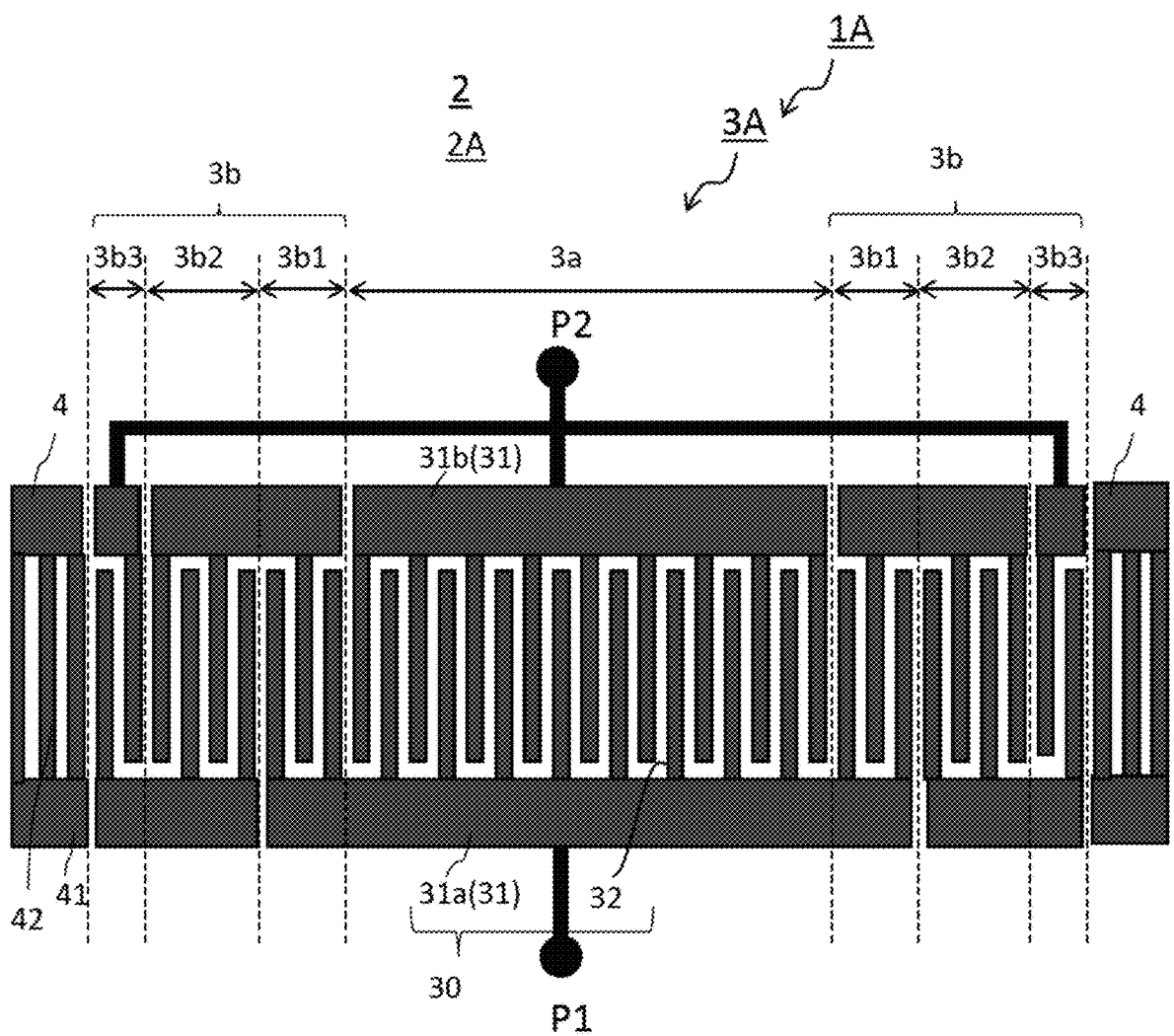
FIG. 4 A plan view showing the configuration of an acoustic wave element 1A.
Figure 4:
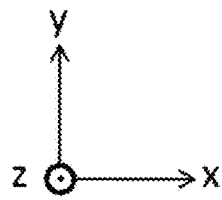

FIG. 4 shows a plan view of a concrete configuration of the SAW element 1A shown in FIG. 2. The SAW element 1A, as shown in FIG. 4, has a piezoelectric substrate 2 and an IDT electrode 3A and reflectors 4 which are provided on the upper surface 2A of the piezoelectric substrate 2. Note that, in FIG. 4, the number of electrode fingers 32 is different from the actual number.

The piezoelectric substrate 2 is configured by a substrate of a single crystal which is comprised of lithium niobate ($LiNbO_3$) crystal or lithium tantalate ($LiTaO_3$) crystal and has a piezoelectric characteristic. Specifically, for example, the piezoelectric substrate 2 is a 36° ~48° Y-cut and X-propagated $LiTaO_3$ substrate. The planar shape and various dimensions of the piezoelectric substrate 2 may be suitably set. As an example, the thickness (z-direction) of the piezoelectric substrate 2 is 0.1 mm to 0.5 mm.

The IDT electrode 3A, as shown in FIG. 4, has pluralities of electrode fingers 32 which are arranged so that they are aligned repeatedly in the x-direction in the drawing.

The IDT electrode 3A is configured by a pair of comb-shaped electrodes 30 which intermesh with each other. The comb-shaped electrodes 30, as shown in FIG. 4, have two bus bars 31 which face each other and pluralities of electrode fingers 32 which extend from each of bus bars 31 to the other bus bar 31 side. Further, the pair of comb-shaped electrodes 30 are arranged so that the electrode fingers 32 connected to one bus bar 31 and the electrode fingers 32 connected to the other bus bar 31 intermesh (intersect) with each other in the direction of propagation of the acoustic wave. In this way, the IDT electrode 3A is provided with pluralities of electrode fingers 32 which are aligned along the direction of propagation of the SAW. In other words, the direction of arrangement of the electrode fingers 32 is the direction of propagation of the SAW. The intervals of arrangement (pitch) of these electrode fingers 32 are substantially the same from the major part 3a to the end parts 3b.

Further, the IDT electrode 3A is electrically divided into the major part 3a and end parts 3b which are positioned on the two sides of the major part 3a. Each end part 3b is electrically divided into a first end part 3b1, second end part 3b2, and third end part 3b3. Such electrical division is realized by splitting the bus bars 31 in this example.

Here, for convenience, in terms of the planar arrangement, the bus bar 31 on the terminal P1 side will be defined as the "first bus bar 31a", and the bus bar 31 on the terminal P2 side will be defined as the "second bus bar 31b". The major part 3a, first parts 3b1, second parts 3b2, and third parts 3b3 are basically electrically divided by splitting the two bus bars 31 (first bus bar 31a and second bus bar 31b) together. In addition, the first parts 3b1 and the second parts 3b2 are connected in series by electrically connecting their second bus bar 31b parts with each other. The second parts 3b2 and the third parts 3b3 are connected in series by electrically connecting their first bus bar 31a parts with each other. Due to this, end parts 3b in which the first parts 3b1 to the third parts 3b3 are connected in series in order are formed. Further, by electrically connecting the first bus bar 31a parts of the major part 3a and the first parts 3b1 with each other and by electrically connecting the second bus bar 31b parts of the major part 3a and the third parts 3b3 with each other through lines, the major part 3a and the end parts 3b are electrically connected in parallel. By such connection relationships of the bus bars 31, the electrical connection relationships shown in FIG. 2 are realized.

The bus bars 31 are for example formed in long shapes so as to linearly extend with substantially constant widths. Accordingly, the edge parts of the bus bars 31 which face each other are linear shaped. The pluralities of electrode fingers 32 are for example formed in long shapes so as to linearly extend with substantially constant widths and are aligned in the direction of propagation of the SAW at substantially constant intervals.

Note that, the widths of the bus bars 31 need not be constant. It is sufficient that the edge parts of the bus bars 31 on the sides which face each other (inner sides) be linear shaped. For example, shapes where the edge parts on inner sides are formed by the bottom side of trapezoids may be formed as well.

The pluralities of electrode fingers 32 configuring the IDT electrode 3A are set so that their pitch becomes Pt1. Pt1 is the interval between the centers of the two or more electrode fingers 32 (repeated interval). For example, they are provided so that the intervals become equal to the half wavelength of the wavelength λ of SAW at the frequency at which resonance is desired to be caused. The wavelength λ (that is, 2×Pt1) is for example 1.5 μm to 6 μm. In the IDT electrode 3, by arranging the pluralities of electrode fingers 32 so that most pitches become Pt1, the pluralities of electrode fingers 32 are arranged at constant repeated intervals, therefore the SAW can be efficiently generated.

In each electrode finger 32, the width w1 in the direction of propagation of the SAW is suitably set in accordance with the electrical characteristics etc. which are demanded from the SAW element 1. The width w1 of the electrode finger 32 is for example 0.3 time to 0.7 time the pitch Pt1.

Note that, in the major part 3a, the pitches Pt1 may be made different in the vicinities of the two end parts of the arrangement of the electrode fingers 32. Even in that case, in the SAW excited as a whole in the IDT electrode 3, the acoustic wave having a frequency determined according to the interval in the vicinity of the center at which the vibration intensity of SAW is the highest becomes dominant.

A SAW propagating in the direction perpendicular to these pluralities of electrode fingers 32 is generated. Accordingly, after considering the crystal orientation of the piezoelectric substrate 2, the two bus bars 31 are arranged so that they face each other in the direction perpendicular to the direction in which the SAW is desired to be propagated. The pluralities of electrode fingers 32 are formed so as to extend in the direction perpendicular with respect to the direction in which the SAW is desired to be propagated.

The lengths of the pluralities of electrode fingers 32 (the lengths from the bus bars 31 to the tip ends of the electrode fingers 32) are for example set to substantially the same. Note that, the length of each electrode finger 32 may be changed. For example, it may be made longer toward the direction of propagation or made shorter. Specifically, by changing the length of each of the electrode fingers 32 with respect to the direction of propagation, an apodized IDT electrode 3A may be configured as well. In this case, ripple of the lateral mode can be reduced, and the electrical resistance can be improved.

The IDT electrode 3A is for example configured by a conductive layer made of metal. As this metal, for example, there can be mentioned Al or an alloy containing Al as the principal ingredient (Al alloy). The Al alloy is for example Al—Cu alloy. Note that, the IDT electrode 3A may be configured by a plurality of metal layers as well. Various dimensions of the IDT electrode 3A are suitably set in accordance with the electrical characteristics etc. demanded from the SAW element 1A. The thickness S (z-direction) of the IDT electrode 3A is for example 50 nm to 600 nm.

The IDT electrode 3A may be directly arranged on the upper surface 2A of the piezoelectric substrate 2 or may be arranged on the upper surface 2A of the piezoelectric substrate 2 with another member interposed therebetween. The other member is made of for example Ti or Cr or an alloy of them or the like. When the IDT electrode 3A is arranged on the upper surface 2A of the piezoelectric substrate 2 through another member, the thickness of the other member is set to a thickness which exerts almost no influence upon the electrical characteristics of the IDT electrode 3A (for example a thickness of about 5% of the thickness of the IDT electrode 3 in the case of Ti).

Further, on the electrode fingers 32 configuring the IDT electrode 3A, in order to improve the temperature characteristic of the SAW element 1, a mass addition film may be stacked as well. As the mass addition film, use can be made of a film made of for example $SiO_2$.

The IDT electrode 3A, when voltage is applied, excites a SAW propagating in the x-direction in the vicinity of the upper surface 2A of the piezoelectric substrate 2. The excited SAW is reflected at a boundary with a region where no electrode finger 32 is arranged (region in long shape between the electrode fingers 32 which are adjacent to each other). Further, a standing wave having the pitch Pt1 of the electrode fingers 32 as a half wavelength is formed. The standing wave is converted to an electrical signal having the same frequency as this standing wave and is extracted by the electrode fingers 32. In this way, the SAW element 1A functions as a 1-port resonator.

The reflector electrodes 4 are arranged so as to sandwich the IDT electrode 3A in the direction of propagation of the acoustic wave. Each reflector electrode 4 is formed in a schematically lattice shape. That is, the reflector electrode 4 has reflector bus bars 41 which face each other in the direction crossing the direction of propagation of the acoustic wave and has pluralities of reflection electrode fingers 42 which extend in the direction perpendicular to the direction of propagation of the SAW between these bus bars 41. The reflector bus bars 41 are formed in long shapes so as to linearly extend with substantially constant widths and are arranged parallel in the direction of propagation of the SAW.

The plurality of reflection electrode fingers 42 are basically arranged at a pitch Pt2 reflecting SAW excited in the IDT electrode 3A. The pitch Pt2 is the interval between the centers of the two or more reflection electrode fingers 42 (repeated interval). When the pitch Pt1 of the IDT electrode 3A is set to the half wavelength of the wavelength λ of the SAW, the pitch Pt2 may be set to the same extent as the pitch Pt1. The wavelength λ (2×Pt2) is for example 1.5 μm to 6 μm.

Further, the plurality of reflection electrode fingers 42 are formed in long shapes so as to linearly extend with substantially constant widths. The width w2 of the reflection electrode fingers 42 can be set to for example be substantially equal to the width w1 of the electrode fingers 32. Each reflector electrode 4 is for example formed by the same material as that for the IDT electrode 3A and is formed to a thickness equal to the IDT electrode 3A.

Each reflector electrode 4 is arranged with a space with respect to the IDT electrode 3. Here, an "interval" designates the interval from the center of the electrode finger 32 in the IDT electrode 3A which is positioned at an end part on the reflector electrode 4 side to the center of the reflection electrode finger 42 in the reflector electrode 4 which is positioned at the end part on the IDT electrode 3A side. The interval G is usually set so as to become the same as the pitch Pt1 of the IDT electrode 3A (or pitch Pt2).

A protective layer (not shown) is provided on the piezoelectric substrate 2 so as to cover the tops of the IDT electrode 3A and reflector electrodes 4. Specifically, the protective layer covers the surfaces of the IDT electrode 3A and reflector electrodes 4 and the portions in the upper surface 2A of the piezoelectric substrate 2 which are exposed from the IDT electrode 3A and reflector electrodes 4. The thickness of the protective layer is for example 1 nm to 50 nm.

The protective layer is made of an insulating material and contributes to protection of the conductive layers of the IDT electrode 3A and reflector electrodes 4 from corrosion etc. Preferably, the protective layer is formed by $SiO_2$ or another material with which the speed of propagation of the acoustic wave becomes faster when the temperature rises. Due to this, the change of electrical characteristics of the SAW element 1A due to a change of temperature can be kept small as well. Further, when it is formed by a material such as $SiN_x$ having good hermetic characteristics, the IDT electrode 3A and reflector electrodes 4 become hard to corrode, therefore an element having a high reliability can be obtained. Further, a stacked structure may be employed as well.

By employing such a configuration, the SAW element 1A shown in FIG. 2 can be realized, therefore becomes able to function as a resonator between the terminal P1 and the terminal P2 through which the high frequency signals are input/output.

Figure 5:
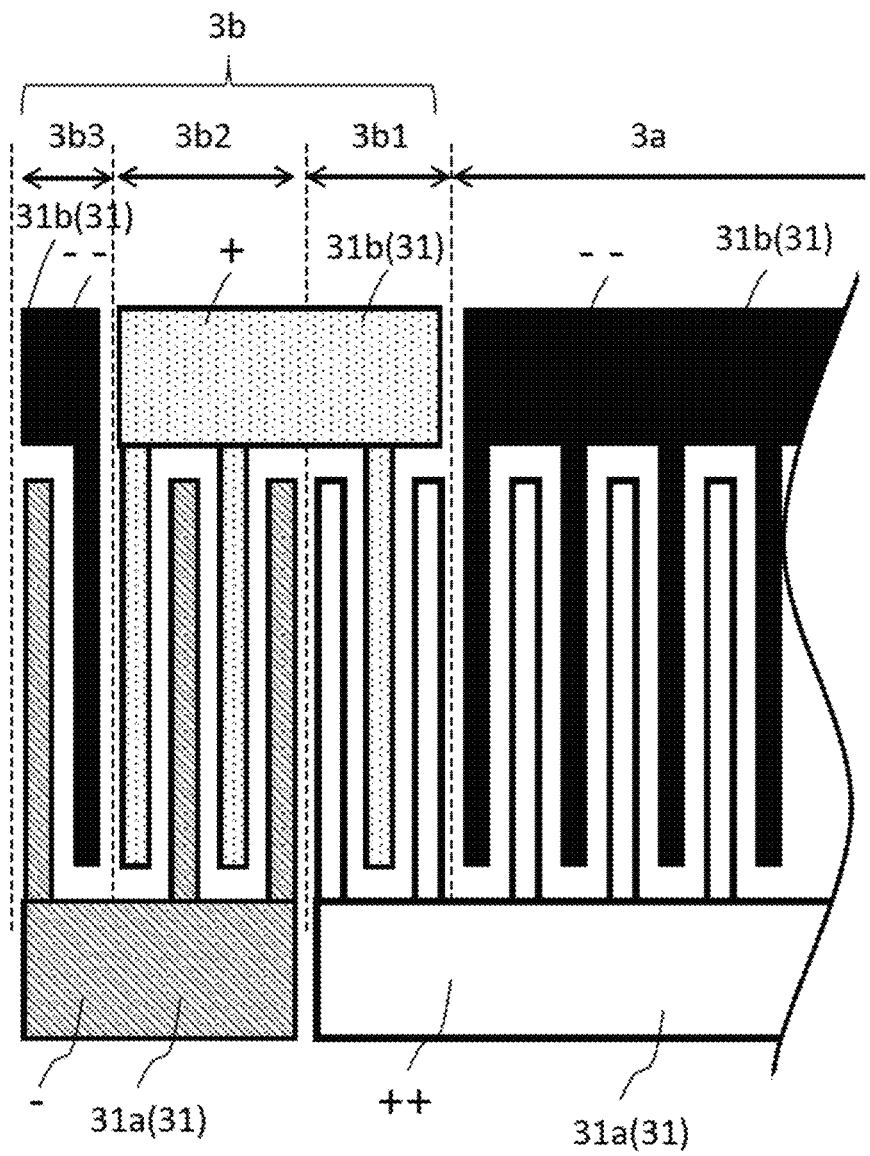
FIG. 5 A plan view of an enlarged principal part in the vicinity of an end part 3b in the acoustic wave element 1A.

Here, using FIG. 5, an example of arrangement of the electrode fingers 32 in an end part 3b will be explained. FIG. 5 is an enlarged plan view of a principal part showing the alignment of the electrode fingers 32 in the vicinity of an end part 3b.

High frequency signals are applied to the terminals P1 and P2, therefore positive potential side and negative potential side continuously repeated invert. For convenience, the polarity of the electrode fingers 32 at the moment when the terminal P1 is positive potential side and the terminal P2 is negative potential side will be shown. In FIG. 5, for convenience, the same hatching will be attached to the portions which become the same potential, and "++", "+", "−", "−−" will be displayed in order from the side having the highest potential.

In the SAW element 1A, in order to suppress unintended interference with the propagation of the SAW excited in the major part 3a, the phase of the SAW excited by the electrode fingers 32 in the major part 3a and the phase of the SAW excited by the electrode fingers 32 in the end part 3b may be in-phase as well. In order to make the phases of the two in-phase, an electrode finger 32 on the higher potential side and an electrode finger 32 on the lower side are alternately arranged.

The major part 3a and the first part 3b1 are the same in the relationships of the levels of potentials relative to the first bus bar 31a and the second bus bar 31b. For this reason, between the electrode finger 32 positioned on the end of the major part 3a and the electrode finger 32 positioned on the end of the first part 3b1 which are adjacent to each other, one is connected to the first bus bar 31a, and the other is connected to the second bus bar 31b. That is, it is the usual alternate arrangement.

On the other hand, between the first part 3b1 and the second part 3b2, the relationships of the levels of potentials relative to the first bus bar 31a and the second bus bar 31b are inverse. For this reason, at the boundary portion of the two, the electrode finger 32 positioned on the end of the first part 3b1 and the electrode finger 32 positioned on the end of the second part 3b2 which are adjacent to each other are connected to the bus bars on the same sides. In this example, electrode fingers 32 connected to a bus bar on the side where they are not electrically connected between the first part 3b1 and the second part 3b2, that is, the first bus bar 31a, end up being adjacent to each other. In the same way, between the second part 3b2 and the third part 3b3, the relationships of the levels of potentials relative to the first bus bar 31a and the second bus bar 31b are inverted. Therefore, at the boundary portion of the two, the electrode finger 32 positioned on the end of the second part 3b2 and the electrode finger 32 positioned on the end of the third part 3b3 which are adjacent to each other are connected to the bus bars on the same sides. That is, the electrode fingers 32 connected to a bus bar on the side where they are not electrically connected between the second part 3b2 and the third part 3b3, that is, the second bus bar 31b, end up being aligned.

By forming such an arrangement, phases of the SAW excited in the major part 3a and of the SAWs excited in the sections of the end part 3b can all be in-phase. Due to this, the SAWs which are excited in the major part 3a and in the sections of the end part 3b will not interfere to each other, therefore the effect according to the configuration of the present disclosure is straightforwardly exhibited, so loss of the resonator can be reduced.

Note that, in the example explained above, the explanation was given by taking as an example the case where the tip ends of the electrode fingers 32 electrically connected to one bus bar 31 directly faced the other bus bar. However, dummy electrodes which are electrically connected to the other bus bar and face the tip ends of the electrode fingers 32 may be provided as well.

<Specific Configuration: SAW Elements 1, 1B, and 1C>

Figure 6A:
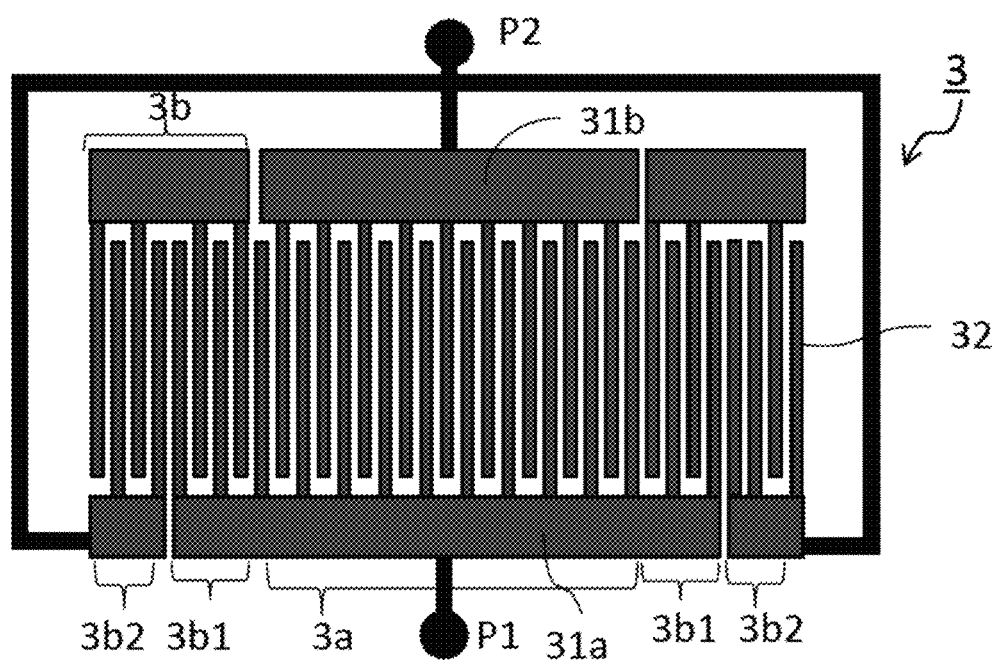
FIG. 6A A plan view of a principal part showing the configuration of an IDT electrode 3 in the acoustic wave element 1.
Figure 6B:
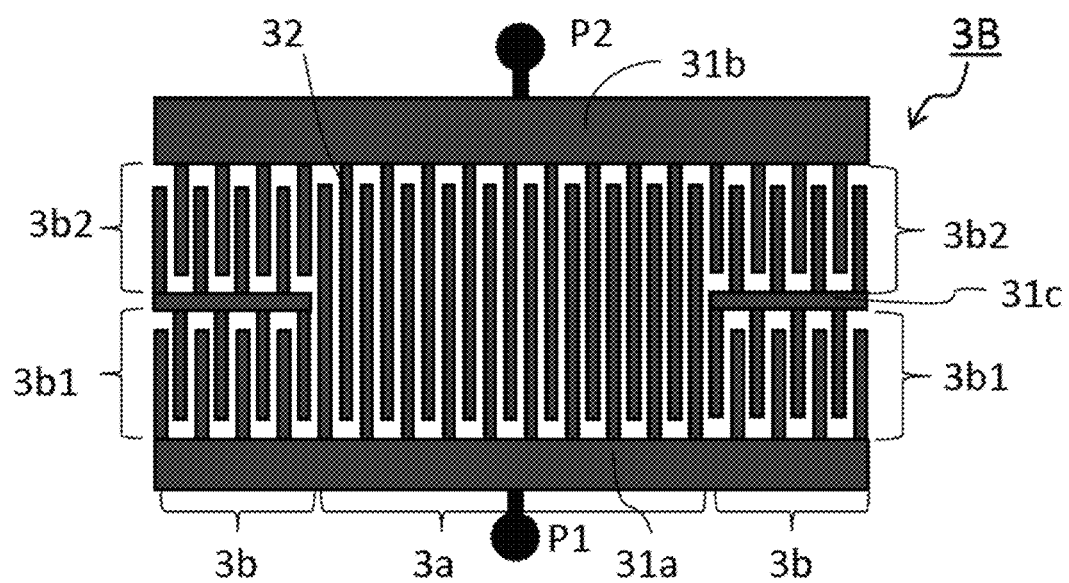
FIG. 6B A plan view of a principal part showing the configuration of an IDT electrode 3B in an acoustic wave element 1B.
Figure 6C:
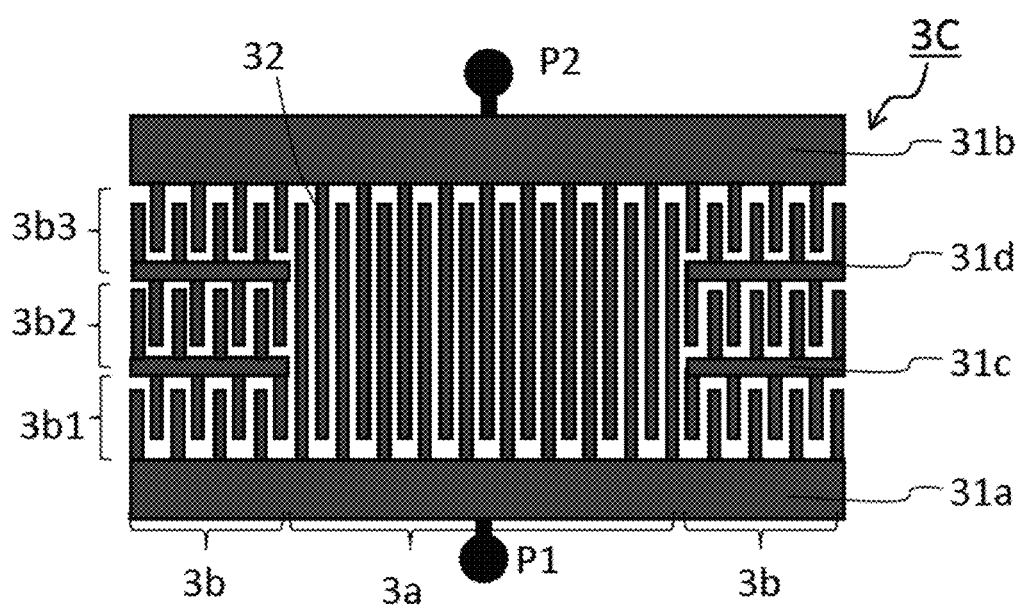
FIG. 6C A plan view of a principal part showing the configuration of an IDT electrode 3C in an acoustic wave element 1C.

FIG. 6A to FIG. 6C show concrete configurations of the IDT electrodes 3, 3B, and 3C shown in FIG. 1, FIG. 3A, and FIG. 3B and provided in the SAW elements 1, 1B, and 1C. In FIG. 6A to FIG. 6C, the reflector electrodes 4 etc. are omitted.

FIG. 6A shows the configuration of the IDT electrode 3. The first parts 3b1 and the second parts 3b2 are connected in series to each other by electrically connecting the bus bars 31 to each other. Between the major part 3a and an end part 3b, the two are connected in parallel by electrically connecting the first bus bar 31a part of the major part 3a and the first bus bar 31a part of the first part 3b1 and electrically connecting the second bus bar 31b part of the major part 3a and the first bus bar 31a part of the second part 3b2 by lines.

Here, the line connecting the first bus bar 31a part of the second part 3b2 and the terminal P2 may be arranged so as to bypass the not shown reflector electrode 4 or may be electrically connected with the reflector electrode 4 to incorporate the reflector electrode 4 into a portion of the line as well. In this case, space for line can be omitted, therefore the element can be made smaller in size.

Further, in the SAW element 1 as well, in order to make the phases of the SAWs excited in the major part 3a and in an end part 3b the same, the electrode finger 32 positioned on the end (the outermost side) of the first part 3b1 and the electrode finger 32 positioned on the end of the second part 3b2 which have inverse relationships of levels of potentials relative to the first bus bar 31a and the second bus bar 31b are connected to the bus bar on the side the same as each other (first bus bar 31a in this case).

FIG. 6B shows the configuration of the IDT electrode 3B. An end part 3b in the IDT electrode 3B is divided into two in the direction perpendicular to the direction of propagation of the SAW. Specifically, a third bus bar 31c extending along the direction of propagation of the SAW is provided between the first bus bar 31a and the second bus bar 31b, and provision is made of electrode fingers 32 connected to the third bus bar 31c and extending to the first bus bar 31a side and electrode fingers 32 connected to the third bus bar 31c and extending to the second bus bar 31b side. Due to this, the first part 3b1 is configured by the electrode fingers 32 positioned between the first bus bar 31a and the third bus bar 31c, and the second part 3b2 is configured by the electrode fingers 32 positioned between the third bus bar 31c and the second bus bar 31b.

In such a configuration, in an end part 3b, the first part 3b1 and the second part 3b2 are electrically connected in series by the third bus bar 31c. The major part 3a and the end part 3b are connected in parallel by the major part 3a and the first part 3b1 being connected by the first bus bar 31a and by the major part 3a and the second part 3b2 being connected by the second bus bar 31b.

According to the IDT electrode 3B, the line for connecting an end part 3b and the terminal P2 becomes unnecessary, so reduction of size is possible. Further, in a case where an end part 3b is configured by the same number of electrode fingers 32, the length in the direction of propagation of the SAW can also be made shorter, therefore a smaller size SAW element can be provided.

Note that, in this case as well, the phase of the SAW excited by the electrode fingers 32 in the major part 3a and the phase of the SAW excited by the electrode fingers in an end part 3b may be in-phase as well. In order to make the phases of the two in-phase, as shown in the diagram, in each of the parts 3b1 and 3b2, the order of the electrode fingers 32 on the higher potential side and the electrode fingers 32 on the lower side may be made the same as the order of the electrode fingers 32 on the higher potential side and the electrode fingers 32 on the lower side in the major part 3a.

FIG. 6C shows the configuration of the IDT electrode 3C. An end part 3b in the IDT electrode 3C is divided into three parts in the direction perpendicular to the direction of propagation of the SAW. Specifically, by providing a third bus bar 31c and fourth bus bar 31d extending along the direction of propagation of the SAW between the first bus bar 31a and the second bus bar 31b, the first part 3b1, second part 3b2, and third part 3b3 are configured. The method of serial connection of the first part 3b1, second part 3b2, and third part 3b3 in the end part 3b and the method of parallel connection between the major part 3a and the end part 3b are the same as the example shown in FIG. 6B.

Note that, also in this case, the phase of the SAW excited by the electrode fingers 32 in the major part 3a and the phase of the SAW excited by the electrode fingers 32 in an end part 3b may be in-phase as well. In order to make the phases of the two in-phase, as shown in the diagram, in each of the end parts 3b1 and 3b2, the order of the electrode fingers 32 on the higher potential side and the electrode fingers 32 on the lower side may be made the same as the order of the electrode fingers 32 on the higher potential side and the electrode fingers 32 on the lower side in the major part 3a.

Further, FIG. 6B and FIG. 6C showed examples wherein, in an end part 3b, the other bus bars (31c, 31d) were arranged at equal intervals between the first bus bars 31a and the second bus bars 31b, but the present disclosure is not limited to this.

For example, in FIG. 6C, when the interval of the third bus bar 31c and the fourth bus bar 31d is made smaller in comparison with the interval of the other bus bars, the effect of sealing in the acoustic wave at the vicinity of the center of the IDT electrode 3 becomes higher, therefore a SAW element reduced in loss can be provided. Specifically, in the case of the example shown in FIG. 6C, the interval between the third bus bar 31c and the fourth bus bar 31d is made smaller than the interval between the first bus bar 31a and the third bus bar 31c and the interval between the fourth bus bar 31d and the second bus bar 31b.

Further, by positioning the third and fourth bus bars 31c and 31d offset from the center of the direction of propagation of the SAW, the influence of the bus bars (31c, 31d) is suppressed, therefore loss can be reduced as well. That is, in the case of the example shown in FIG. 6C, the interval of the third bus bar 31c and the fourth bus bar 31d may be made larger than the intervals between the other bus bars as well.

<<Verification>>

For the SAW elements 1 and LA, elements made different in the numbers of the electrode fingers 32 configuring the end parts 3b were prepared and evaluated. The fundamental configurations of the prepared SAW elements were as follows:

[Piezoelectric Substrate 2]
  Material: 42° Y-cut and X-propagated LiTaO$_3$ substrate
[IDT Electrodes 3, 3A]
  Material: Al—Cu alloy
  (However, there is an underlying layer of 6 nm which is made of Ti between the electrodes and the piezoelectric substrate 2)
  Thickness (Al—Cu alloy layer): 154 nm Electrode fingers 32 in IDT electrode 3:
    (Number) 200
    (Pitch Pt1) 1.00 µm
    (Duty ratio: w1/Pt1) 0.5
    (Intersection width W) 20λ (λ=2×Pt1)
[Reflector Electrode 4]
  Material: Al—Cu alloy
  (However, there is an underlying layer of 6 nm which is made of Ti between the electrode and the piezoelectric substrate 2)
  Thickness (Al—Cu alloy layer): 154 nm
  Number of reflection electrode fingers 42: 30
  Intersection width of reflection electrode fingers 42: 20λ (λ=2×Pt1)
  Pitch Pt2 of reflection electrode fingers 42: 1.00 µm (=Pt1)
  Interval G with IDT electrode 3: Pt1
[Protective Layer]
  Material: SiO$_2$
  Thickness: 15 nm First, SAW elements were manufactured while making the numbers of the electrode fingers 32 in single end parts 3b as a whole different. The resonator characteristics were measured. Further, as a comparative example, a SAW element not provided with any end part 3b (the entire IDT electrode 3 was configured by the major part 3a) was manufactured. As a result, it was confirmed that, the characteristics between the resonance frequency and the anti-resonance frequency did not deteriorate so far as the number of fingers at the end part 3b was about 30.

Next, in the configurations of the SAW elements 1, SAW elements 1 were manufactured while making the numbers of the electrode fingers 32 configuring the end parts 3b different. Specifically, the numbers of the electrode fingers of the first part 3b1 and the second part 3b2 in an end part 3b were changed as follows. Below, for example, a case where the number of the electrode fingers 32 in the first part 3b1 is four and the number of the electrode fingers 32 in the second part 3b is 10 will be displayed as (4/10).

Example 1: (4/4)
Example 2: (10/10)
Example 3: (14/14)
Example 4: (6/12)
Example 5: (4/14)

Figure 7A:
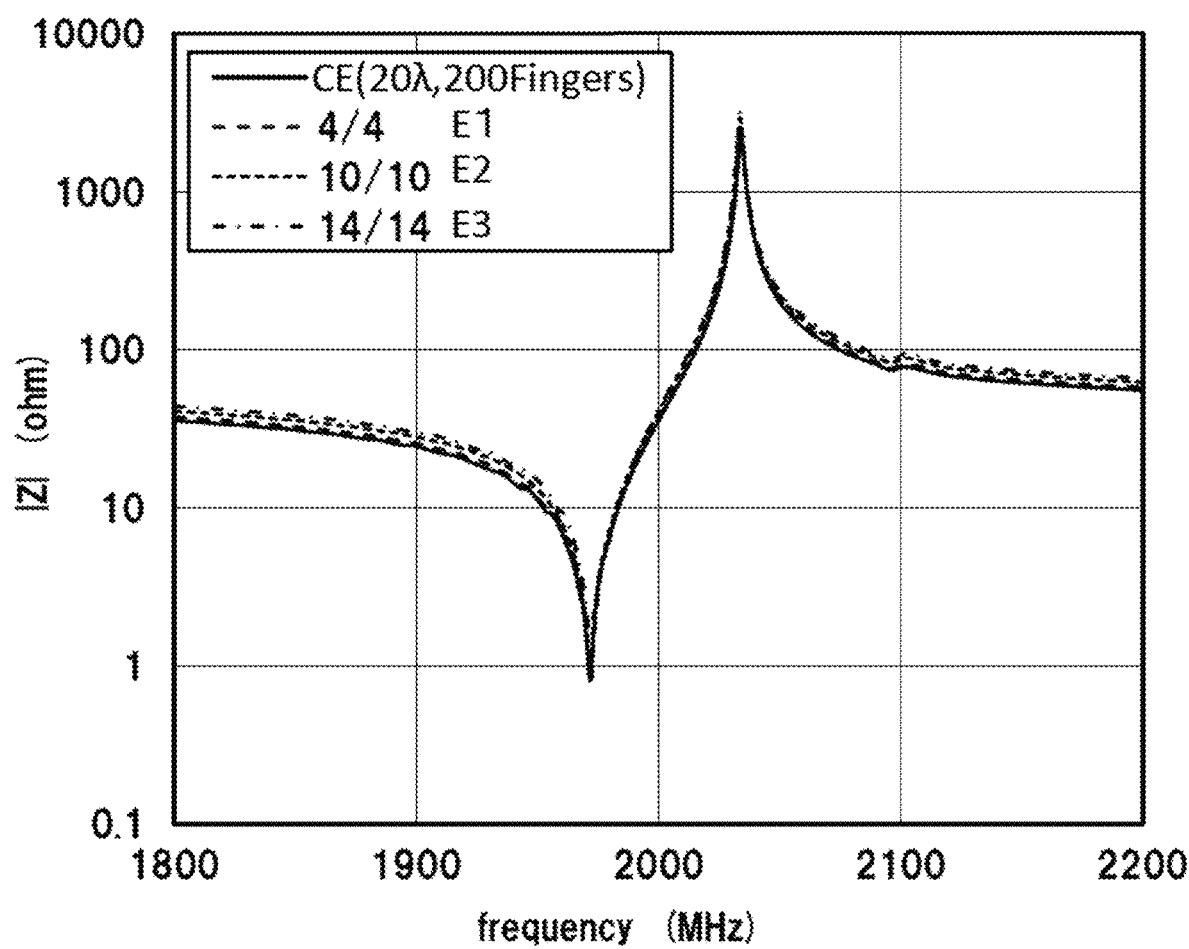
FIG. 7A A graph showing frequency characteristics of impedances of examples and a comparative example.
Figure 7B:
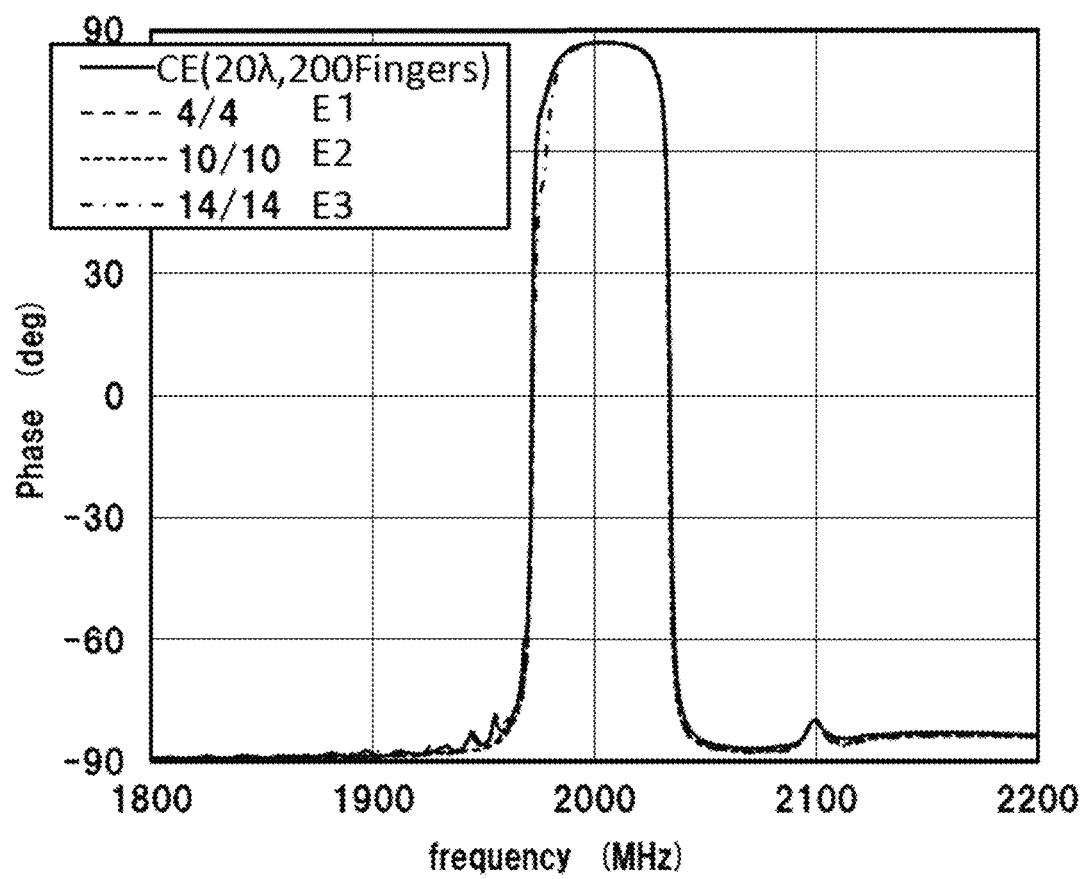
FIG. 7B A graph for comparing phase characteristics of impedances of examples and a comparative example.
Figure 8A:
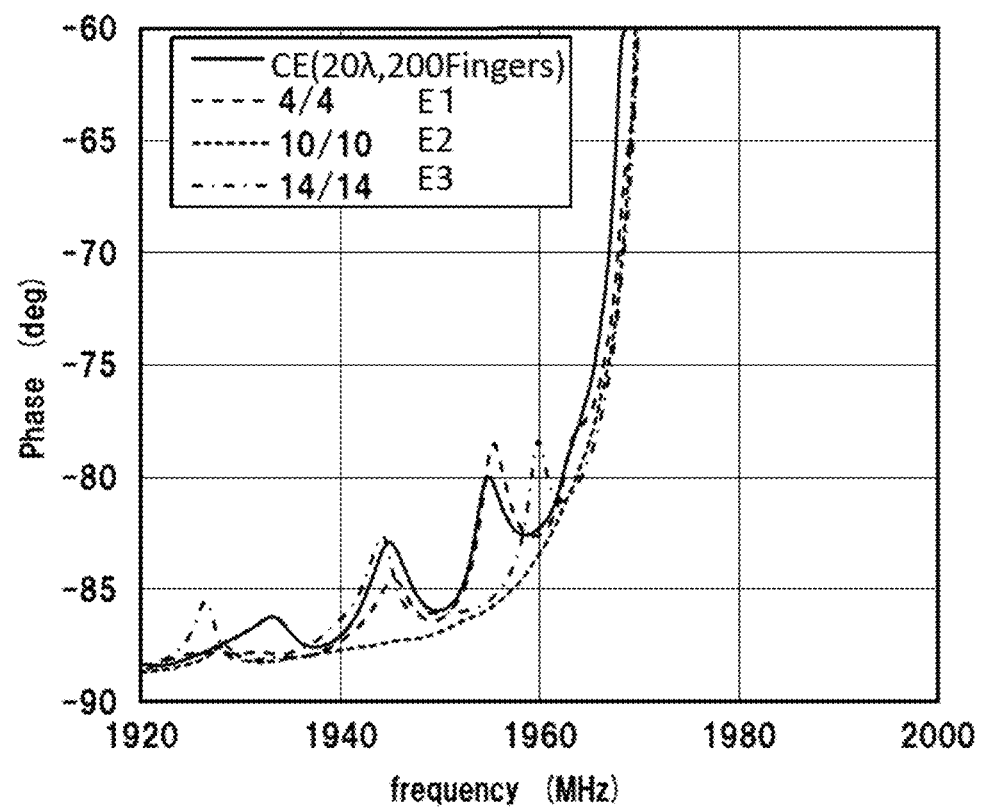
FIG. 8A A graph for comparing phase characteristics of impedances of examples and a comparative example.
Figure 8B:
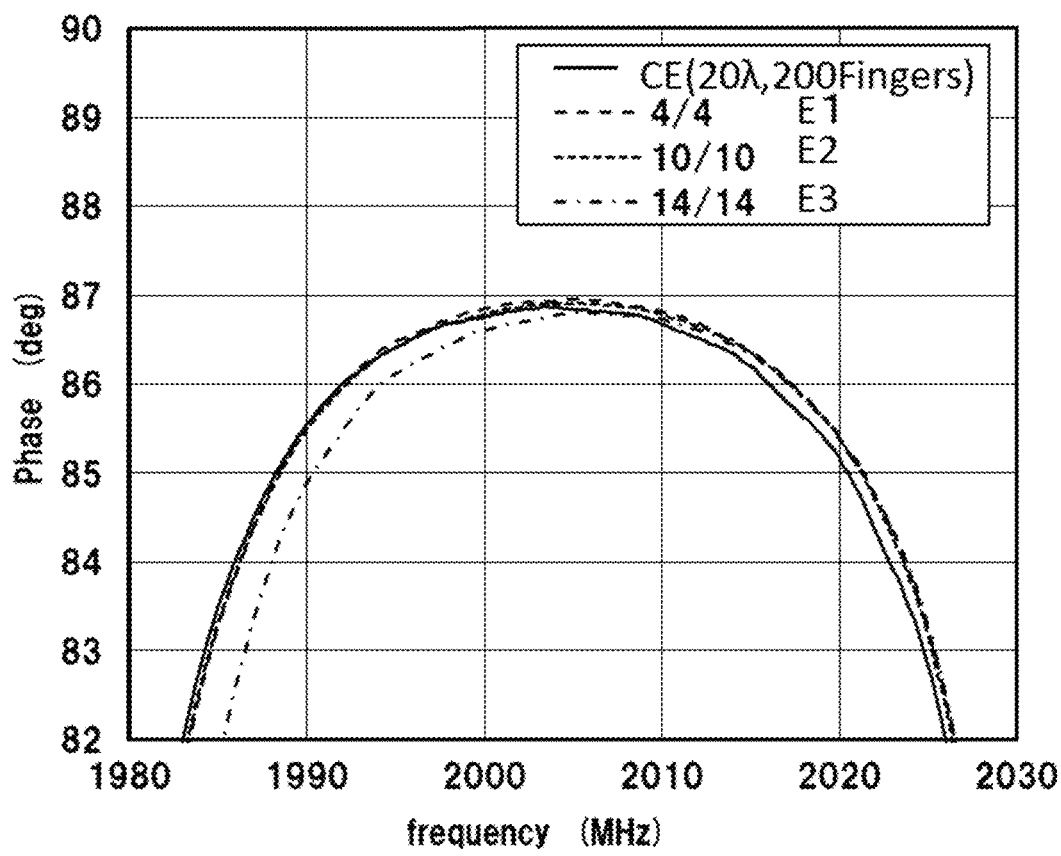
FIG. 8B A graph for comparing phase characteristics of impedances of examples and a comparative example.
Figure 8C:
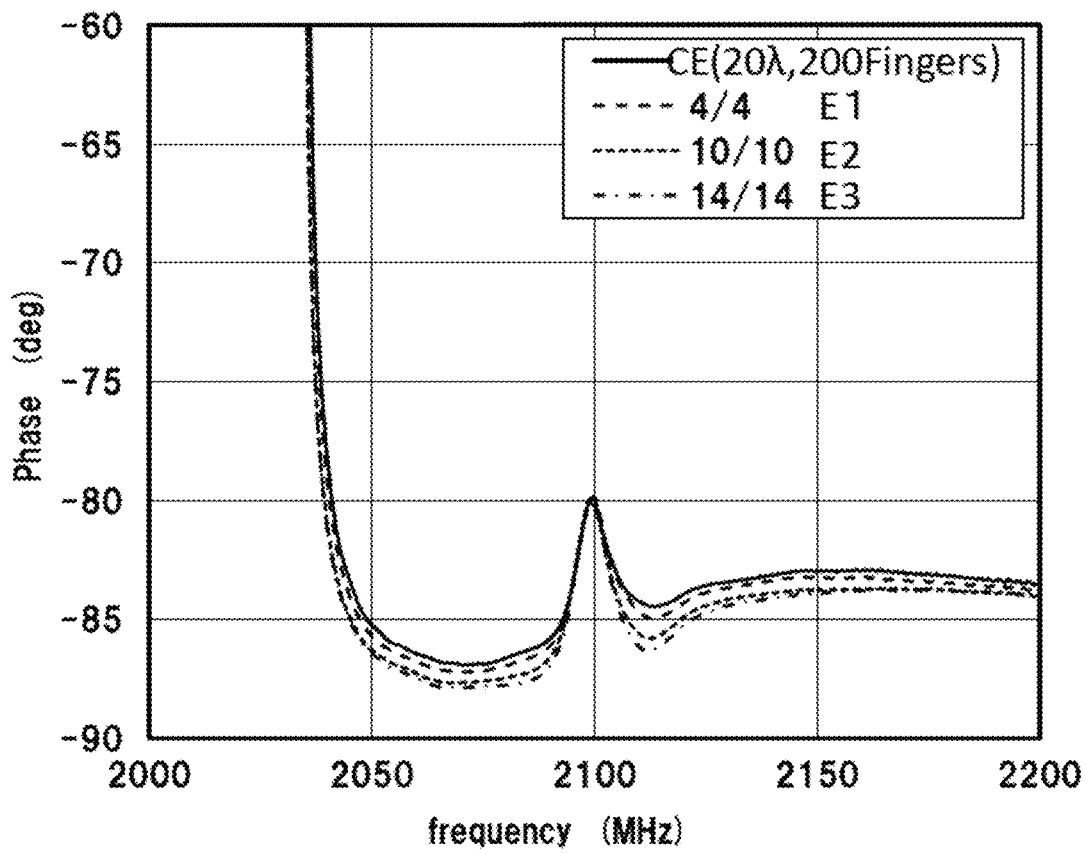
FIG. 8C A graph for comparing phase characteristics of impedances of examples and a comparative example.
Figure 9A:
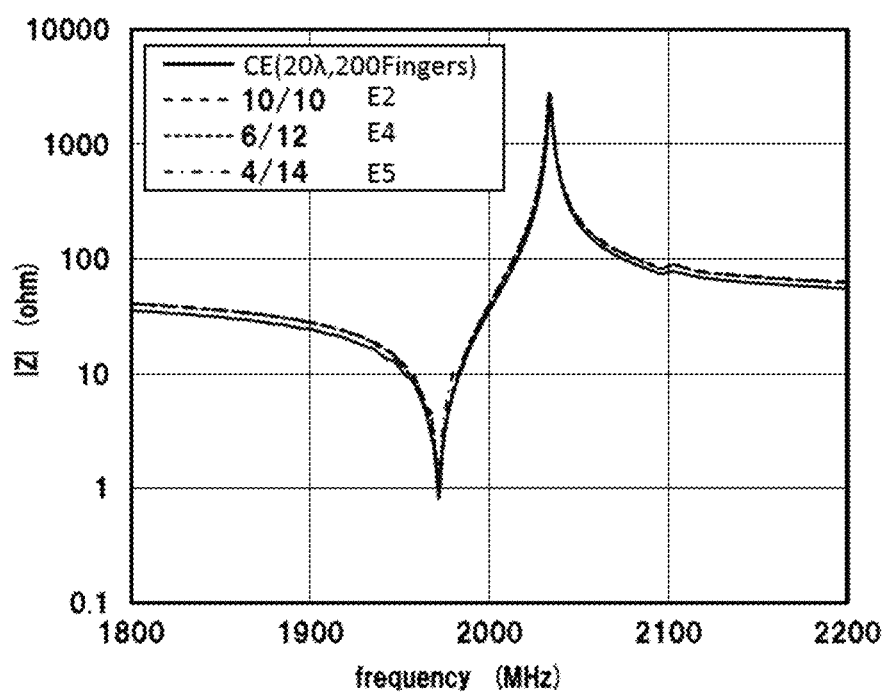
FIG. 9A A graph showing the frequency characteristics of impedances of examples and a comparative example.
Figure 9B:
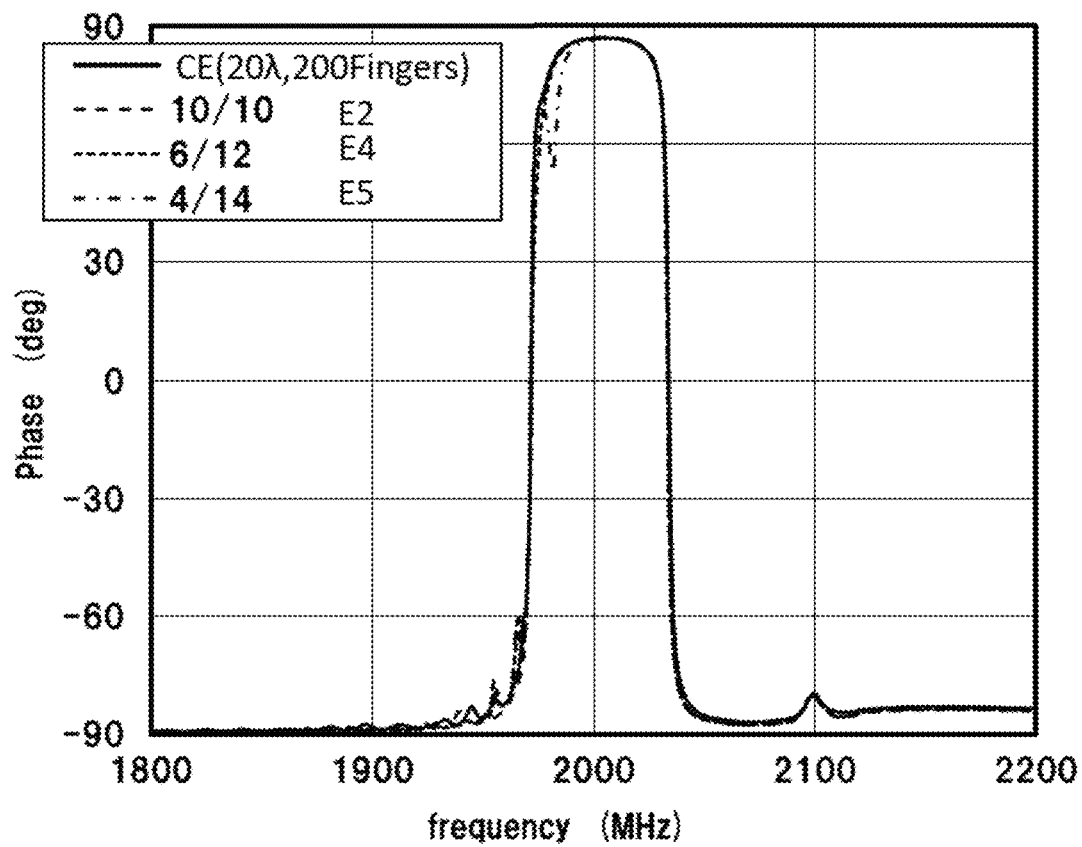
FIG. 9B A graph for comparing the phase characteristics of impedances of examples and a comparative example.
Figure 10A:
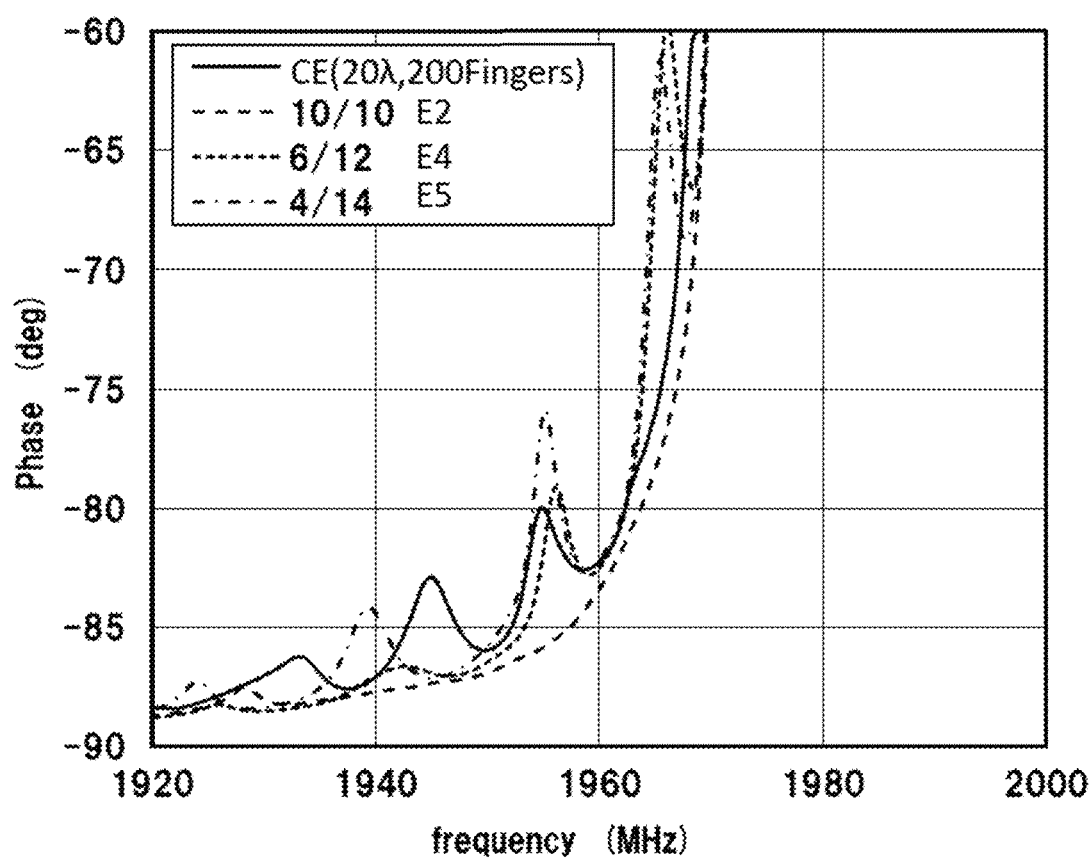
FIG. 10A A graph for comparing the phase characteristics of impedances of examples and a comparative example.
Figure 10B:
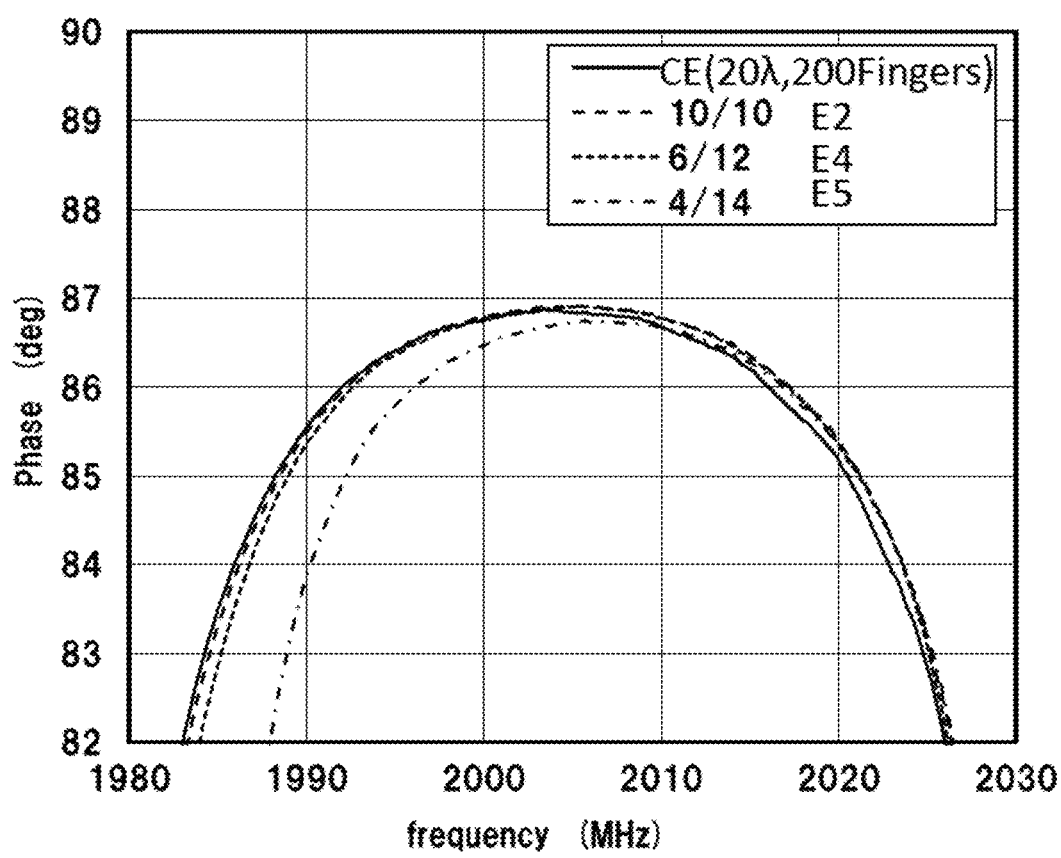
FIG. 10B A graph for comparing the phase characteristics of impedances of examples and a comparative example.
Figure 10C:
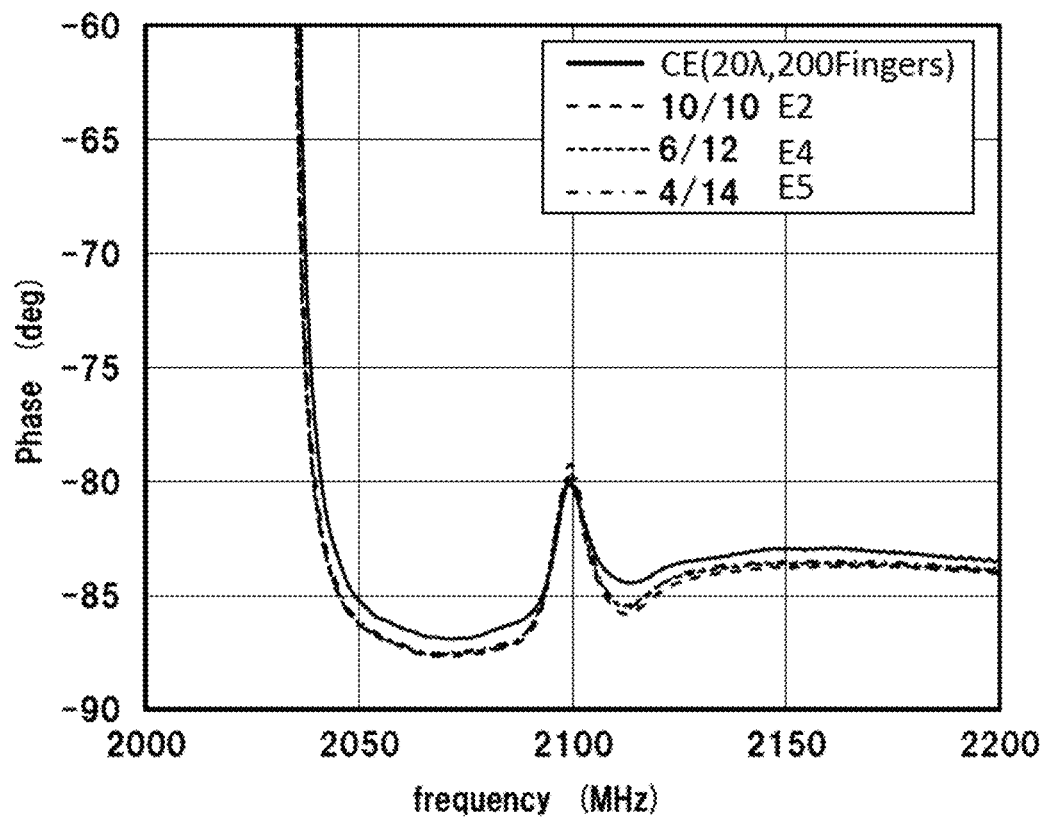
FIG. 10C A graph for comparing the phase characteristics of impedances of examples and a comparative example.

The results of measurement of the frequency characteristics in the comparative example and Examples 1 to 3 will be shown in FIG. 7A, FIG. 7B, and FIG. 8A to FIG. 8C, and the results of measurement of the frequency characteristics in the comparative example and Examples 2, 4, and 5 will be shown in FIG. 9A, FIG. 9B, and FIG. 10A to FIG. 10C. In FIG. 7A and FIG. 9A, the abscissas indicate the frequencies (MHz), and the ordinates indicate impedances. In FIG. 7B, FIG. 9B, FIG. 8A to FIG. 8C, and FIG. 9A to FIG. 9C, the abscissas indicate the frequencies (MHz), and the ordinates indicate the phases (deg) of impedances. Further, FIG. 8A and FIG. 10A show the frequency characteristics of the phases of impedances in the vicinity of the resonance frequency, FIG. 8B and FIG. 10B show the same between the resonance frequency and the antiresonance frequency, and FIG. 8C and FIG. 10C show the same in the vicinity of the antiresonance frequency.

Note that, in the graphs, the comparative example is displayed as "CE" and Examples 1 to 5 are displayed as E1 to E5. Also, later examples in the following description are shown using the same rule.

As apparent also from FIG. 7A, FIG. 7B, FIG. 9A, and FIG. 9B, in all of the examples, it could be confirmed that the characteristics as resonators could be maintained without much deterioration of the characteristics between the resonance frequency and the antiresonance frequency. Note that, for loss of resonators, by comparing the phases of impedances, the difference thereof can be clearly grasped. Therefore, below, they will be evaluated according to the phase characteristics.

Here, the phase of the impedances is the reflection of loss of the resonator. The loss is smaller as the phase approaches more to $-90°$ on the lower frequency side than the resonance frequency and on the higher frequency side than the antiresonance frequency and as the phase approaches more to $+90°$ at the frequency between the resonance frequency and the antiresonance frequency.

In each example, it could be confirmed that the loss in a range from the vicinity of the antiresonance frequency to a higher frequency side than the antiresonance frequency was reduced in a wide range in comparison with CE (FIG. 8C, FIG. 10C). Further, in Example 2, it was confirmed that ripple on a low frequency side of the resonance frequency could be suppressed and loss in the vicinity of the resonance frequency could be reduced as well (FIG. 8A, FIG. 10A). On the other hand, in Examples 3 and 5, it was confirmed that there was a little influence upon the loss in a range from the vicinity of the resonance frequency to a higher frequency side than the resonance frequency.

Note that, the value of the capacity of the entire SAW element 1 becomes smaller by the amount of the provision of an end part 3b, therefore the impedance of the SAW element in each example becomes higher a little. However, this can be adjusted to the same level as the comparative example by adjusting the size of the major part 3a (number of electrode fingers 32, intersection width).

Next, a SAW element 1A was manufactured. Specifically, the numbers of the electrode fingers 32 in the first part 3b1, second part 3b2, and third part 3b3 in an end part 3b were changed as in the following way. Below, for example, a case where the number of electrode fingers 32 in the first part 3b1 is four, the number of the electrode fingers 32 in the second part 3b2 is 10, and the number of the electrode fingers in the third part 3b3 is 12 will be displayed as (4/10/12).

Example 6: (2/2/2)
Example 7: (6/6/6)
Example 8: (10/10/10)
Example 9: (4/8/12)
Example 10: (2/6/12)

Figure 11A:
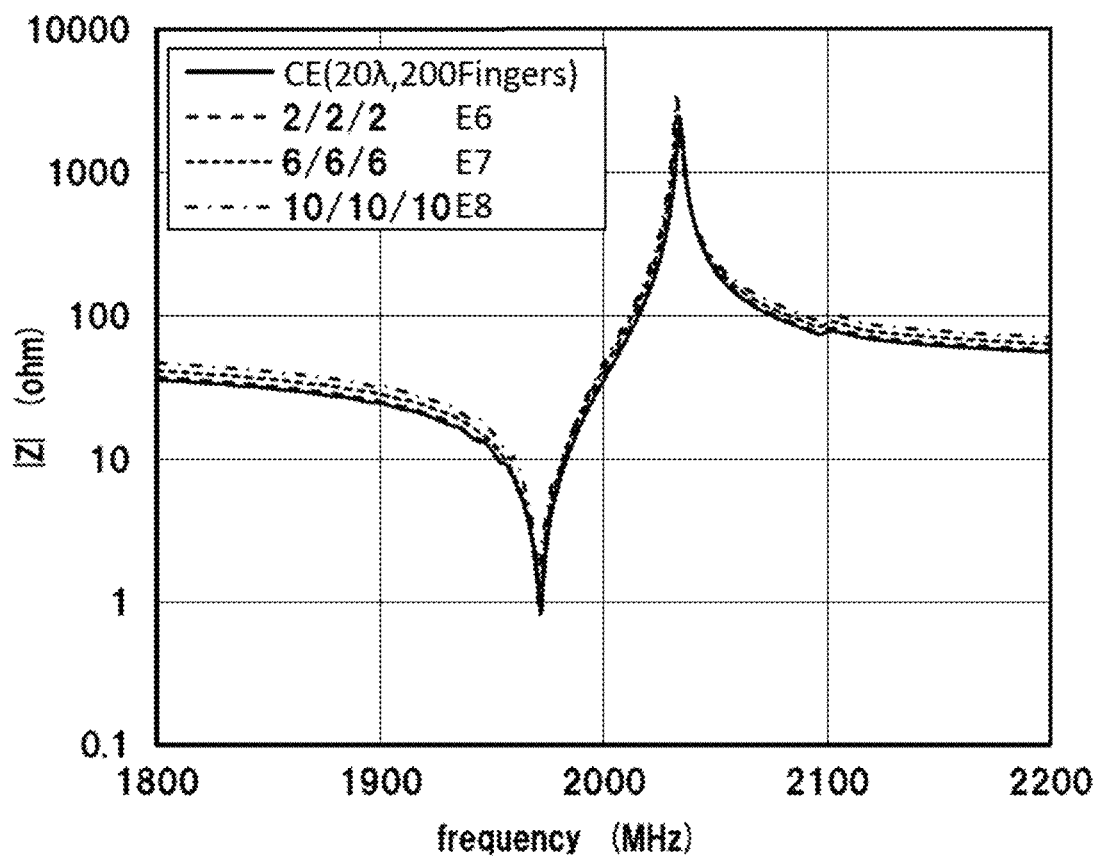
FIG. 11A A graph showing the frequency characteristics of impedances of examples and a comparative example.
Figure 11B:
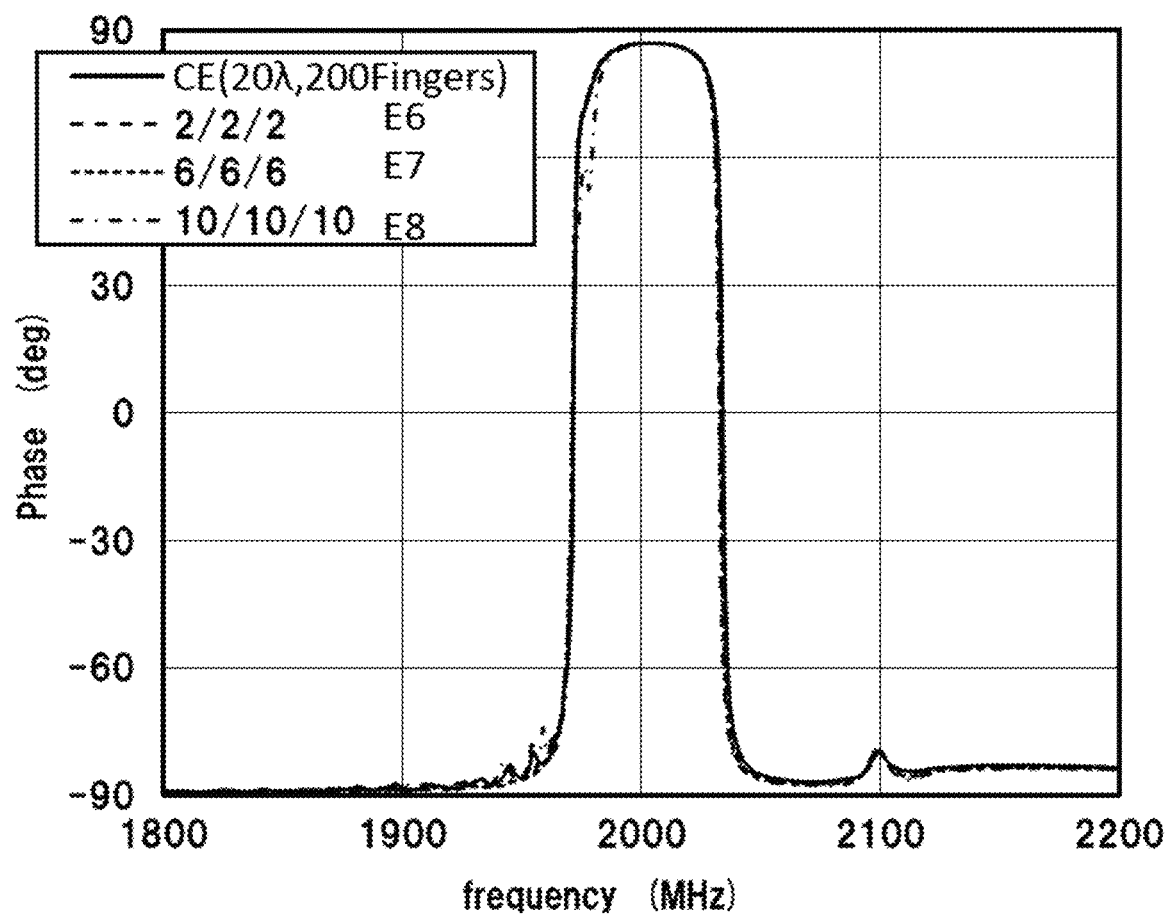
FIG. 11B A graph for comparing the phase characteristics of impedances of examples example and a comparative example.
Figure 12A:
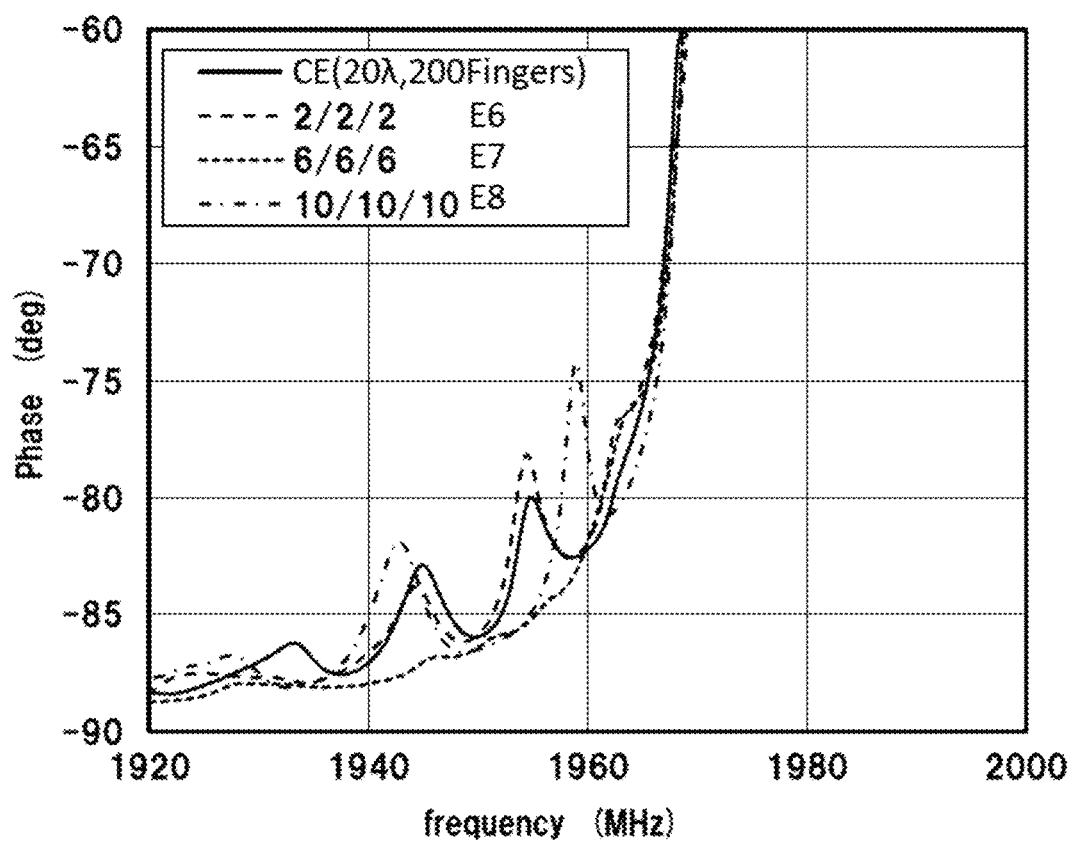
FIG. 12A A graph for comparing the phase characteristics of impedances of examples and a comparative example.
Figure 12B:
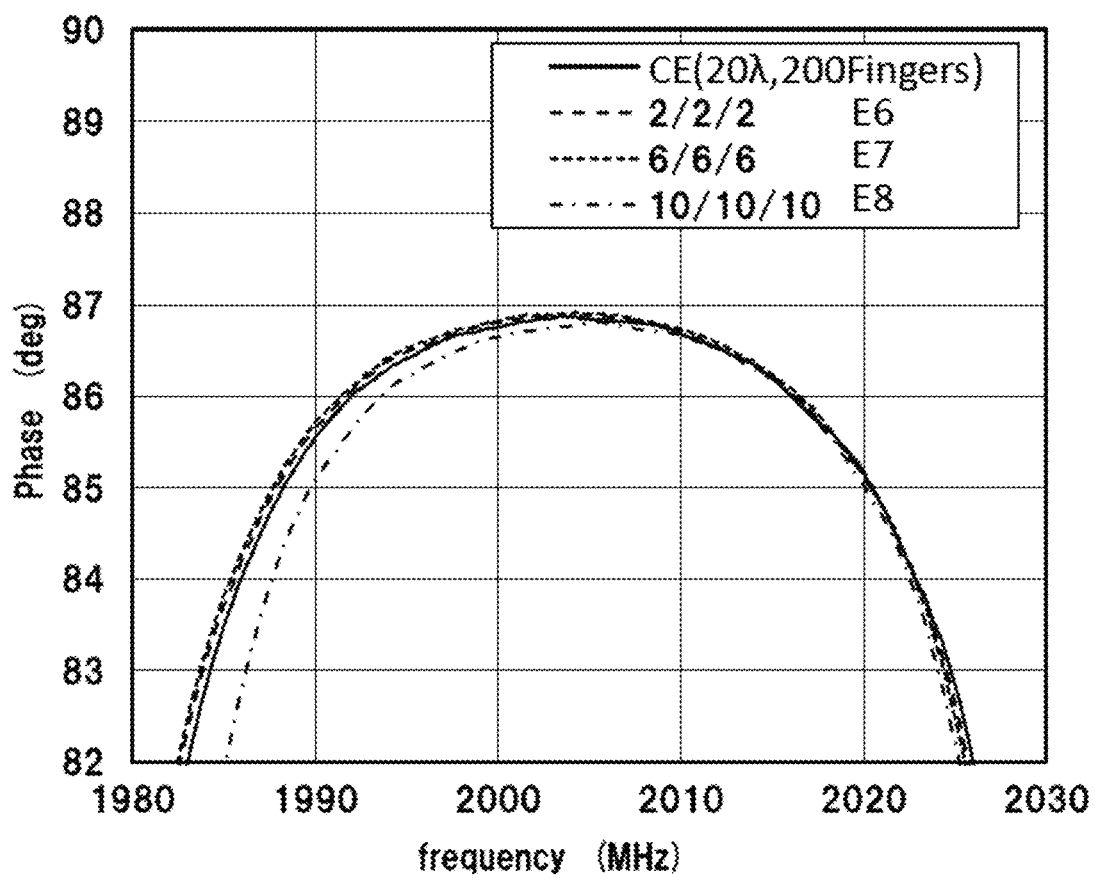
FIG. 12B A graph for comparing the phase characteristics of impedances of examples and a comparative example.
Figure 12C:
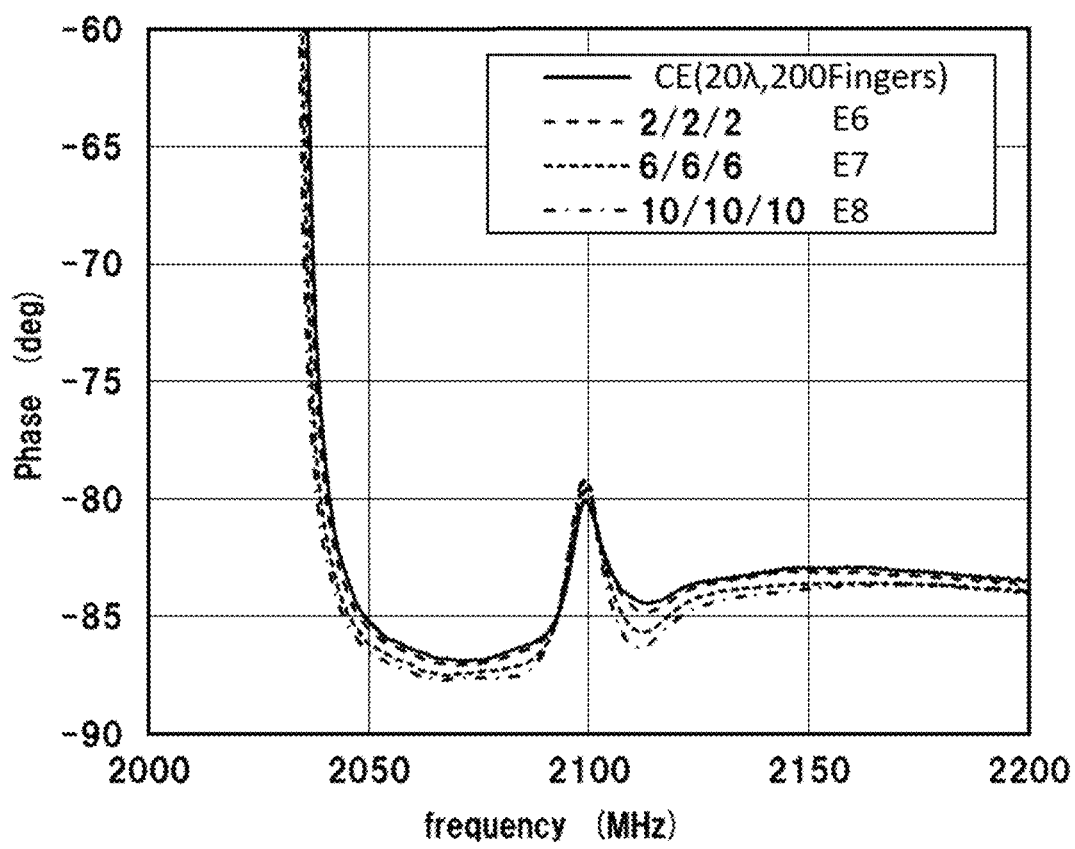
FIG. 12C A graph for comparing the phase characteristics of impedances of examples and a comparative example.
Figure 13A:
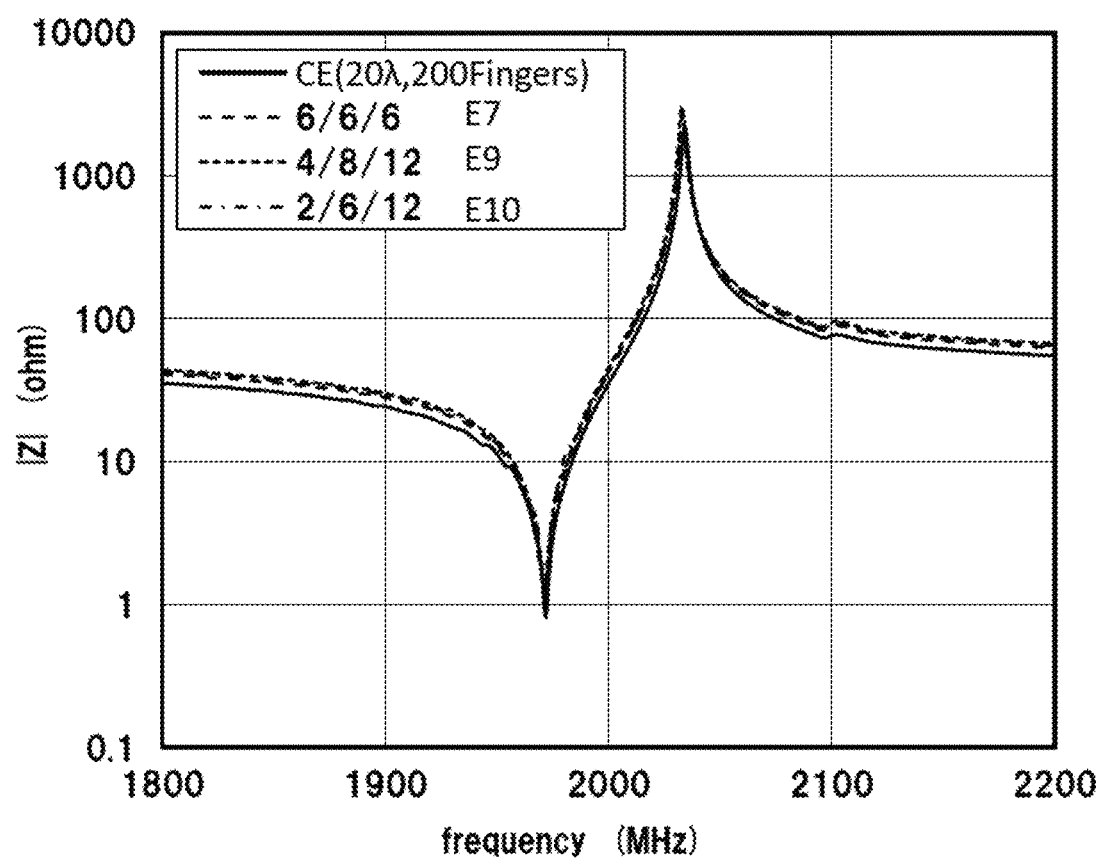
FIG. 13A A graph showing the frequency characteristics of impedances of examples and a comparative example.
Figure 13B:
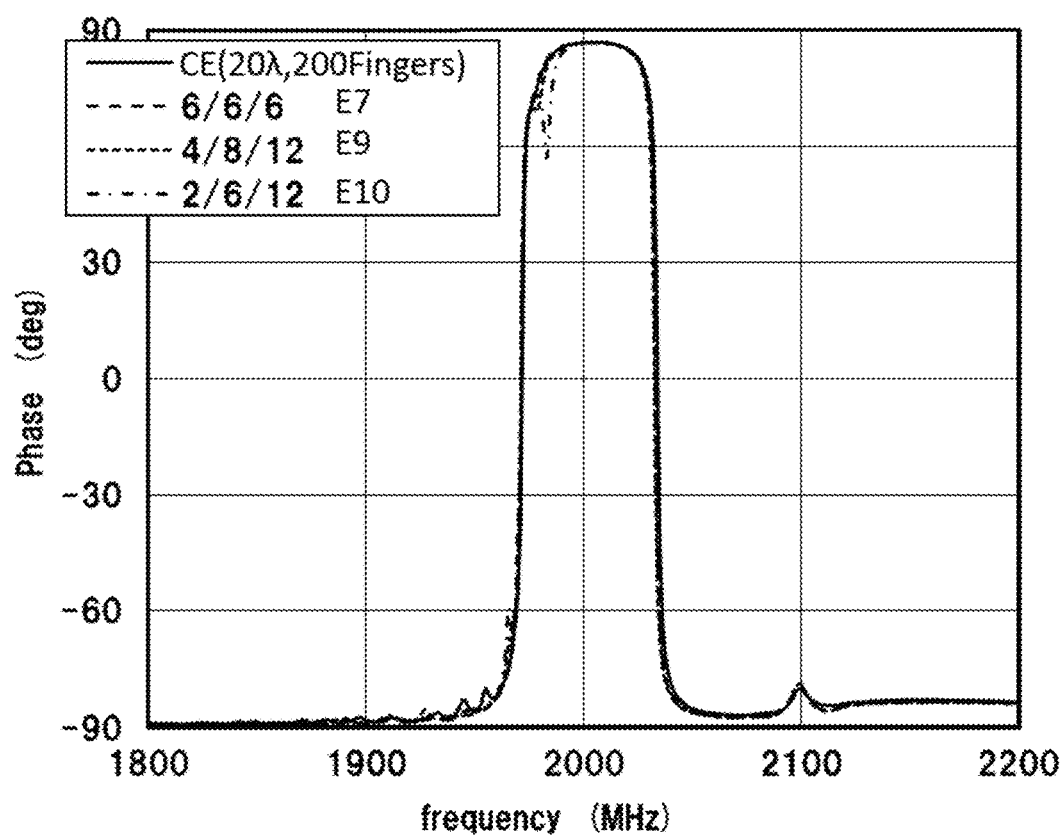
FIG. 13B A graph for comparing the phase characteristics of impedances of examples and a comparative example.
Figure 14A:
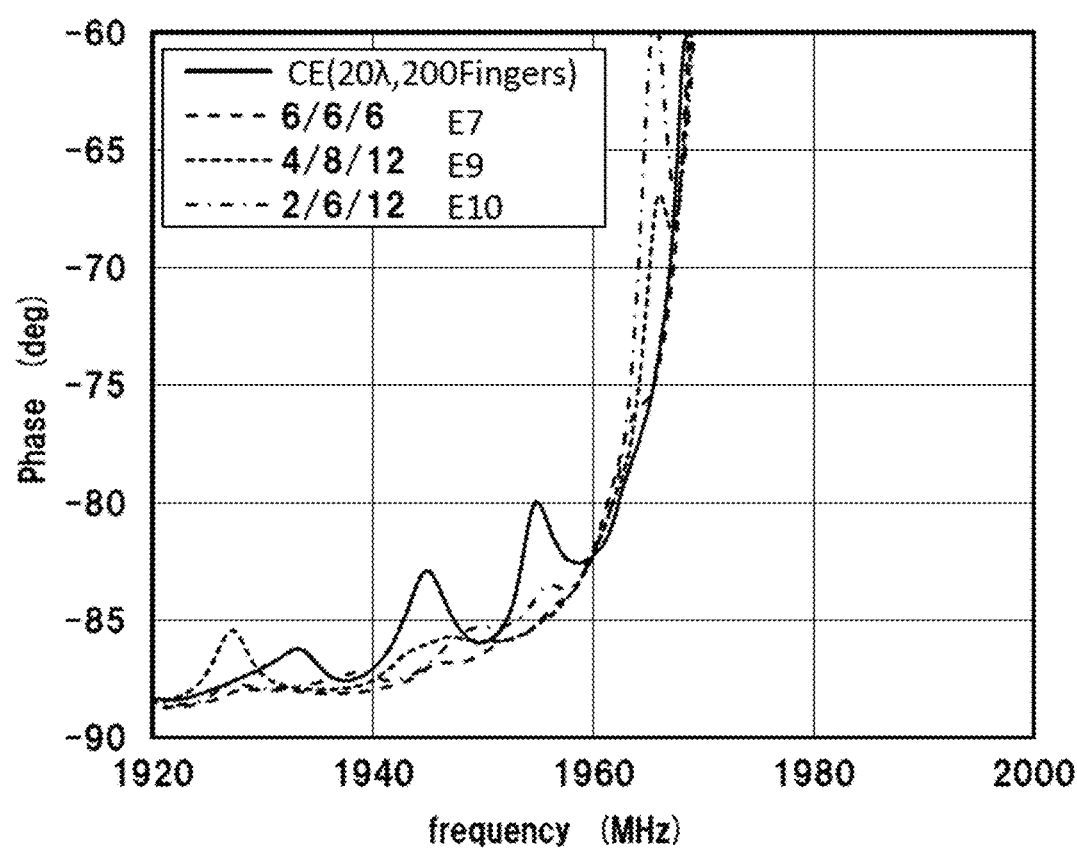
FIG. 14A A graph for comparing the phase characteristics of impedances of examples and a comparative example.
Figure 14B:
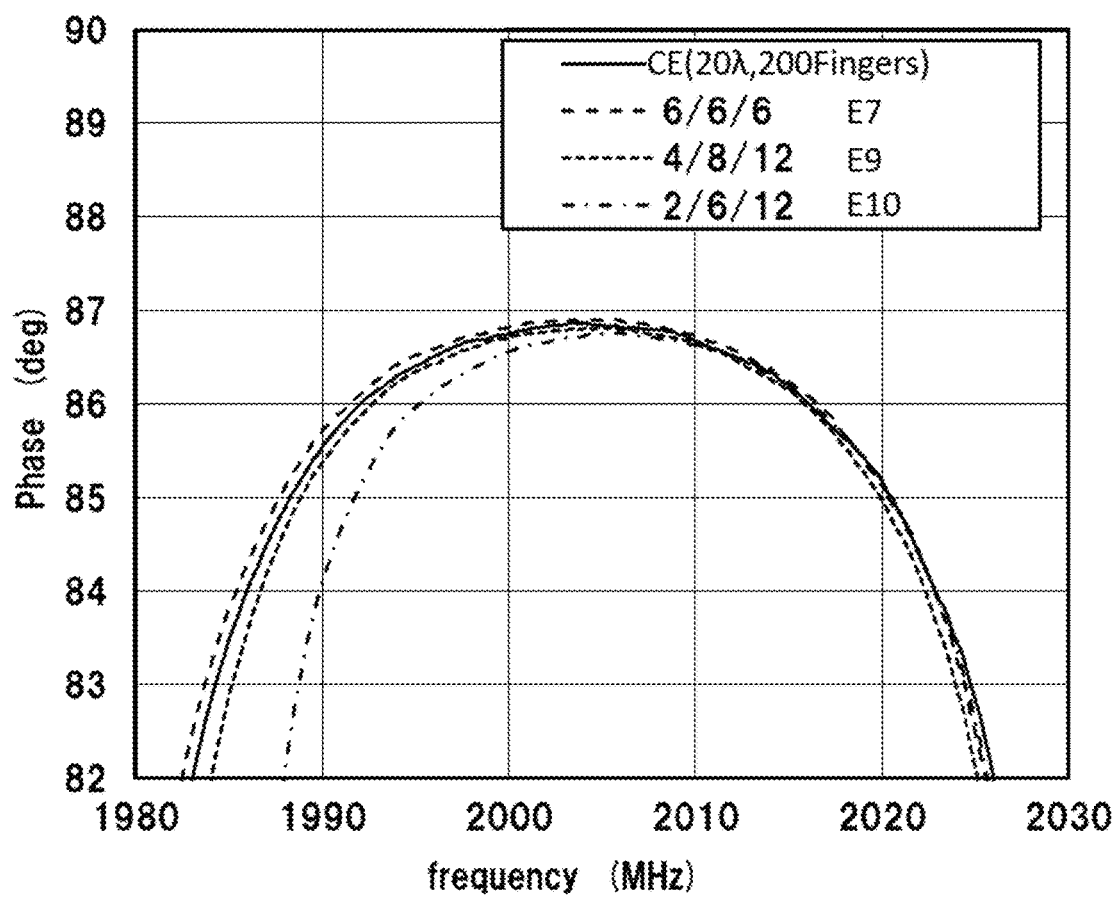
FIG. 14B A graph for comparing the phase characteristics of impedances of examples and a comparative example.
Figure 14C:
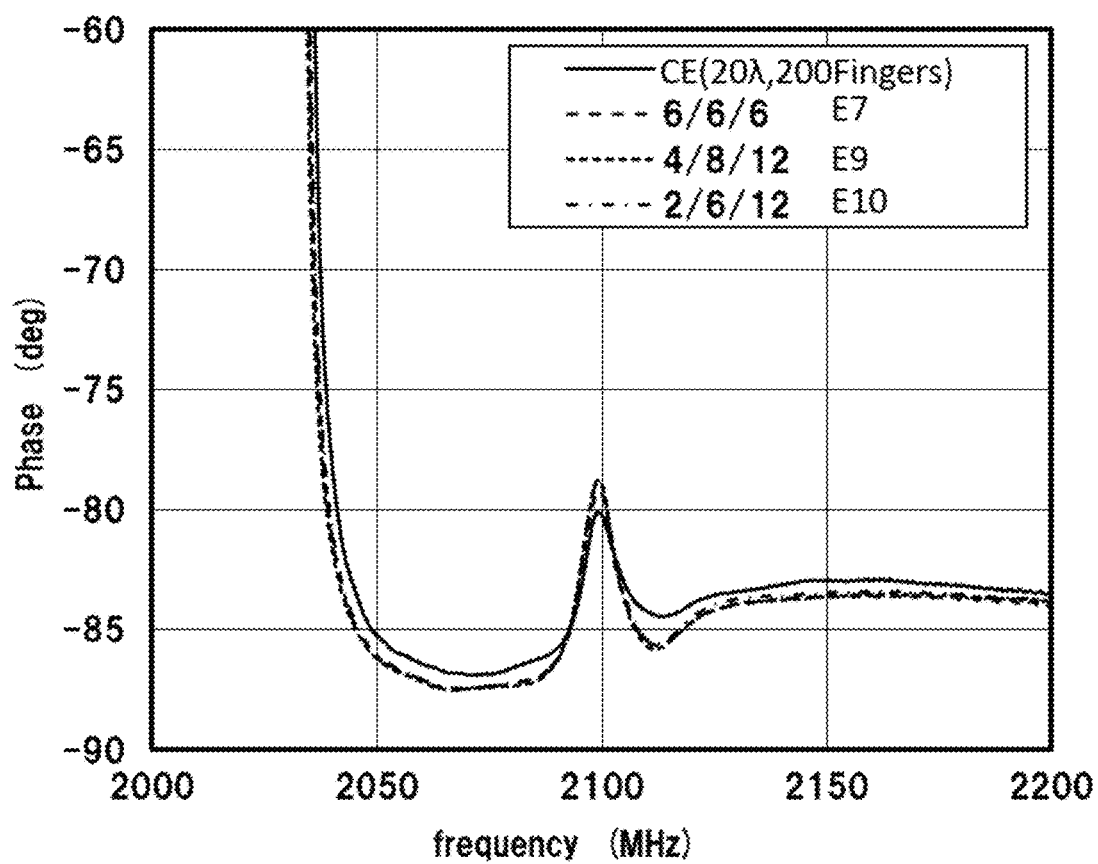
FIG. 14C A graph for comparing the phase characteristics of impedances of examples and a comparative example.

The results of measurement of the frequency characteristics in the comparative example and Examples 6 to 8 will be shown in FIG. 11A, FIG. 11B, and FIG. 12A to FIG. 12C, and the results of measurement of the frequency characteristics in the comparative example and Examples 7, 9, and 10 will be shown in FIG. 13A, FIG. 13B, and FIG. 14A to FIG. 14C. In FIG. 11A and FIG. 13A, the abscissas indicate the frequencies (MHz), and the ordinates indicate the impedances. In FIG. 11B, FIG. 13B, FIG. 12A to FIG. 12C, and FIG. 14A to FIG. 14C, the abscissas indicate the frequencies (MHz), and the ordinates indicate the phases (deg) of impedances. FIG. 12A and FIG. 14A show the frequency characteristics of the phases of the impedances in the vicinity of the resonance frequency, FIG. 12B and FIG. 14B show the same between the resonance frequency and the antiresonance frequency, and FIG. 12C and FIG. 14C show the same in the vicinity of the antiresonance frequency.

It was confirmed that, in all examples, the characteristics as the resonator could be maintained (FIG. 11A, FIG. 11B, FIG. 13A, FIG. 13B). Further, it could be confirmed that, in all examples, the loss in a range from the vicinity of the antiresonance frequency to a higher frequency side than the antiresonance frequency was reduced in a broader range in comparison with the comparative example (FIG. 12C, FIG. 14C). Further, it was confirmed in Examples 7 and 9 that ripple on a low band side of the resonance frequency could be suppressed, and also a loss in the vicinity of the resonance frequency could be reduced (FIG. 12A, FIG. 14A). Further, it was confirmed in Example 7 that also loss in the vicinity of the high frequency side of the resonance frequency was reduced (FIG. 12B). On the other hand, it was confirmed in Examples 8 and 10 that there was a small influence upon the loss in a range from the vicinity of the resonance frequency to a higher frequency side than the resonance frequency (FIG. 12B, FIG. 14B).

Next, SAW elements 1B (Example 11) and 1C (Example 12) were manufactured. Specifically, the numbers of the electrode fingers 32 in the first part 3b1 and in the second part 3b2 in each end part 3b (in the third part 3b3 in the SAW element 1C) were made 16 in Example 11 and 18 in Example 12 along the direction of propagation of the SAW.

Figure 15A:
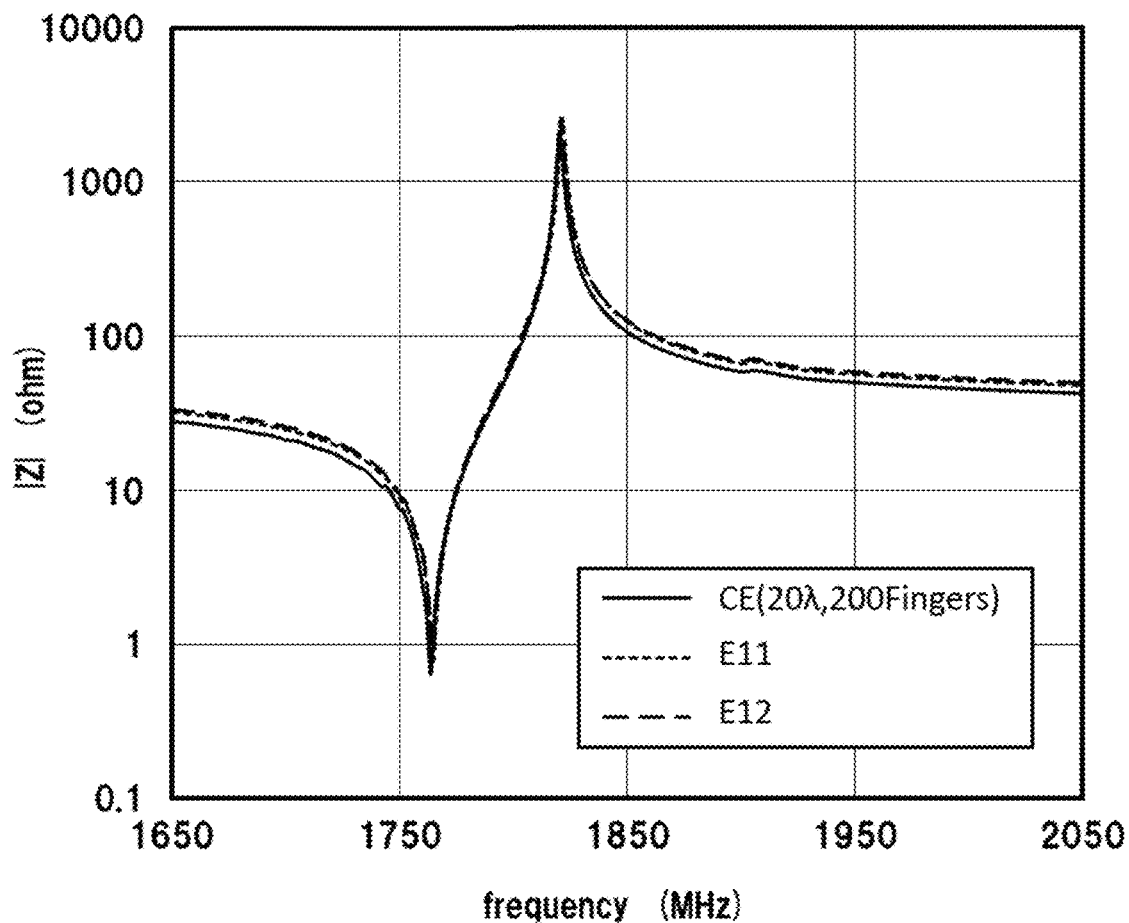
FIG. 15A A graph showing the frequency characteristics of impedances of examples and a comparative example.
Figure 15B:
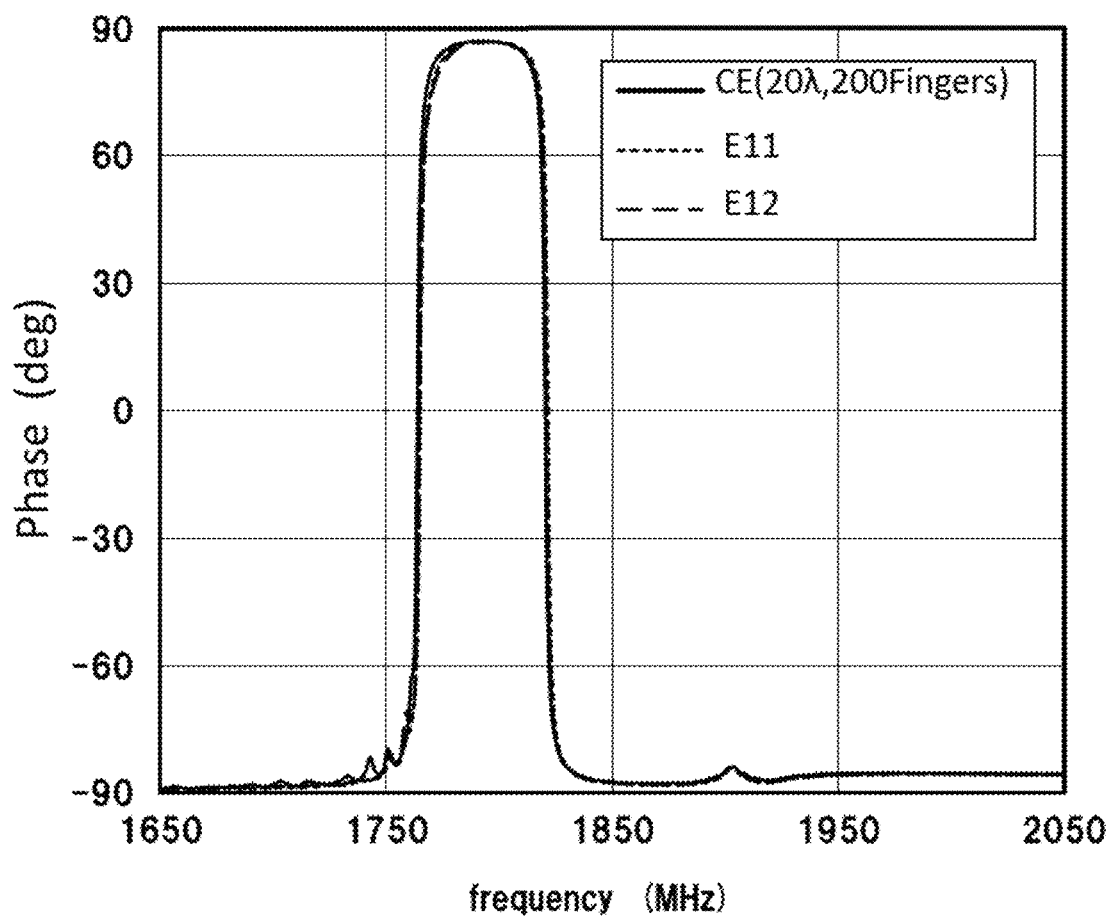
FIG. 15B A graph for comparing the phase characteristics of impedances of examples and a comparative example.
Figure 16A:
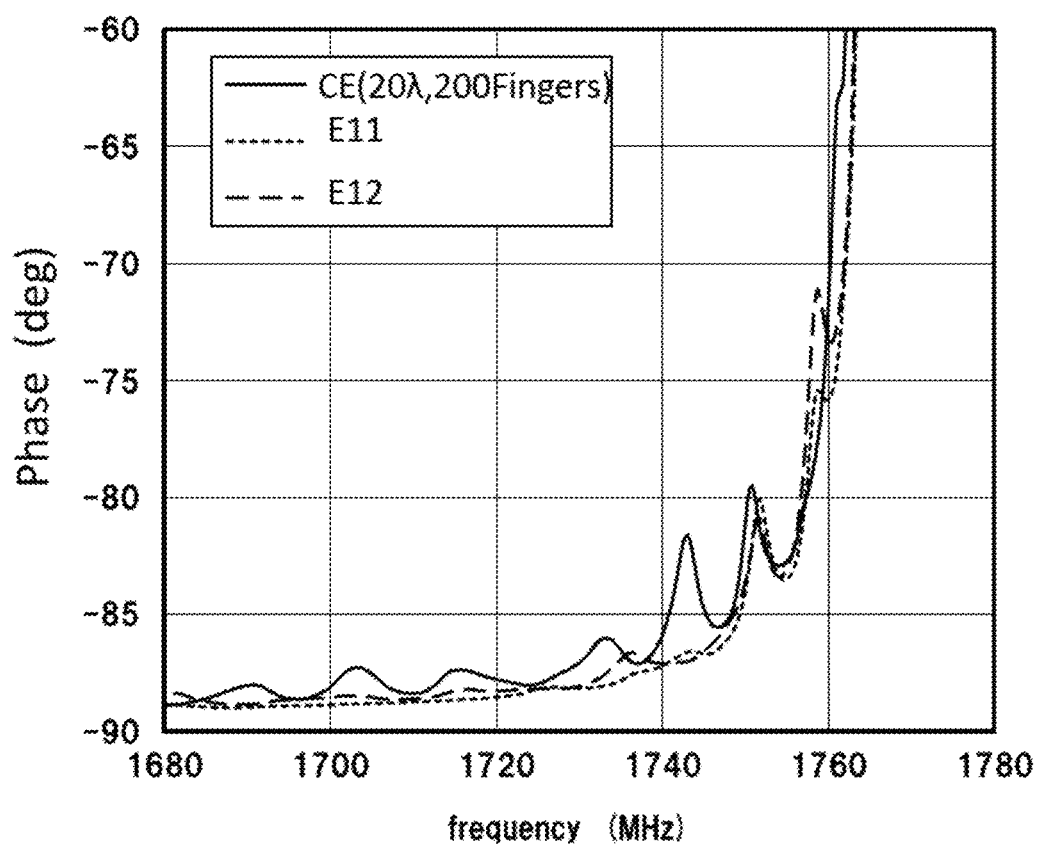
FIG. 16A A graph for comparing the phase characteristics of impedances of examples and a comparative example.
Figure 16B:
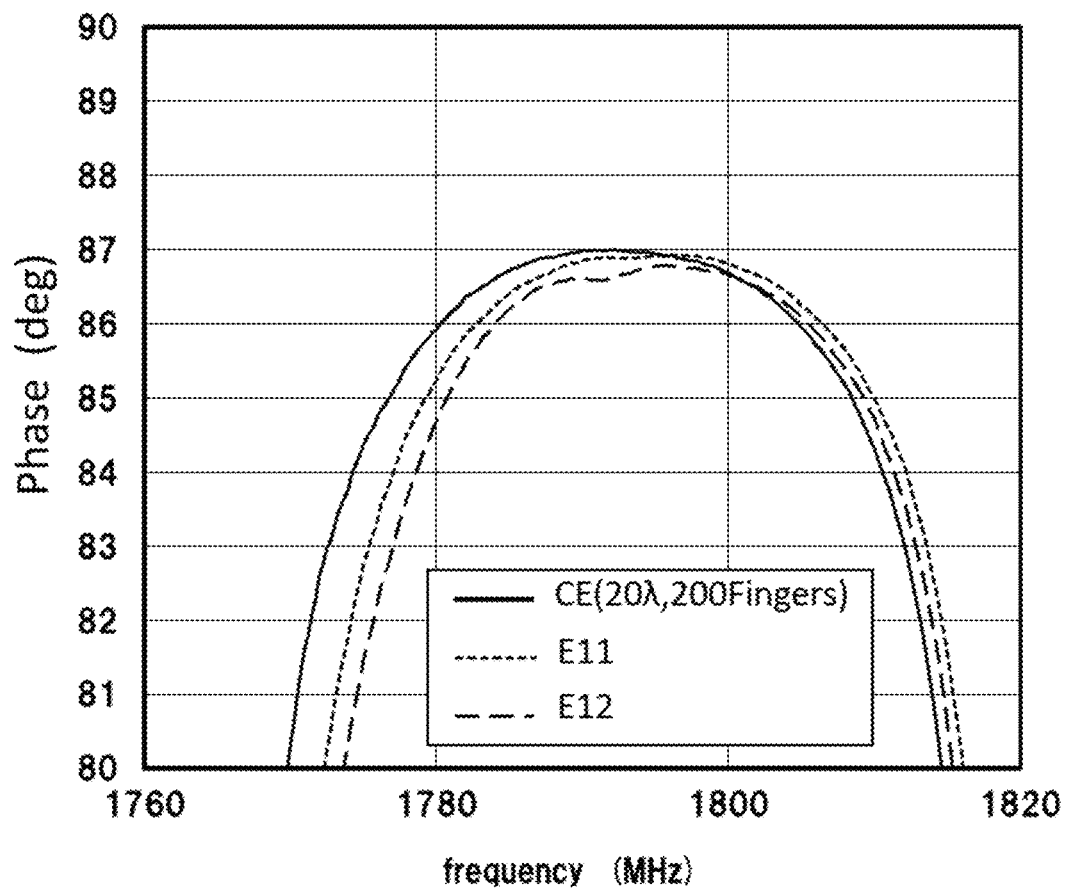
FIG. 16B A graph for comparing the phase characteristics of impedances of examples and a comparative example.
Figure 16C:
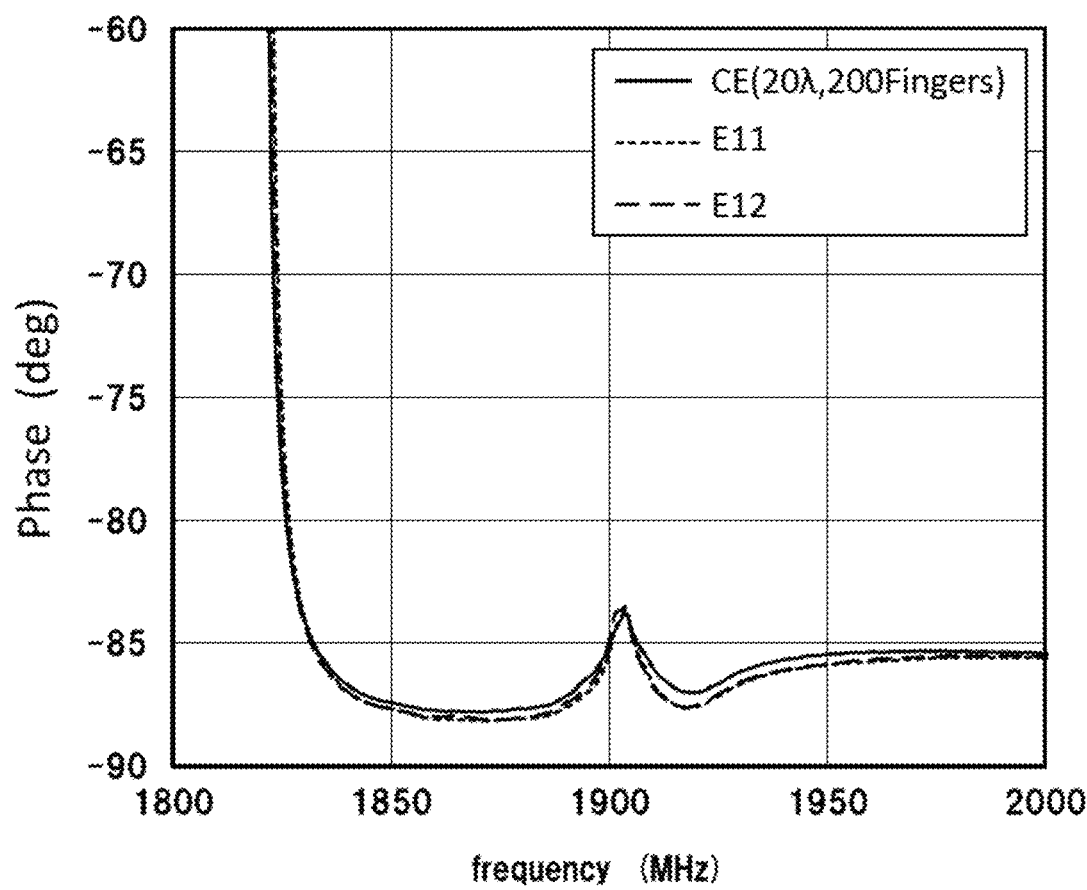
FIG. 16C A graph for comparing the phase characteristics of impedances of examples and a comparative example.

The results of measurement of the frequency characteristics in the comparative example and Examples 11 and 12 will be shown in FIG. 15A, FIG. 15B, and FIG. 16A to FIG. 16C. In FIG. 15A, the abscissa indicates the frequency (MHz), and the ordinate indicates the impedance. In FIG. 15B and FIG. 16A to FIG. 16C, the abscissas indicate the frequencies (MHz), and the ordinates indicate the phases (deg) of impedances. Further, FIG. 16A shows the frequency characteristics of the phases of the impedances in the vicinity of the resonance frequency, FIG. 16B shows the same between the resonance frequency and the antiresonance frequency, and FIG. 16C shows the same in the vicinity of the antiresonance frequency.

In all examples, it was confirmed that there was no large disturbance in the impedance characteristics between the resonance frequency and the antiresonance frequency, therefore they functioned as resonators. Further, in all examples, it could be confirmed that the loss in a range from the vicinity of the antiresonance frequency to a higher frequency side than the antiresonance frequency was reduced in a broad range (FIG. 16C). Further, it was confirmed in Examples 11 and 12 that ripple on the low band side of the resonance frequency could be suppressed, and also loss in the vicinity of the resonance frequency could be reduced (FIG. 16A). On the other hand, it was confirmed that there was a little influence upon the loss on a higher frequency side than the resonance frequency (FIG. 16B).

<Confirmation According to Simulation>

Next, in order to study in more detail the concrete configuration of the end part $3b$, simulations according to a COM (coupled mode) method and finite element method (FEM) were carried out. Preceding the concrete study, the data of simulations carried out by preparing models by using the design parameters in the comparative example and Examples 1 to 10 explained above and measurement data were compared. It was confirmed that the two coincided well.

Next, taking the configuration of the SAW element 1 as an example, simulation was carried out for Model 1 to Model 8 made different in the numbers of the electrode fingers 32 in the first parts $3b1$ and in the second parts $3b2$ (equally divided models: Models 1 to 4, asymmetrically divided models: Models 5 to 8), and for the reference model of the model of the SAW element in the comparative example. The design parameters and simulation results of the models will be shown in Table 1.

TABLE 1

| Model No. | | Number of electrode fingers | | First effect | Second effect | Third effect |
|---|---|---|---|---|---|---|
| | | First part | Second part | | | |
| 1 | Equally divided | 6 | 6 | Good | — | Good |
| 2 | | 8 | 8 | Good | Good | Good |
| 3 | | 10 | 10 | Good | Good | — |
| 4 | | 12 | 12 | Good | — | Poor |
| 5 | Asymmetrically divided | 10 | 14 | Good | Good | Good |
| 6 | | 8 | 16 | Good | Poor | |
| 7 | | 12 | 16 | Good | Good | |
| 8 | | 10 | 18 | Good | Good | Poor |

In Table 1, the performances of the models are displayed classifying them into three effects. That is, the first effect is the reduction of loss on the higher frequency side from the vicinity of the antiresonance frequency, the second effect is suppression of ripple and reduction of loss on the lower frequency side from the vicinity of the resonance frequency, and the third effect is the suppression of loss in the vicinity of the higher frequency side of the resonance frequency. In Table, relative to the comparative example, a case where the effect could be confirmed is displayed as "Good", a case where there was no difference is displayed as "–", and a case where there was no effect is displayed as "Poor".

As confirmed, there was the first effect in comparison with the reference in all of Models 1 to 8. That is, it was confirmed that the first effect was exhibited by providing an end part $3b$. Note that, the first effect tended to be improved more as the number of the electrode fingers configuring the end part $3b$ was larger. When considering the measurement values and the simulation results, from the viewpoint of the first effect, it is estimated that 10 or more fingers is preferred as the number of electrode fingers 32 configuring the end part $3b$. When equally dividing the model, a combination where each of the first end part $3b1$ and second end part $3b2$ has six or more fingers is preferred.

Next, the third effect will be verified. In an equally divided model, there is a tendency that the third effect is exhibited if the number of the electrode fingers 32 configuring the end part $3b$ is small. Specifically, there is a tendency of degradation if the number of each of the first part $3b1$ and second part $3b2$ is 12 or more. There is a little influence even if the number of each is 10. On the other hand, ones having number of six or eight (Models 1 and 2) conversely become better than the reference. When considering the measurement values and the simulation results, from the viewpoint of the third effect, in the case of equal division, a combination where each of the first end parts $3b1$ and the end parts $3b2$ has 12 or less fingers is preferred.

In an asymmetrically divided model, more complexly, the effect was not determined only by the total number of the electrode fingers 32 configuring an end part $3b$. There was a tendency that the effect was exhibited at the time when the difference of the numbers of the electrode fingers configuring the first part $3b1$ and the second part $3b2$ was small. When considering the measurement values and the simulation results, from the viewpoint of the third effect, in the case of asymmetric division, a combination where the difference of the numbers of the electrode fingers 32 configuring the first part $3b1$ and the second part $3b2$ is six or less is preferred.

Next, the second effect will be verified. In an equally divided model, the effect is exhibited at the time when the numbers of fingers at the first part $3b1$ and the second part $3b2$ are six to 10. In particular, the effects of Models 2 and 3 having the eight and 10 numbers of fingers are high. However, when considering the second effect, the configuration of Model 2 in which the numbers of the electrode fingers 32 configuring the first part $3b1$ and the second part $3b2$ are eight may most highly exert the second effect and third effect.

In the asymmetrically divided model, more complexly, it was confirmed that the effect was not determined only by the total number of the electrode fingers 32 configuring the end part $3b$ and by the numbers of the electrode fingers 32 configuring the first part $3b1$ and the second part $3b2$ and that Model 5 (10/14) exhibited the second effect. Model 5 is the model in which the best effect can be expected among all of the models also from the viewpoint of the third effect. Note that, in Model 8, it seems at a glance that the second effect is exhibited. However, a large ripple is generated in the vicinity of the high frequency side of the resonance frequency, therefore it is believed that the ripple was not suppressed, but the position of the ripple shifted and the magnitude thereof became larger.

From the above description, in the SAW element 1, preferably the number of the electrode fingers 32 configuring one end part $3b$ is 10 to 30. In the case of the equal division, preferably the number of fingers of each portion is six to 10, more preferably eight or 10. In particular, at the time of eight fingers, it could be confirmed that all of the effects from the first effect to the third effect were highly exhibited. On the other hand, in the case of asymmetric division, the end part may be divided so that the difference of the parts becomes six or less. In particular, at the time when the numbers of fingers of the first part 3b1 and the second part 3b2 were made 10 and 14, it could be confirmed that all of the effects from the first effect to the third effect were highly exhibited.

Next, using the configuration of the SAW element 1A as an example, simulation was carried out for Model 9 to Model 14 in which the numbers of the electrode fingers 32 in the first part 3b1, second part 3b2, and third part 3b3 were made different (equally divided models: Model 9 to 11, asymmetrically divided models: Models 12 to 14) and for the reference model of the model of the SAW element in the comparative example. The design parameters and simulation results of the models will be shown in Table 2. In the table, relative to the comparative example, the case where the effect could be confirmed is displayed as "Good", the case where there was no difference is displayed as "–", and the case where there was no effect is displayed as "Poor"

TABLE 2

| Model No. | | Number of electrode fingers | | | First effect | Second effect | Third effect |
|---|---|---|---|---|---|---|---|
| | | First part | Second part | Third part | | | |
| 9 | Equally | 4 | 4 | 4 | Good | — | — |
| 10 | divided | 6 | 6 | 6 | Good | Good | — |
| 11 | | 8 | 8 | 8 | Good | Poor | — |
| 12 | Asymmet- | 6 | 8 | 10 | Good | — | — |
| 13 | rically | 5 | 8 | 11 | Good | Good | Poor |
| 14 | divided | 4 | 8 | 12 | Good | — | — |

It was confirmed in all of Models 9 to 15 that there was the first effect in comparison with the reference. Note that, the first effect tended to be improved more as the number of the electrode fingers configuring the end part 3b became larger. When considering the measurement values and simulation results, it is estimated that, from the viewpoint of the first effect, preferably the total number of the electrode fingers 32 configuring the end part 3b is 10 or more. When equally dividing a model, a combination where each of the first part 3b1, second part 3b2, and third part 3b3 has four or more electrodes is preferred.

Next, the third effect will be verified. In the equally divided model, the effect tends to be degraded when the number of the electrode fingers 32 configuring the end part 3b is large. When considering the measurement values and simulation results, from the viewpoint of the third effect, the numbers of fingers of the first part 3b1, second part 3b2, and third part 3b3 may be set at eight or less.

Next, the second effect will be verified. In an equally divided model, it was confirmed that the effect was exhibited at the time when the numbers of fingers of the first part 3b1, second part 3b2, and third part 3b3 were four or six and that ripple became almost zero in particular when the numbers were six.

In an asymmetrically divided model, no remarkable effect could be confirmed in the second effect in any configuration. However, it was confirmed that Model 13 exhibited the effect a little. In actuality, simulation was carried out while further increasing the number, but no tendency of improvement was confirmed when focusing on only the second effect.

From the above description, in the configuration of the SAW element 1A, if the first part 3b1 to the third part 3b3 are equally divided, all of the first effect to the third effect can be expected. In particular, the numbers of fingers thereof are preferably set to four or six for each.

Further, if the pitches of the electrode fingers 32 in the first part 3b1 to the third part 3b3 are multiplied by 1.001 to 1.003 in comparison with the major part 3a, the first effect further rises.

Figure 17A:
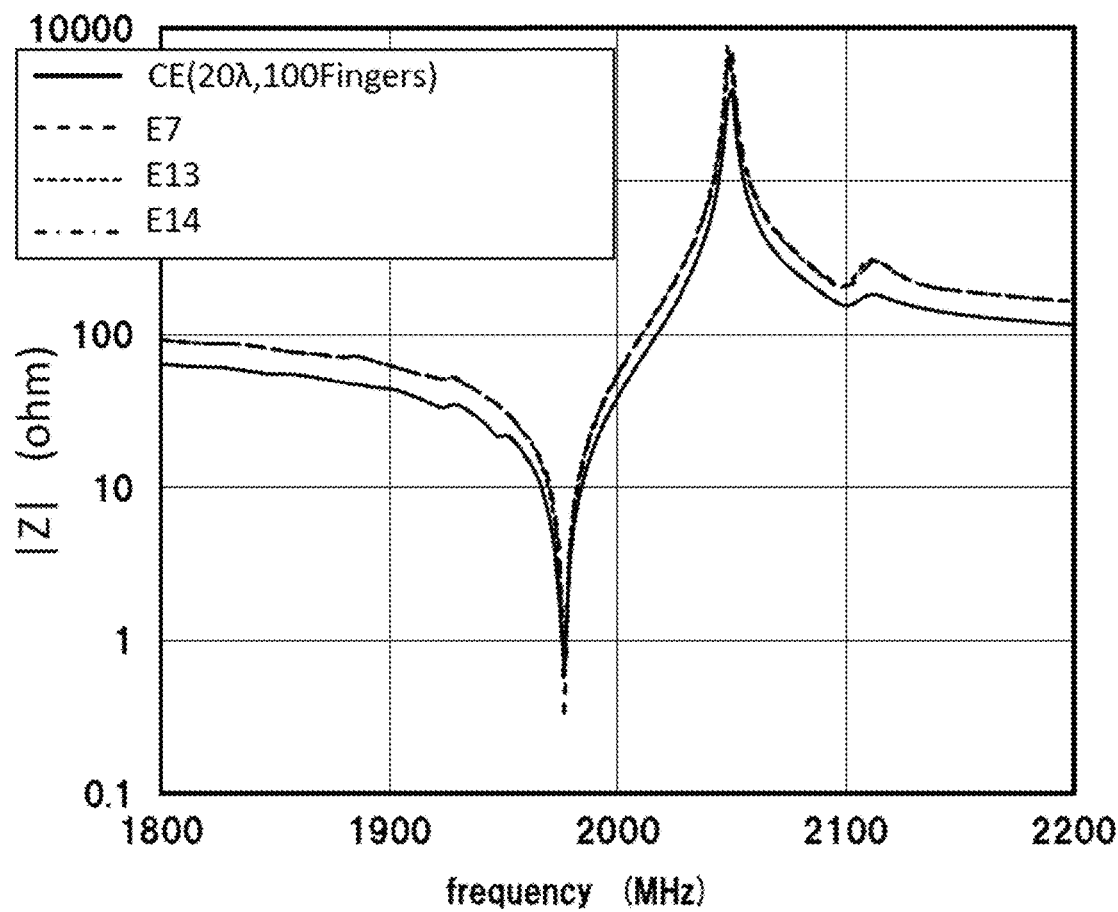
FIG. 17A A graph for comparing the frequency characteristics of impedances of models according to examples and a model according to a comparative example.
Figure 17B:
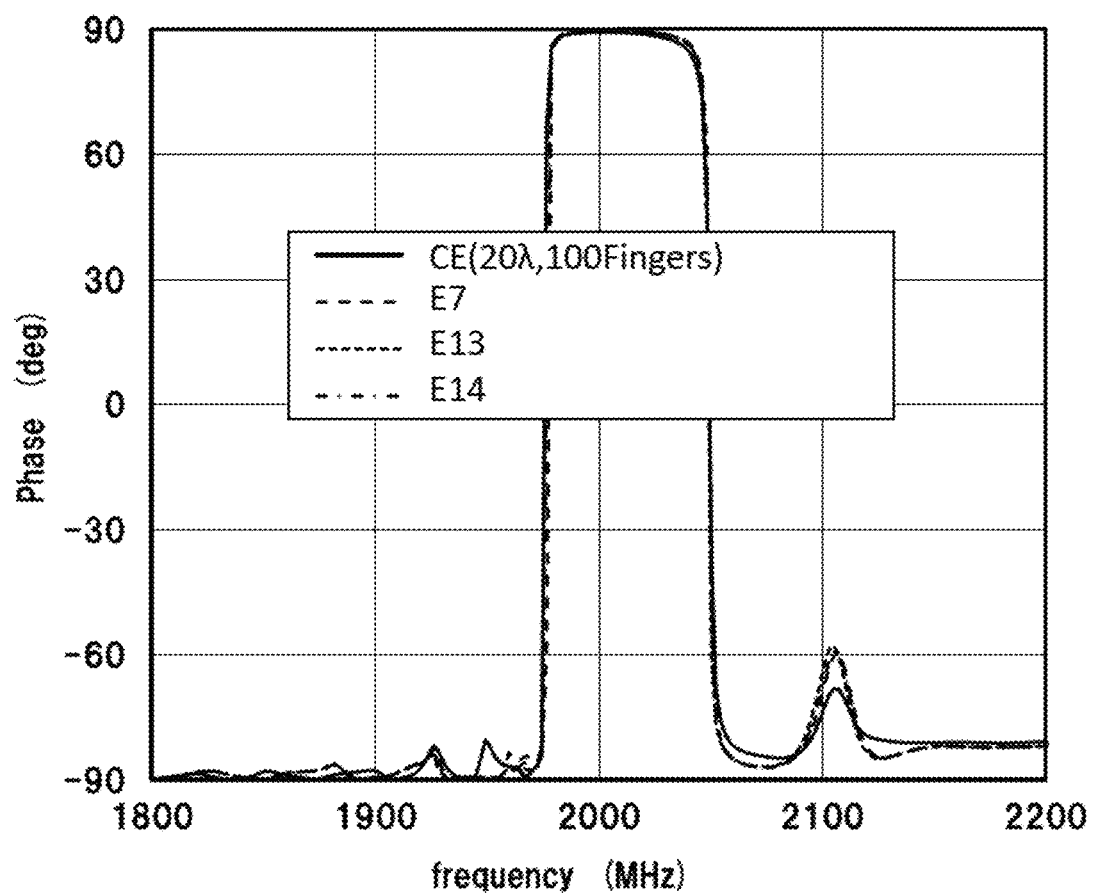
FIG. 17B A graph for comparing the phase characteristics of impedances of models according to examples and a model according to a comparative example.
Figure 17C:
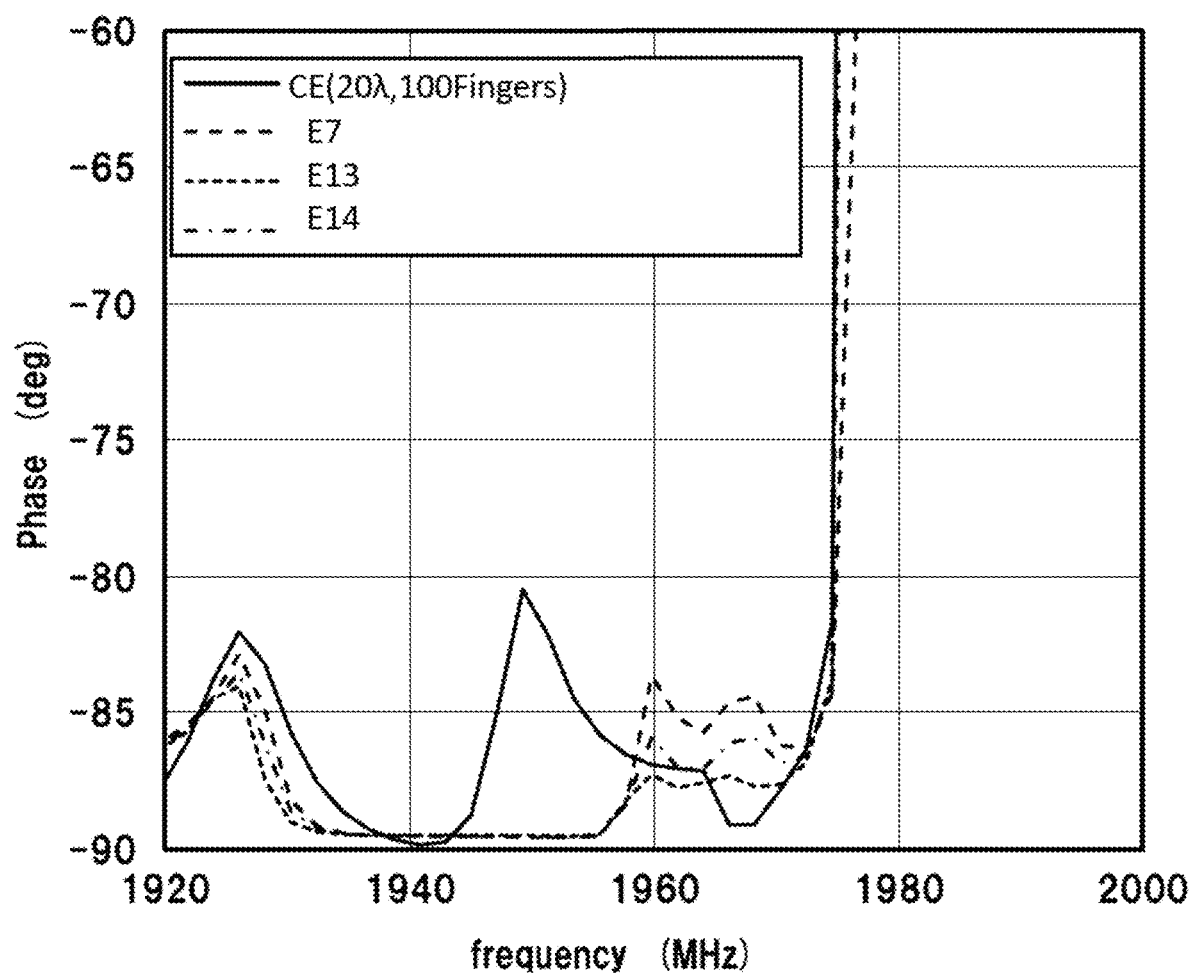
FIG. 17C A graph for comparing the phase characteristics of impedances of models according to examples and a model according to a comparative example.
Figure 17D:
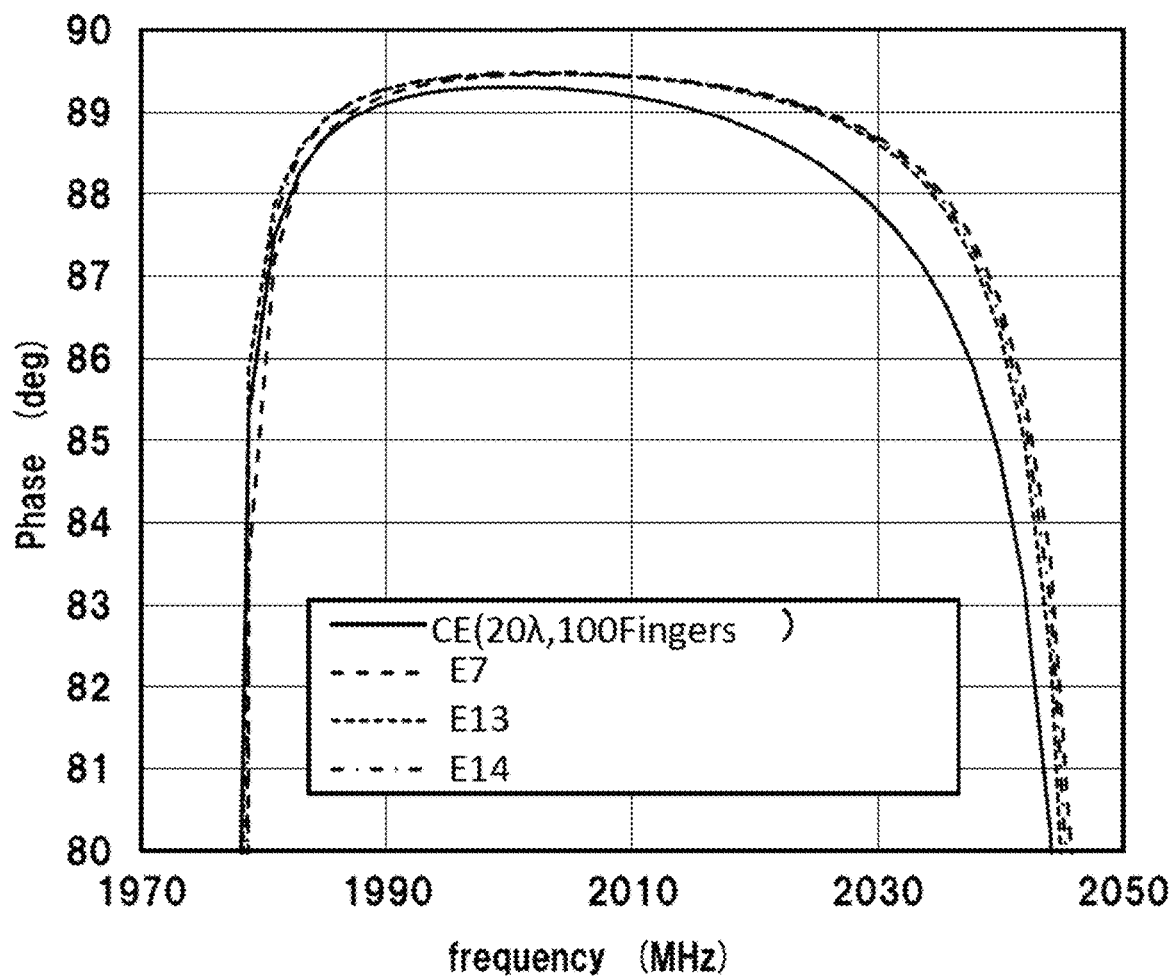
FIG. 17D A graph for comparing the phase characteristics of impedances of models according to examples and a model according to a comparative example.
Figure 17E:
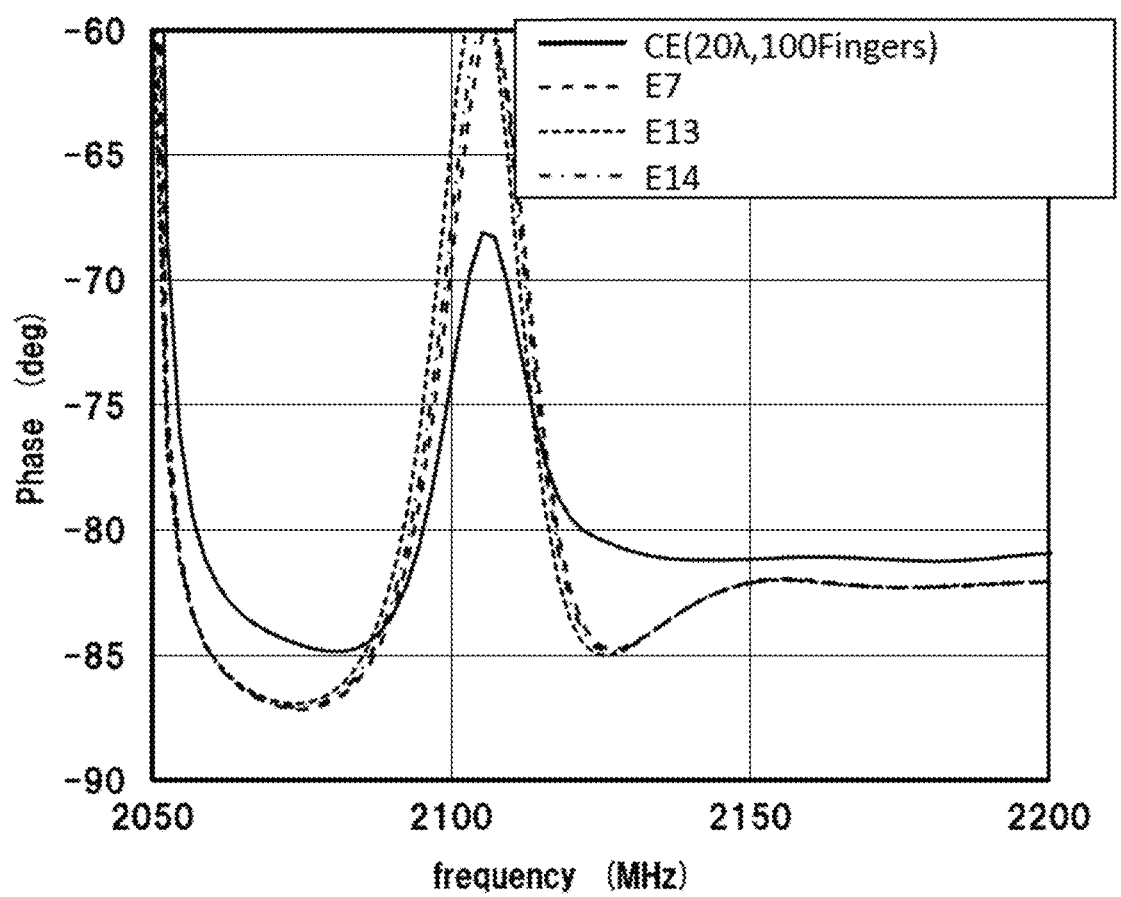
FIG. 17E A graph for comparing the phase characteristics of impedances of models according to examples and a model according to a comparative example.

FIG. 17A to FIG. 17E show the FEM simulation results of the frequency characteristics in the comparative example and Example 7, in Example 13 in which the pitch in the end part 3b in Example 7 was multiplied by 1.002, and in Example 14 in which the pitch was multiplied by 1.002 only in the first part 3b1. In FIG. 17A to FIG. 17E, the abscissas indicate the frequencies (MHz). In FIG. 17A, the ordinate indicates the impedance, while in FIG. 17B to FIG. 17E, the ordinates indicate the phases of impedances. FIG. 17C to FIG. 17E are graphs enlarging a portion in FIG. 17B, in which FIG. 17C shows the phase in the vicinity of the resonance frequency, FIG. 17D shows the phase between the resonance frequency and the antiresonance frequency, and FIG. 17E shows the phase in the vicinity of the antiresonance frequency. As confirmed from these graphs, the first effect can be raised by adjusting the pitches.

Figure 18A:
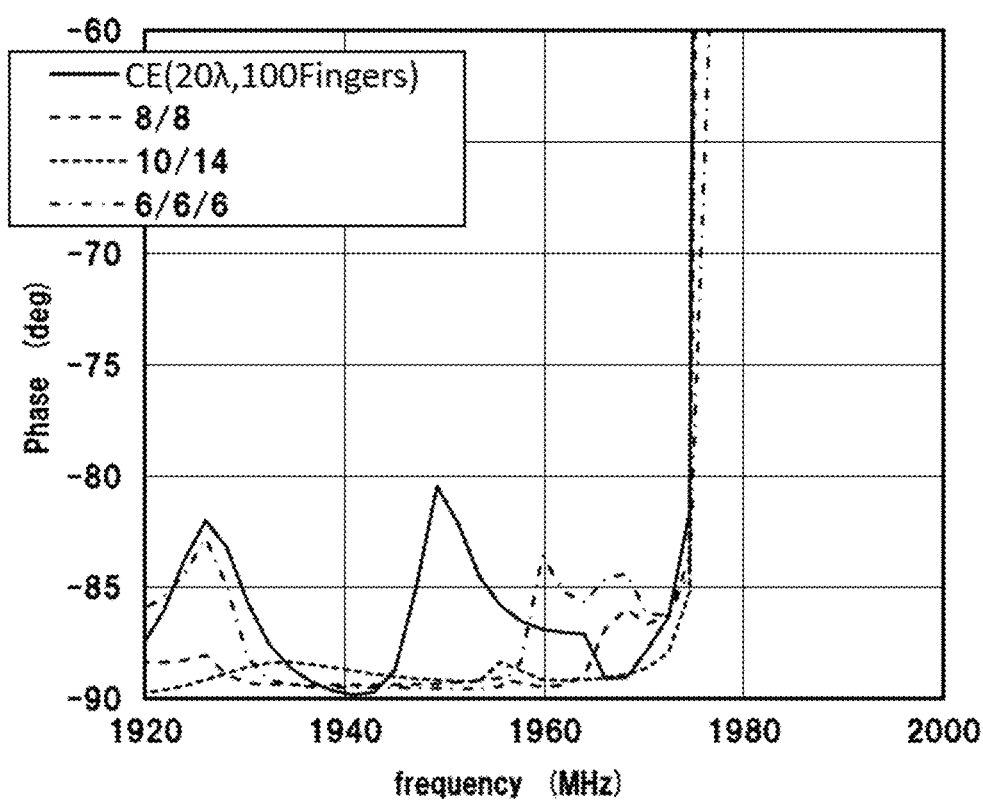
FIG. 18A A graph for comparing the phase characteristics of impedances of models according to examples and a model according to a comparative example.
Figure 18B:
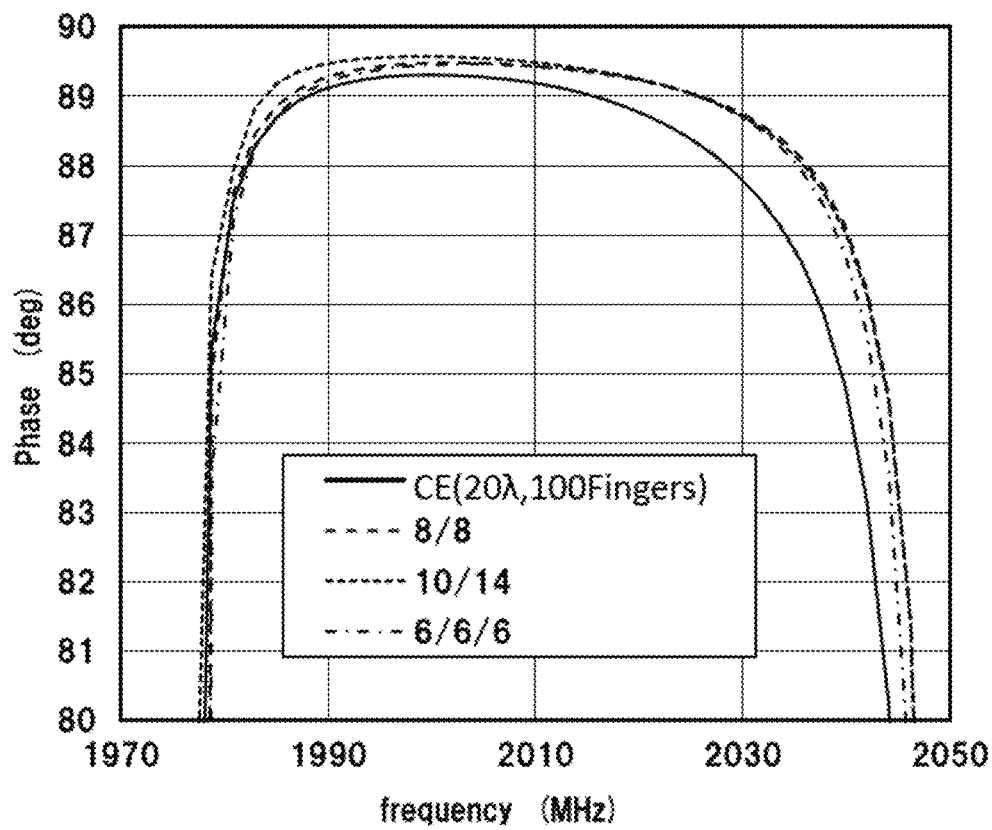
FIG. 18B A graph for comparing the phase characteristics of impedances of models according to examples and a model according to a comparative example.
Figure 18C:
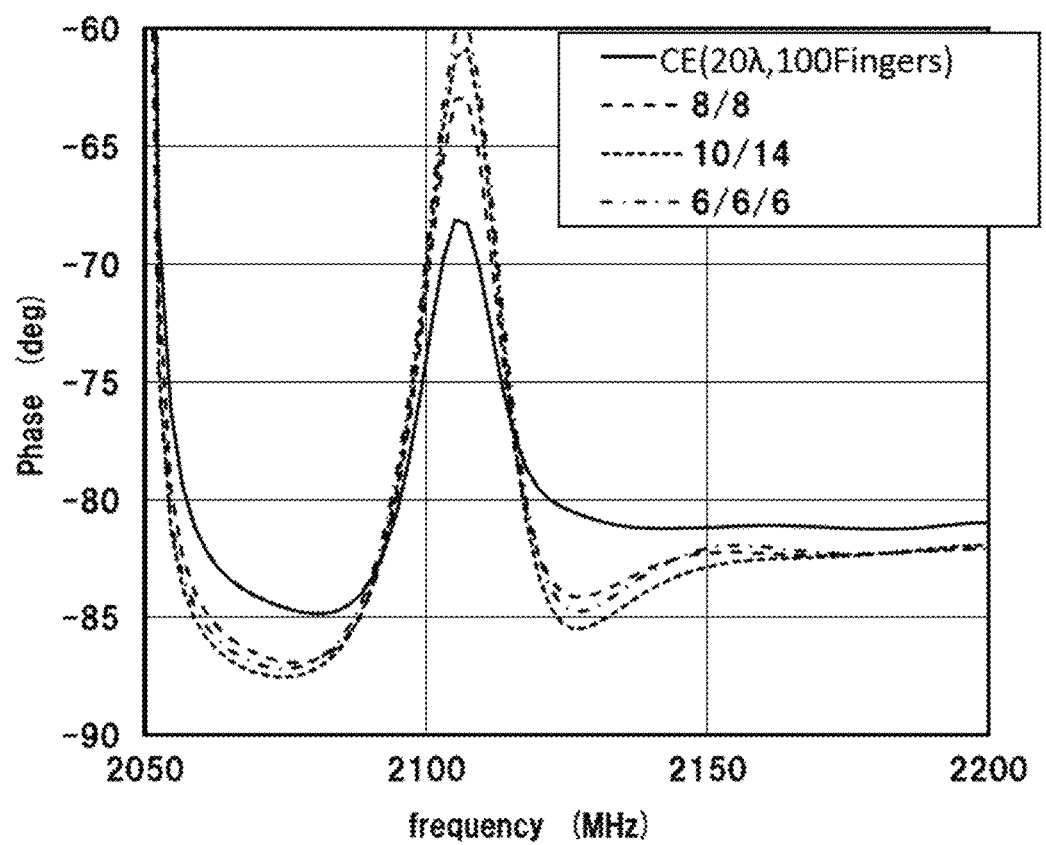
FIG. 18C A graph for comparing the phase characteristics of impedances of models according to examples and a model according to a comparative example.

FIG. 18A to FIG. 18C show the FEM simulation results of the phase characteristics of the impedances in the reference model and Models 2, 5, and 10. In FIG. 18A to FIG. 18C, the abscissas indicate the frequencies (MHz), and the ordinates indicate the phases (deg) of impedances, in which FIG. 18A shows the frequency characteristics in the vicinity of the resonance frequency, FIG. 18B shows the same between the resonance frequency and the antiresonance frequency, and FIG. 18C shows the same on the higher frequency side from the vicinity of the antiresonance frequency. As apparent from FIG. 18A to FIG. 18C, it could be confirmed that each model showed excellent characteristics in all frequency domains in comparison with the reference model.

Figure 19A:
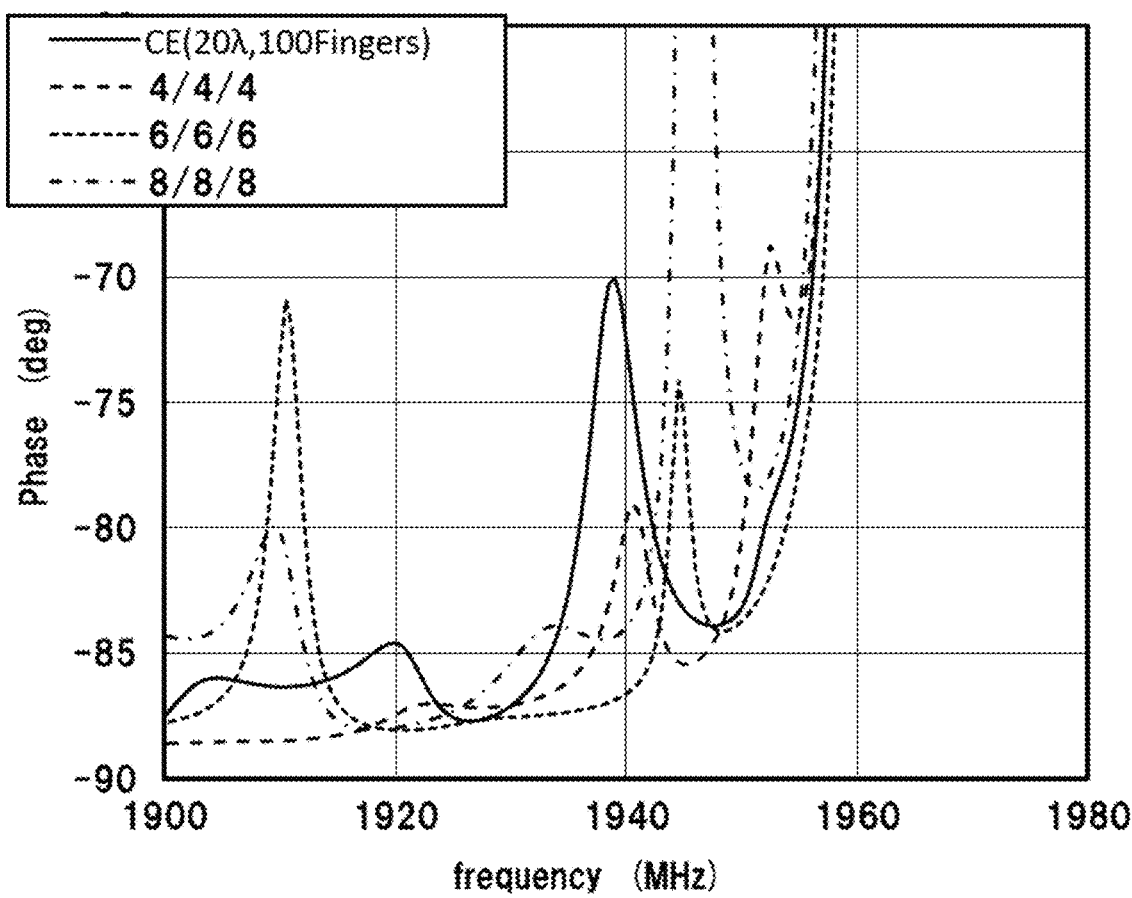
FIG. 19A A graph for comparing the phase characteristics of impedances of models according to examples and comparative example when making the total number of electrode fingers 32 in an IDT electrode 3 different.
Figure 19B:
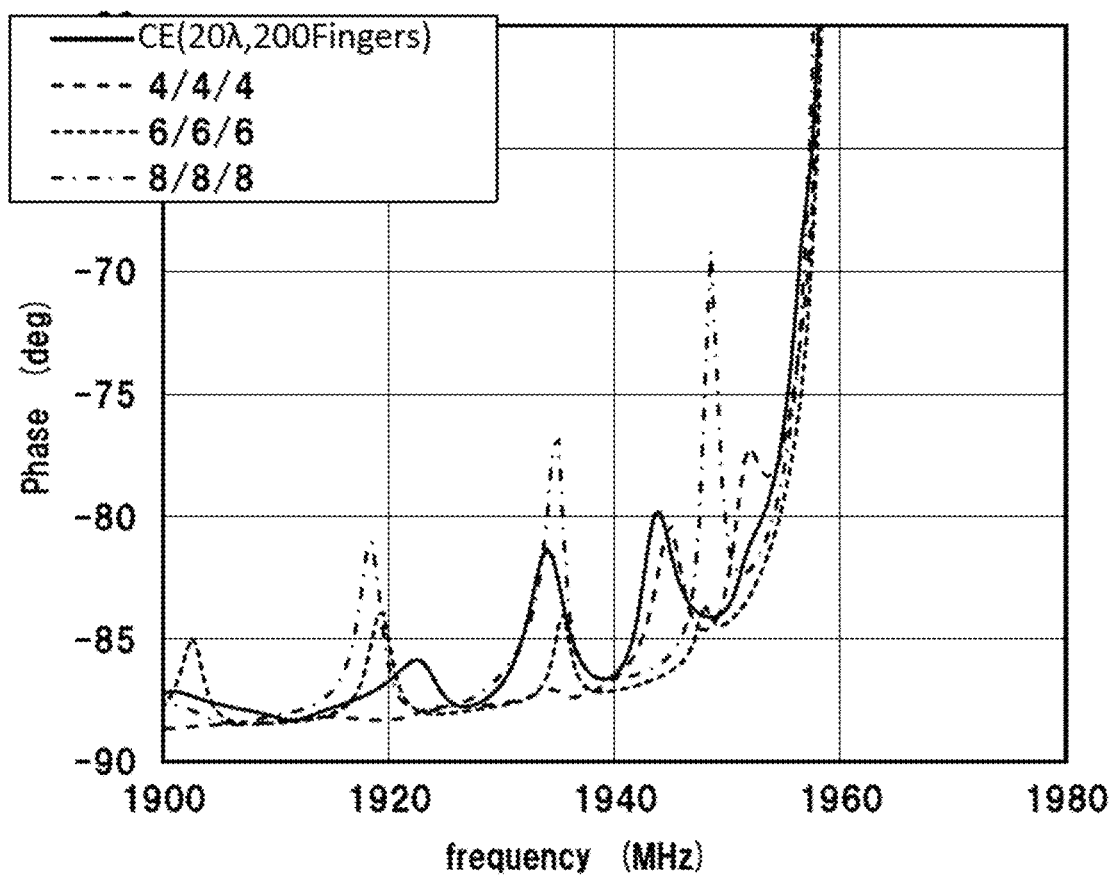
FIG. 19B A graph for comparing the phase characteristics of impedances of models according to examples and comparative example when making the total number of electrode fingers 32 in an IDT electrode 3 different.
Figure 19C:
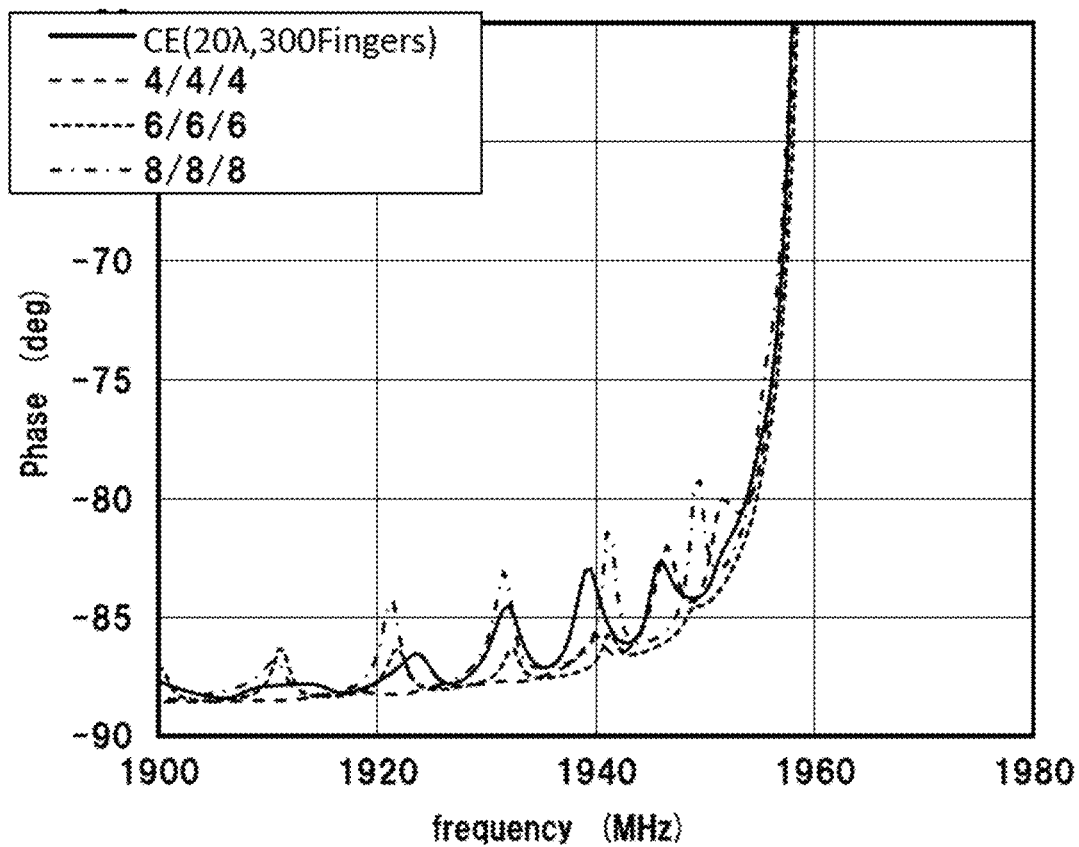
FIG. 19C A graph for comparing the phase characteristics of impedances of models according to examples and comparative example when making the total number of electrode fingers 32 in an IDT electrode 3 different.

Simulation was carried out for the influence in a case where the numbers of the electrode fingers in the end parts 3b were the same in Models 1 to 14 explained above and the reference model, but the total numbers of the electrode fingers 32 in the IDT electrodes 3 were made different. Specifically, the total numbers in the IDT electrodes 3 were set to 100, 200, and 300. In all models, even if the total numbers of the electrode fingers 32 in the IDT electrodes 3 were made different, the tendency of the effects due to the difference of configurations of the end parts 3b were the same. That is, the tendencies of appearances of the effect according to the end part 3b and the first effect to the third effect according to the concrete configurations of the end parts 3b (combination of the numbers of electrode fingers) were the same. It was seen from this that, in any IDT electrode 3 having any number of electrode fingers 32, the preferred combination of numbers of fingers of the end parts 3b was the same. FIG. 19A to FIG. 19C show the simulation results by the COM method in a case where, in the configurations of the end parts in Models 1 to 4, the total numbers of the electrode fingers 32 in the IDT electrodes 3 were made different. Specifically, the case where the total number of the electrode fingers in the IDT electrode 3 is 100 is shown in FIG. 19A, the case where the number is 200 is shown in FIG. 19B, and the case where the number is 300 is shown in FIG. 19C. As apparent also from FIG. 19, in any IDT electrode 3 having any number of electrode fingers 32, the model most highly exhibiting the second effect was Model 2. Further, when actually manufacturing the elements and measuring them, the same tendency as the simulation could be confirmed.

The same results were confirmed for a case where the crystal cut angle of the piezoelectric substrate 2 was made different. Specifically, as a result of simulation for a case where the cut angle was made 46°, the same results as those in the case of the cut angle of 42° were obtained for the tendencies of appearances of the effect according to the end part 3b and the first effect to the third effect according to the concrete configurations of the end parts 3b (combination of the numbers of electrode fingers). Further, the same results were confirmed even in a configuration making the piezoelectric substrate 2 thinner and bonding a support substrate to the back surface thereof. Specifically, as a result of simulation for a case where a composite substrate obtained by bonding a substrate of Si single crystal to the back surface of the piezoelectric substrate 2 was formed and the thickness of the piezoelectric substrate 2 was made to 10λ and 20λ, the same tendency as that in the case where a usual thick substrate was used was obtained. Due to this, it could be confirmed that the effects of the present invention were exhibited also in a case where the SAW element is prepared by using a composite substrate in order to improve the temperature characteristic. Further, when actually manufacturing the elements and measuring them, the same tendency as the simulation could be confirmed.

Further, the same results were obtained also for a case where the pitch of the electrode fingers 32 was made different.

It was confirmed from the above description that, without depending upon the thickness of the piezoelectric substrate, crystal angle, number of electrode fingers in the IDT electrode, and frequency, the first effect to third effect could be obtained according to the end part 3b, and the tendencies of strength or weakness of the first effect to third effect due to the combination of specific numbers of electrode fingers 32 configuring the end parts 3b were the same.

Further, the same tendency is shown also for the case where the piezoelectric substrate 2 is made thinner and it is arranged on a support substrate, therefore it was confirmed that the first effect to the third effect could be obtained due to the end parts 3b without depending upon the substrate configuration.

OTHER EMBODIMENTS

Figure 22A:
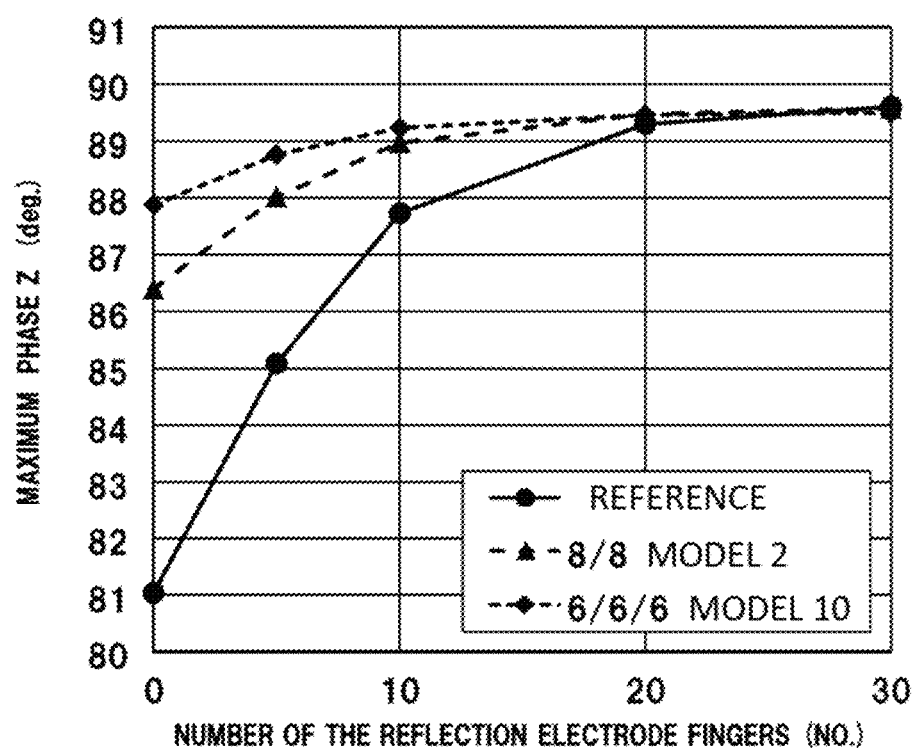
FIG. 22A A graph showing a maximum phase of a resonator when making a number of reflection electrode fingers different.
Figure 22B:
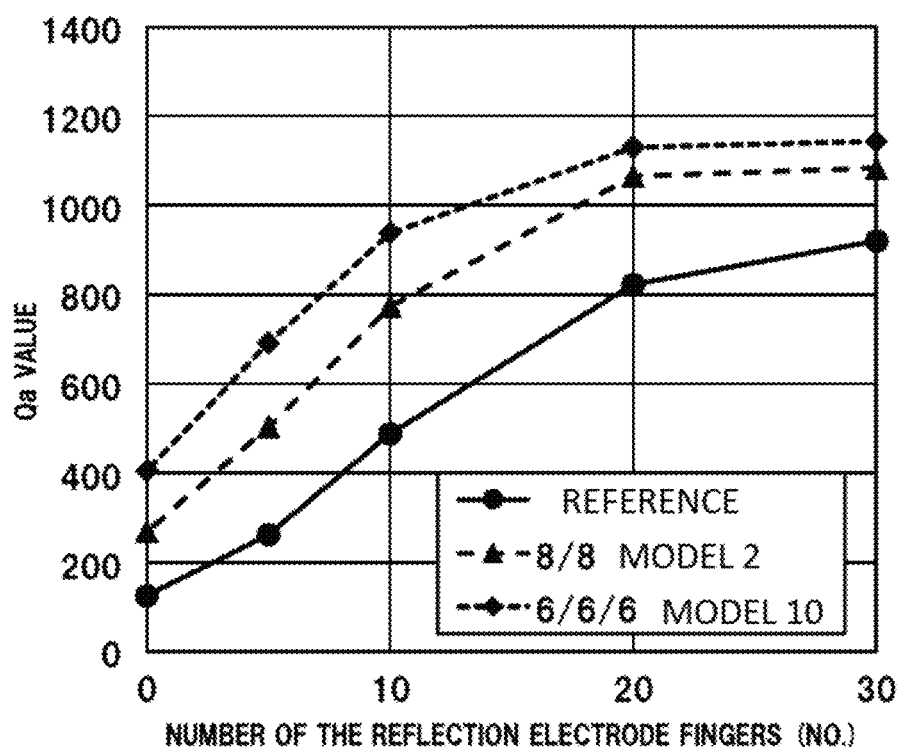
FIG. 22B A graph showing electrical characteristics of a resonator when making a number of reflection electrode fingers different.

In each of the models explained above, the number of the reflection electrode fingers 42 was made a constant 30. This number is the number required in a case of a usual SAW resonator which does not have an end part 3b. However, when it has the end part 3b, the number of reflection electrode fingers 42 may be decreased. This is because, by providing the end part 3b, the vibration of the IDT end part becomes weaker, therefore vibration leaked to the reflector electrode 4 side becomes smaller. In other words, this is because the end part 3b is an electrode exciting the SAW and, at the same time, operates as a reflector electrode 4 reflecting strong vibration of the major part 3a. In the configurations of the usual SAW resonator (reference model), Model 2, and Model 10, the change of the Q value (Qa) in the antiresonance frequency and the change of the maximum value of the phase of the impedance (maximum phase Z) when changing the number of the reflection electrode fingers 42 were simulated by the FEM (finite element method). The results are shown in FIG. 22A and FIG. 22B. Note that, Qa reflects the loss in the vicinity of the antiresonance frequency (the larger the Qa, the smaller the loss), and the maximum phase reflects the loss in the vicinity of the intermediate part between the resonance frequency and the antiresonance frequency (the closer the maximum phase to 90°, the smaller the loss).

FIG. 22A shows the relationships between the number of the reflection electrode fingers 42 and the maximum phase, in which the abscissa indicates the number of the reflection electrode fingers 42, and the ordinate indicates the maximum phase Z (unit: degree). FIG. 22B shows the relationships between the number of the reflection electrode fingers 42 and Qa, in which the abscissa indicates the number of the reflection electrode fingers 42, and the ordinate indicates Qa (unit: –).

As apparent also from FIG. 22A, it could be confirmed that, in comparison with the reference model, in the configurations of Model 2 and Model 10, the change of the maximum phase value due to the change of the number of the reflection electrode fingers 42 was small and there was no change in characteristics even when the number was set to ⅔ time, that is, 20 fingers.

Further, as apparent also from FIG. 22B, for the value of Qa, it was confirmed that the Q value could be raised in Model 2 and Model 10 in comparison with the reference model when the numbers of the reflection electrode fingers 42 were the same. Further, in Model 2 and Model 10, even if the numbers of the reflection electrode fingers 42 were made ½ time, that is, 15 fingers, it was confirmed that a Q value which was equal or more in level to the case where the number of the reflection electrode fingers 42 was made 30 in the reference model could be obtained. In particular, in Model 10 having a large number of divided parts, even if the number of fingers was made ⅓ time, that is, 10 fingers, it was confirmed that a Q value which was equal or more in level to the case where the number of the reflection electrode fingers 42 was made 30 in the reference model could be obtained.

As apparent from this, in a SAW element 1 provided with an end part 3b, a drop of the Q value can be suppressed even if the number of the reflection electrode fingers 42 is made smaller than the usual number believed necessary. In particular, by making the number of the reflection electrode fingers 42 15 to 20, the characteristics of the two of the maximum phase value and Qa value can be maintained, while the SAW element 1 can be made smaller in size. Further, where the end part 3b is divided into three parts, even if the numbers of fingers are made 10 to 15, the characteristics of the Qa value can be maintained.

Note that, since the SAW element 1 is provided with the end part 3b, it has a value of capacity reduced in comparison with the usual SAW resonator in which the number of the electrode fingers 32 is the same as that of the major part 3a and end parts 3b together. Here, in the SAW element 1, when the number of the electrode fingers 32 in the major part 3a is increased to realize the same capacity value, the size of the IDT electrode 3 becomes larger in comparison with the usual SAW resonator. Contrary to this, by decreasing the number of the reflection electrode fingers 42, a space corresponding to the amount of increase of the number of the electrode fingers 32 in the major part 3a can be cut, therefore the increase of the size can be suppressed in the SAW element 1 as a whole.

Specifically, when the end part 3b is configured as in Model 10 in the case where the number of the electrode fingers 32 in the IDT electrode 3 is 200, in comparison with the case of the usual SAW resonator in which the number of electrode fingers is 200, the capacity becomes smaller by the amount of 32 fingers. If adding 32 fingers to the number of the electrode fingers 32 in the major part 3b in order to make up for this, the size of the IDT electrode 3 is enlarged by 15%. Contrary to this, by making the number of the reflection electrode fingers 42 in each reflector 4 positioned on the two sides of the IDT electrode 3 ½ time, that is, 15 fingers, a space corresponding to 30 fingers can be reduced, therefore the increase of the area can be suppressed in the SAW element 1 as a whole. Further, by making the number of the reflection electrode fingers 42 ⅓ time, that is, 10 fingers, a space corresponding to 40 fingers can be reduced, therefore the SAW element 1 as a whole can be made smaller in size than the usual resonator.

Note that, it could be confirmed from the simulation results explained above that, in the SAW element 1 provided with the end part 3b, by providing the usual number of reflection electrode fingers 42, the Qa value could be raised, therefore an SAW element 1 excellent in the electrical characteristics could be provided as well.

<Filter Element and Communication Apparatus>

Figure 20:
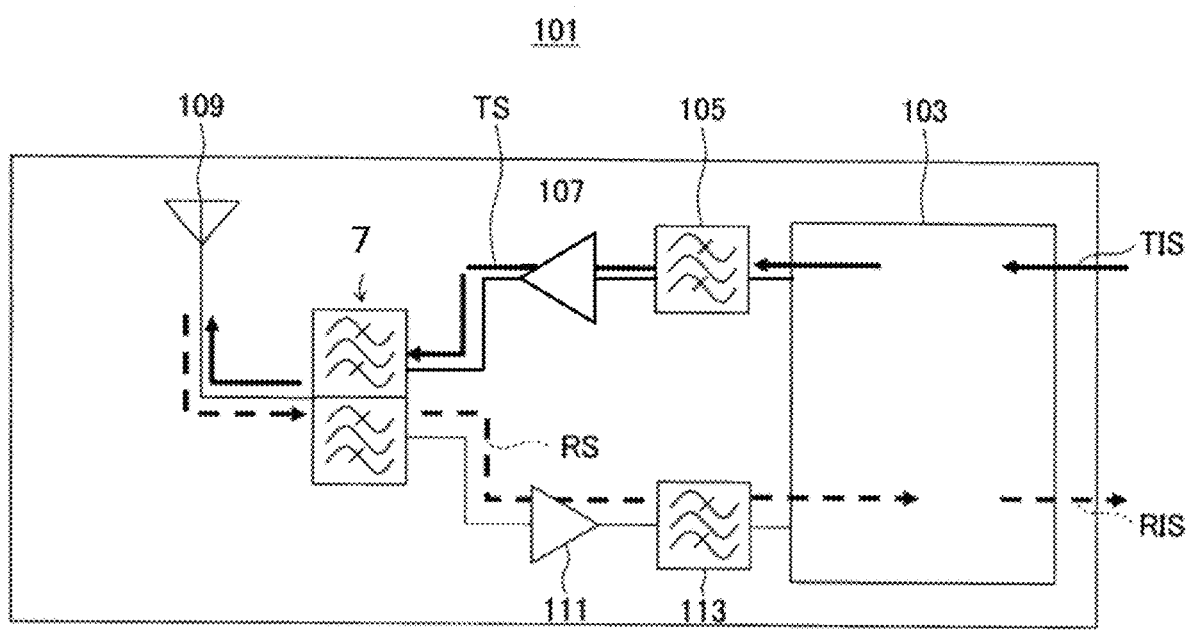
FIG. 20 A schematic view of a communication apparatus.

FIG. 20 is a block diagram showing a principal part of a communication apparatus 101 according to an embodiment of the present invention. The communication apparatus 101 performs wireless communications utilizing radio waves. A duplexer 7 has a function of branching a signal having a transmission frequency and a signal having a reception frequency in the communication apparatus 101.

In the communication apparatus 101, a TIS (transmission information signal) containing information to be transmitted is modulated and raised in frequency (conversion to a high frequency signal having a carrier frequency) by the RF-IC 103 to become the TS (transmission signal). The TS is stripped of unwanted components other than the transmission-use passing band by a bandpass filter 105, amplified by an amplifier 107, and input to the duplexer 7. In the amplified TS, sometimes noise is mixed due to passing through the amplifier 107. The duplexer 7 strips the unwanted components (noise etc.) other than the transmission-use passing band from such input TS and outputs the result to the antenna 109. The antenna 109 converts the input electrical signal (TS) to a wireless signal and transmits the result.

In the communication apparatus 101, a wireless signal received by the antenna 109 is converted to an electrical signal (RS (reception signal)) by the antenna 109 and is input to the duplexer 7. The duplexer 7 strips the unwanted components other than reception-use passing band from the input RS and outputs the result to an amplifier 111. The output RS is amplified by the amplifier 111 and is stripped of the unwanted components other than the reception-use passing band by a bandpass filter 113. As the unwanted components which are removed by the bandpass filter 113, for example there can be mentioned noise mixed in due to the amplifier 111. Further, RS is lowered in frequency and demodulated by the RF-IC 103 to become the RIS (reception information signal).

TIS and RIS may be low frequency signals (baseband signals) containing suitable information. For example, they are analog audio signals or digitalized audio signals. The passing band of the wireless signal may be according to the UMTS (Universal Mobile Telecommunications System) or other various types of standards. The modulation scheme may be phase modulation, amplitude modulation, frequency modulation, or any combinations of any two or more selected from among them. Further, the functions of the bandpass filter 105 and the bandpass filter 113 may be imparted to the RF-IC 103 and these filters may be omitted.

Figure 21:
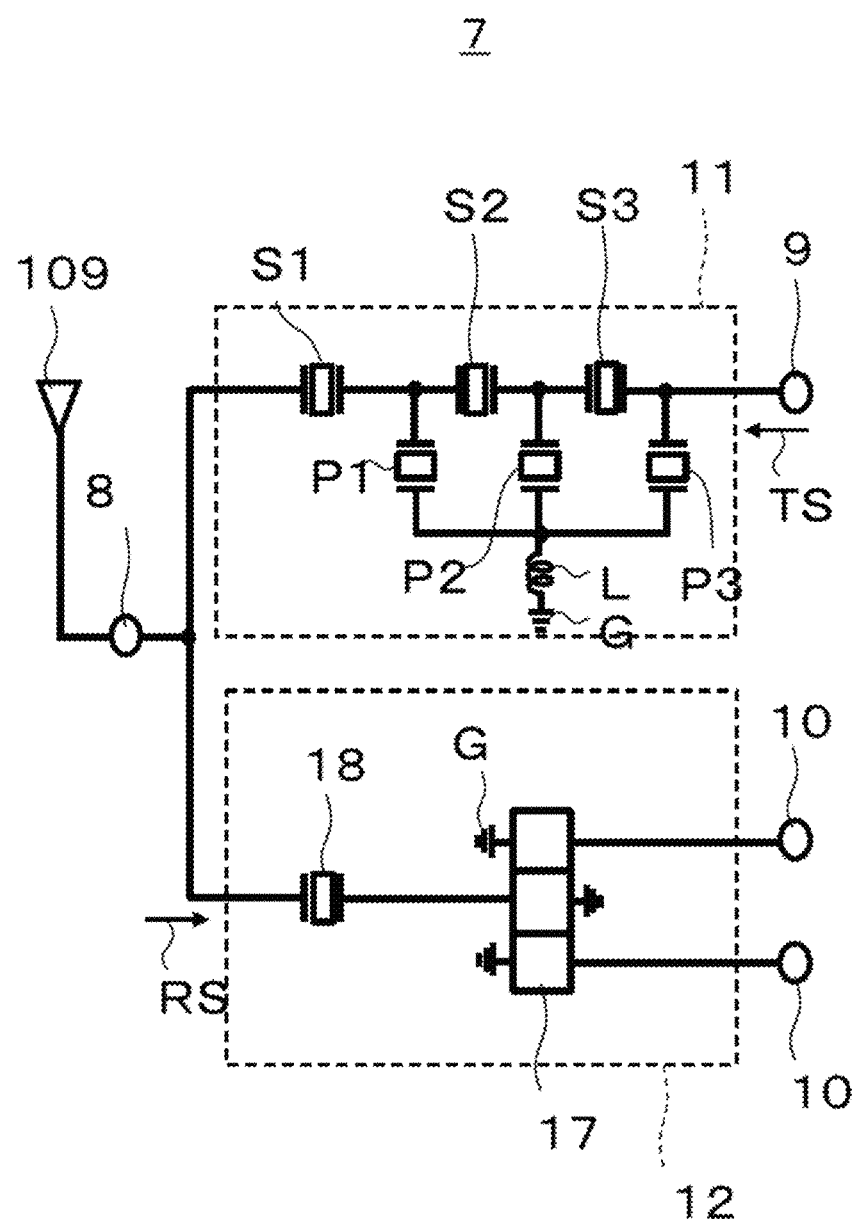
FIG. 21 A circuit diagram of a duplexer.

FIG. 21 is a circuit diagram showing the configuration of a duplexer 7 according to an embodiment of the present invention. The duplexer 7 is the duplexer which is used in the communication apparatus 101 in FIG. 20. The duplexer 7 has a SAW filter element which configures at least one of the transmission filter 11 as the first filter and the receiving filter 12 as the second filter. The SAW filter element configuring at least one of the transmission filter 11 and the receiving filter 12 has any of the SAW elements 1 to 1C. In this example, the SAW element 1 is employed.

The duplexer 7 is mainly configured by an antenna terminal 8, transmission terminal 9, reception terminals 10, a transmission filter 11 arranged between the antenna terminal 8 and the transmission terminal 9, and a receiving filter 12 arranged between the antenna terminal 8 and the reception terminals 10.

To the transmission terminal 9, the TS from the amplifier 107 is input. The TS input to the transmission terminal 9 is stripped of the unwanted components other than the transmission-use passing band in the transmission filter 11 and is output to the antenna terminal 8. Further, to the antenna terminal 8, the RS from the antenna 109 is input. It is stripped of the unwanted components other than the reception-use passing band in the receiving filter 12 and is output to the reception terminals 10.

The transmission filter 11 is configured by for example a ladder type SAW filter. Specifically, the transmission filter 11 has three serial arm resonators S1, S2, and S3 which are connected in series between the input side and the output side thereof and three parallel arm resonators P1, P2, and P3 which are provided between the serial arm of the line for connecting the serial arm resonators S1, S2, and S3 to each other and the reference potential part Gnd. That is, the transmission filter 11 is a ladder type filter of a 3-stage configuration. However, in the transmission filter 11, the number of stages of the ladder type filter may be any number of stages. Further, in the transmission filter 11, the transmission terminal 9 functions as the input terminal, and the antenna terminal 8 functions as the output terminal. Note that, when the receiving filter 12 is configured by a ladder type filter, the antenna terminal 8 functions as the input terminal, and the reception terminals 10 function as output terminals.

Between the parallel arm resonators P1, P2, and P3 and the reference potential part Gnd, sometimes an inductor L is provided. By setting the inductance of this inductor L to a predetermined magnitude, an attenuation pole is formed out of the bandwidth of the pass frequency of the transmission signal, and the attenuation out of the band is made larger. Each of the plurality of serial arm resonators S1, S2, and S3 and each of the plurality of parallel arm resonators P1, P2, and P3 is configured by a SAW resonator such as a SAW element 1.

The receiving filter 12 for example has a dual mode type SAW filter 17 and an auxiliary resonator 18 which is connected in series to the input side thereof. Note that, in the present embodiment, the "dual mode" includes a double mode. The dual mode type SAW filter 17 has a balance/unbalance conversion function. The receiving filter 12 is connected to the two reception terminals 10 to which the balanced signals are output. The receiving filter 12 is not limited to one configured by the dual mode type SAW filter 17 and may be configured by a ladder type filter or may be a filter which does not have the balance/unbalance conversion function.

Between the ground potential part Gnd and the connection point of the transmission filter 11, the receiving filter 12 and the antenna terminal 18, an impedance matching-use circuit configured by an inductor or the like may be inserted as well.

The SAW element 1 in the present embodiment may be used for any of the serial resonators S1 to S3, parallel arm resonators P1 to P3, and auxiliary resonator 18 as well. By using the SAW element 1 in at least one of the serial resonators S1 to S3, parallel arm resonators P1 to P3, and auxiliary resonator 18, a filter with a small loss can be configured. In the ladder type filter, the frequency on a bit higher frequency side than the anti-resonance of the parallel arm resonators corresponds to the end part on the high frequency side in the filter passing band. Therefore, in particular, in the case where the SAW element 1 in the present invention is used for the parallel arm resonators P1 to P3, according to the first effect, the loss on the high frequency side in the filter passing band can be reduced. Further, according to the third effect, the loss in the passing band of the filter can be reduced. Further, in the ladder type filter, the frequency on a bit lower frequency side than the resonance of the serial arm resonators corresponds to the end part on the low frequency side in the filter passing band. Therefore, in particular, when the SAW element 1 in the present invention is used for the serial arm resonators S1 to S3, according to the second effect, the loss on the low frequency side in the filter passing band can be reduced. Further, according to the third effect, the loss in the passing band of the filter can be reduced.

Further, as apparent from FIG. 8C etc., the first effect is exhibited in a broad range on a higher frequency side than the antiresonance frequency, therefore there also exists the effect of reduction of loss on a higher frequency side than the passing band of the filter. According to this effect, the phenomenon of loss out of the bandwidth of the transmission filter 11 in the duplexer 7 worsening loss in the bandwidth of the receiving filter 12 can be avoided. This effect becomes conspicuous when the SAW element 1 in the present invention is used for the resonators close to the antenna port 8 in the transmission filter 11 (serial resonator S1 and parallel resonator P1). Further, isolation between the transmission filter 11 and the receiving filter 12 can be improved. Furthermore, also in a case of a multiplexer formed by combining a plurality of filters such as a quad plexer formed by combining two duplexers 7, the phenomenon of the loss out of the bandwidth of one filter making the loss in the bandwidth of the other filter worsen can be avoided, so a device having a good loss characteristic can be realized.

Note that, the SAW element 1 can be applied to all acoustic wave filters present in the duplexer 7 as well. Further, the acoustic wave filters in the duplexer 7 may be configured by one or more of second acoustic wave elements of usual acoustic wave elements and one or more of the SAW elements 1 as well. Note that, each second acoustic wave element is provided with a second IDT electrode and second reflector electrodes positioned on the two sides thereof. The second IDT electrode is a usual IDT electrode which is not divided into the major part 3a and end parts 3b as in the IDT electrode 3 in the SAW element 1. The second reflector electrode is provided with a plurality of second reflection electrode fingers arranged along the direction of propagation of the SAW.

When including two such types of acoustic wave elements (SAW element 1 and second acoustic wave element), the number of the reflection electrode fingers 42 in the SAW element 1 may be made smaller in comparison with the number of reflection electrode fingers in the second acoustic wave element. By employing such a configuration, the effects according to the first effect to the third effect of the SAW element 1 are manifested, while enlargement of size of the duplexer 7 can be suppressed.

From the above description, by applying a SAW element in the present disclosure to a duplexer, a communication apparatus excellent in quality of communication can be provided. Further, the disclosure is not limited to only a duplexer. It can be adapted to a quad plexer as well.

REFERENCE SIGNS LIST

1: acoustic wave element (SAW element), 2: piezoelectric substrate, 2A: upper surface, 3: excitation electrode (IDT electrode), 30: comb-shaped electrode, 31: bus bar (first bus bar 31a, second bus bar 31b), 32: electrode finger, 3a: major part, 3b: end part, 4: reflector electrode, 41: reflector bus bar, 42: reflection electrode finger, 5: protective layer, 7: duplexer, 8: antenna terminal, 9: transmission terminal, 10: receiving terminal, 11: transmission filter, 12: receiving filter, 101: communication apparatus, 103: RF-IC, 109: antenna, S1 to S3: serial arm resonators, and P1 to P3: resonators of parallel arm.

The invention claimed is:

1. An acoustic wave element, comprising:
an IDT electrode comprising a plurality of electrode fingers; and
reflector electrodes on the two sides of the IDT electrode, wherein
the IDT electrode comprises
a major part and
at least one end part which is located between the major part and one of the reflector electrodes and is located along a direction of propagation of an acoustic wave together with the major part,
the at least one end part,
comprises a pitch of the plurality of electrode fingers, the pitch being substantially the same as a pitch of the plurality of electrode fingers in the major part,
is electrically connected in parallel with respect to the major part, and
is divided into two or more sections along the direction of propagation of the acoustic wave, the two or more sections being electrically connected in series with each other,
the two or more sections comprise
a first section adjacent to the major part in the direction of propagation, and
a second section adjacent to the first section in the direction of propagation,
the IDT electrode comprises two bus bars which face each other in a direction crossing the direction of propagation,
one bus bar of the two bus bars is divided in the direction of propagation at a boundary between the major part and the first section, and
another bus bar of the two bus bars is divided in the direction of propagation at a boundary between the first section and the second section.

2. The acoustic wave element according to claim 1, wherein:
the at least one end part is divided into a first part which is adjacent to the major part, a second part which is adjacent to a side of the first part opposite from the major part, and a third part which is located between the second part and the one of the reflector electrodes, and
in each of the first part, second part, and third part, the number of the plurality of electrode fingers is four or more and 10 or less fingers.

3. The acoustic wave element according to claim 2, wherein in any of the first part, the second part, and the third part, the pitch of the plurality of electrode fingers becomes 1.001 or more time and 1.003 or less time the pitch of the plurality of electrode fingers in the major part.

4. A communication apparatus, comprising:
a first filter comprising a first passing band; and
a second filter comprising a second passing band which is different from the first passing band, wherein
the acoustic wave element according to claim 1 is used for the acoustic wave filter used in the first filter or the second filter.

5. The communication apparatus according to claim 4, wherein
the acoustic wave filter comprises
the acoustic wave element and
a second acoustic wave element comprising a second IDT electrode and second reflector electrodes on the two sides of the second IDT electrode,
the at least one of the reflector electrodes in the acoustic wave element comprises a plurality of reflection electrode fingers arranged along the direction of propagation of the acoustic wave,
one of the second reflector electrodes in the second acoustic wave element comprises a plurality of second reflection electrode fingers arranged along the direction of propagation of the acoustic wave, and
the number of the reflection electrode fingers is smaller in comparison with the number of the second reflection electrode fingers.

6. The acoustic wave element according to claim 1, wherein the electrode fingers are repeatedly arranged so that a phase of the acoustic wave excited in the major part and a phase of the acoustic wave excited in the at least one end part become substantially in-phase.

7. The acoustic wave element according to claim 1, wherein the number of the plurality of electrode fingers of the at least one end part is four or more and 30 or less fingers.

8. The acoustic wave element according to claim 1, wherein each of the sections obtained by division of the at least one end part comprises the same number of plurality of electrode fingers.

9. The acoustic wave element according to claim 1, wherein:
the at least one end part is divided into a first part which is adjacent to the major part and a second part which is located between the first part and the one of the reflector electrodes, and
in each of the first part and the second part, the number of the plurality of electrode fingers is six or more and 12 or less fingers.

10. The acoustic wave element according to claim 1, wherein
the at least one end part is divided into a first part which is adjacent to the major part and a second part which is located between the first part and the one of the reflector electrodes, and
in the first part, the number of the plurality of electrode fingers is eight or more and 12 or less fingers, and
in the second part, the number of the plurality of electrode fingers is 12 or more and 16 or less fingers.

11. The acoustic wave element according to claim 1, wherein:
the at least one of the reflector electrodes comprises a plurality of reflection electrode fingers arranged along the direction of propagation of the acoustic wave, and
the number of the plurality of reflection electrode fingers is 10 or more and 20 or less fingers.

12. An acoustic wave element, comprising:
an IDT electrode comprising pluralities of electrode fingers; and
reflector electrodes on the two sides of the IDT electrode, wherein
the IDT electrode comprises
a major part and
at least one end part which is located between the major part and one of the reflector electrodes and is located along a direction of propagation of an acoustic wave together with the major part,
the at least one end part,
comprises a pitch of the plurality of electrode fingers, the pitch being substantially the same as a pitch of the plurality of electrode fingers in the major part,
is electrically connected in parallel with respect to the major part, and
is divided into two or more sections in a direction different from the direction of propagation of the acoustic wave, the two or more sections being electrically connected in series with each other,
the major part comprises
a first bus bar and a second bus bar which face each other in a direction crossing the direction of propagation,
a plurality of a first electrode fingers which extend from the first bus bar toward the second bus bar,
a plurality of a second electrode fingers which extend from the second bus bar toward the first bus bar, and which mesh with the plurality of the first electrode fingers,
when viewed in the direction of propagation, a plurality of electrode fingers of each of the two or more sections of the at least one end part overlap the plurality of first electrode fingers and the plurality of second electrode fingers of the major part.

* * * * *